(12) United States Patent
Funatsu et al.

(10) Patent No.: US 9,214,412 B2
(45) Date of Patent: Dec. 15, 2015

(54) SEMICONDUCTOR DEVICE

(71) Applicant: Renesas Electronics Corporation, Kawasaki-shi, Kanagawa (JP)

(72) Inventors: Katsuhiko Funatsu, Kanagawa (JP); Yukihiro Sato, Kanagawa (JP); Yuichi Yato, Kanagawa (JP); Tomoaki Uno, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/304,945

(22) Filed: Jun. 15, 2014

(65) Prior Publication Data

US 2015/0001699 A1    Jan. 1, 2015

(30) Foreign Application Priority Data

Jul. 1, 2013 (JP) .................................. 2013-138155

(51) Int. Cl.
| | |
|---|---|
| H01L 23/495 | (2006.01) |
| H01L 23/10 | (2006.01) |
| H01L 23/00 | (2006.01) |
| H01L 23/31 | (2006.01) |
| H01L 21/56 | (2006.01) |

(52) U.S. Cl.
CPC ...... *H01L 23/49503* (2013.01); *H01L 23/4952* (2013.01); *H01L 23/49541* (2013.01); *H01L 23/49551* (2013.01); *H01L 23/49562* (2013.01); *H01L 23/564* (2013.01); *H01L 24/34* (2013.01); *H01L 24/97* (2013.01); *H01L 21/561* (2013.01); *H01L 23/3107* (2013.01); *H01L 2224/45144* (2013.01); *H01L 2224/48247* (2013.01); *H01L 2924/13091* (2013.01)

(58) Field of Classification Search
USPC ........... 257/666, 676, 784, 707, 713, E23.086
See application file for complete search history.

(56) References Cited

U.S. PATENT DOCUMENTS

| | | | | |
|---|---|---|---|---|
| 6,630,726 | B1 * | 10/2003 | Crowley et al. | 257/666 |
| 6,700,186 | B2 | 3/2004 | Yasunaga et al. | |
| 7,663,211 | B2 * | 2/2010 | Noquil et al. | 257/675 |
| 7,679,173 | B2 | 3/2010 | Uno et al. | |
| 8,040,708 | B2 | 10/2011 | Sato et al. | |
| 8,106,501 | B2 * | 1/2012 | Quinones et al. | 257/687 |
| 2008/0173991 | A1 * | 7/2008 | Cruz et al. | 257/676 |
| 2010/0109135 | A1 * | 5/2010 | Jereza | 257/676 |
| 2010/0258924 | A1 * | 10/2010 | Cruz et al. | 257/676 |
| 2011/0074007 | A1 * | 3/2011 | Lopez et al. | 257/692 |
| 2011/0095411 | A1 * | 4/2011 | Herbsommer et al. | 257/676 |
| 2013/0009295 | A1 * | 1/2013 | Otremba | 257/676 |
| 2014/0084433 | A1 * | 3/2014 | Otremba et al. | 257/676 |

FOREIGN PATENT DOCUMENTS

| | | |
|---|---|---|
| JP | 2002-083918 A | 3/2002 |
| JP | 2007-266218 A | 10/2007 |
| JP | 2010-067755 A | 3/2010 |

* cited by examiner

*Primary Examiner* — Nitin Parekh
(74) *Attorney, Agent, or Firm* — Miles & Stockbridge P.C.

(57) ABSTRACT

A semiconductor device includes a first chip mounting portion, a first semiconductor chip arranged over the first chip mounting portion, a first pad formed in a surface of the first semiconductor chip, a first lead which serves as an external coupling terminal, a first conductive member which electrically couples the first pad and the first lead, and a sealing body which seals a part of the first chip mounting portion, the first semiconductor chip, a part of the first lead, and the first conductive member. The first conductive member includes a first plate-like portion, and a first support portion formed integrally with the first plate-like portion. An end of the first support portion is exposed from the sealing body, and the first support portion is formed with a first bent portion.

20 Claims, 34 Drawing Sheets

FIG. 28
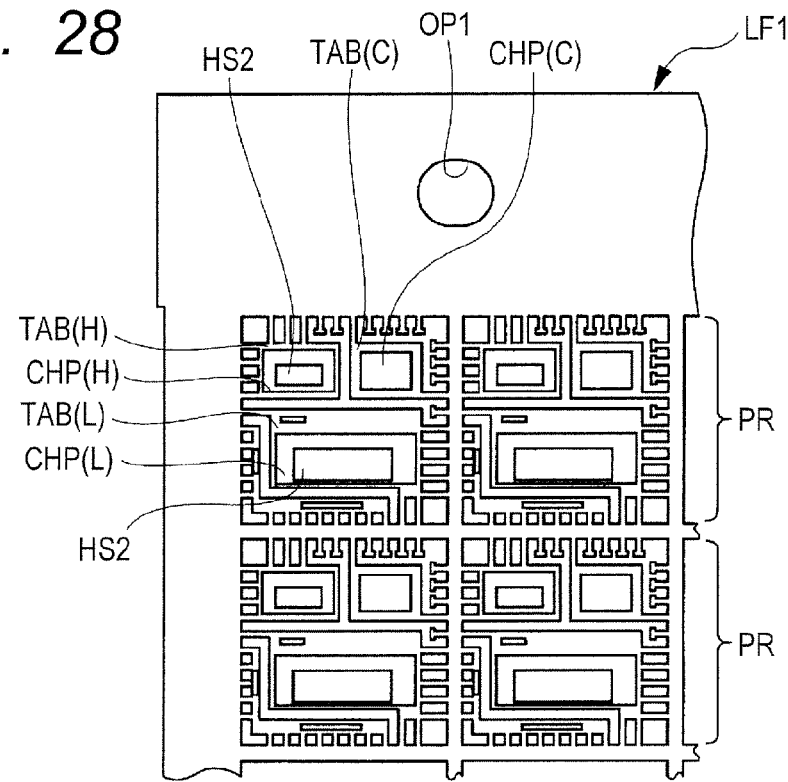
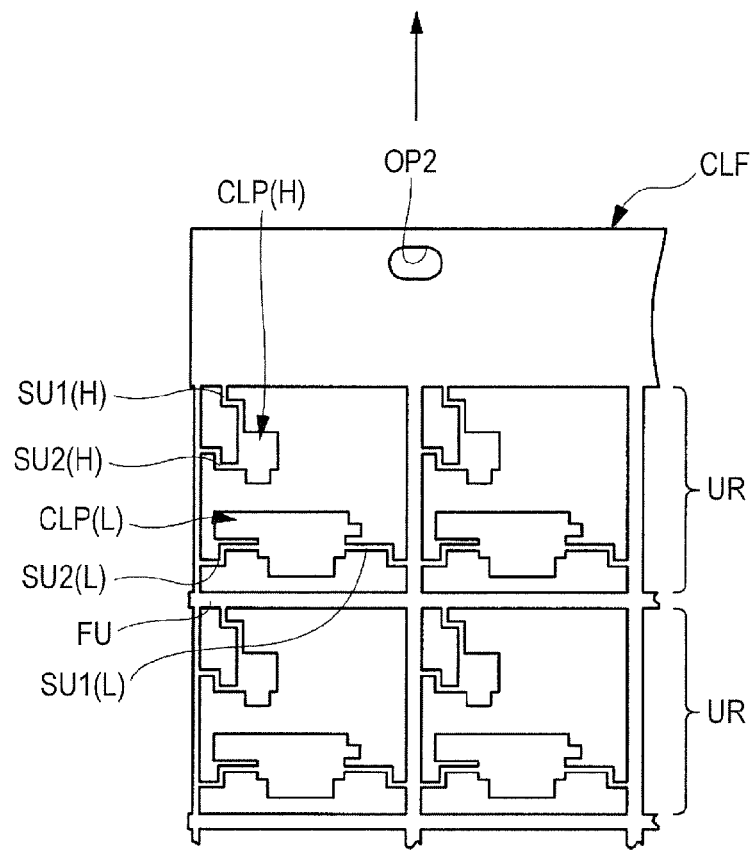

FIG. 30
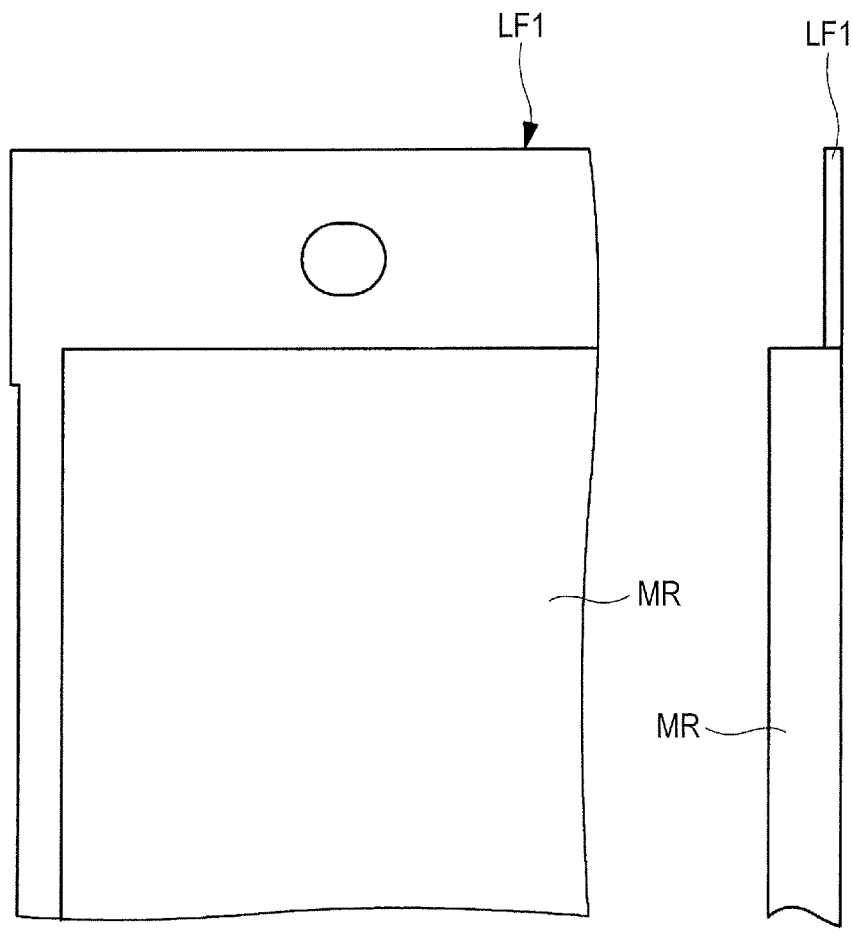
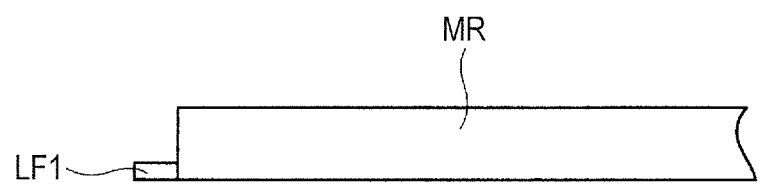

SEMICONDUCTOR DEVICE

CROSS-REFERENCE TO RELATED APPLICATION

The disclosure of Japanese Patent Application No. 2013-138155 filed on Jul. 1, 2013 including the specification, drawings and abstract is incorporated herein by reference in its entirety.

BACKGROUND

The present invention relates to a semiconductor device, and a technology effective when applied to, for example, a semiconductor device including a power MOSFET (Metal Oxide Semiconductor Field Effect Transistor).

There has been described in Japanese Unexamined Patent Application Publication No. 2007-266218 (Patent Document 1), a manufacturing technology of a semiconductor device using a metal plate frame in which regions for supporting metal plates by suspension portions are arranged in plural in a matrix form.

There has been described in Japanese Unexamined Patent Application Publication No. 2010-67755 (Patent Document 2), a manufacturing technology of a semiconductor device in which each individual metal plate is mounted over a semiconductor chip.

There has been described in Japanese Unexamined Patent Application Publication No. 2002-83918 (Patent Document 3), a technology in which semiconductor chip mounting portions are assembled in plural in a matrix form to configure a unit frame assembly, and the unit frame assembly is provided to a lead frame base. At this time, a support bar obtained by removing the back side of each unit frame and forming thinner at least a portion to be cut, a tie bar formed thinner than the thickness of the lead frame base, and a boundary portion formed thinner than the thickness of the lead frame base are formed in a lead frame.

RELATED ART DOCUMENTS

[Patent Document 1] Japanese Unexamined Patent Application Publication No. 2007-266218
[Patent Document 2] Japanese Unexamined Patent Application Publication No. 2010-67755
[Patent Document 3] Japanese Unexamined Patent Application Publication No. 2002-83918

SUMMARY

For example, a semiconductor device is formed of a semiconductor chip formed with a semiconductor element such as a MOSFET, and a package formed so as to cover the semiconductor chip. For example, of packet structures for a semiconductor device including a power MOSFET used in an application that carries a large current, there is known one having a structure in which in order to reduce an on resistance, a semiconductor chip and a lead are coupled to each other by a metal plate (hereinafter called a clip) of a plate-like shape rather than a metal wire.

As a manufacturing technology of the semiconductor device using such a clip, there is known, for example, a technology in which semiconductor chips are respectively mounted over a plurality of chip mounting portions formed in a lead frame, and thereafter each individual clip is mounted over the individual semiconductor chip. This technology is however low in assembly workability because the individual clips must be mounted every two or more semiconductor chips.

There is therefore known a technology in which clips are collectively mounted over a plurality of semiconductor chips by using a clip frame in which regions for supporting the clips by suspension leads are arranged in plural in a matrix form. According to the technology, it is possible to improve assembly workability because the clips can collectively be mounted over the semiconductor chips.

In a subsequent step, however, the semiconductor device is made into individual pieces by cutting sealing bodies after having sealed the semiconductor chips. Since, at this time, the suspension leads supporting the clips are also cut in a step of cutting the sealing bodies, the ends of the suspension leads are exposed from the side surfaces of the individualized sealing bodies. This means that a moisture infiltration path is formed in the side surface of each sealing body, thus leading to degradation of reliability of the semiconductor device. Therefore, some improvements are required to improve the reliability of the semiconductor device.

Other objects and novel features of the present invention will become apparent from the description of the present specification and the accompanying drawings.

According to an aspect of the present invention, there is provided a semiconductor device according to one embodiment, which has a first conductive member mounted over a lead from atop a semiconductor chip and in which the first conductive member includes a first plate-like portion, and a first support portion formed integrally with the first plate-like portion. At this time, the end of the first support portion is exposed from a sealing body, and the first support portion is formed with a first bent portion.

According to the one embodiment, it is possible to improve the reliability of the semiconductor device.

BRIEF DESCRIPTION OF THE DRAWINGS

FIG. 28 is a plan view showing a manufacturing step of the semiconductor device, following FIG. 27;

FIG. 29A and FIG. 29B show a manufacturing step of the semiconductor device, following FIG. 28, in which FIG. 29A is a plan diagram showing the manufacturing process, and FIG. 29B is a plan diagram showing in an enlarged form, a partial region of FIG. 29A;

FIG. 30 shows a manufacturing step of the semiconductor device, following FIGS. 29A and 29B;

FIG. 31A and FIG. 31B show a manufacturing step of the semiconductor device, following FIG. 30, in which FIG. 31A is a plan diagram showing the manufacturing step, and FIG. 31B is a side diagram showing the manufacturing step;

FIG. 32A, FIG. 32B, and FIG. 32C show a manufacturing step of the semiconductor device, following FIGS. 31A and 31B, in which FIG. 32A is a plan diagram showing the manufacturing step, FIG. 32B is a side diagram showing the manufacturing step, and FIG. 32C is a plan diagram showing a semiconductor device in the form of an individual piece by the manufacturing step;

FIG. 39A and FIG. 39B are views showing an example of an arrangement of leads and a support portion exposed from the side surface of a sealing body, in which FIG. 39A is a diagram showing side surface shapes of ideal leads and a support portion where sagging in the dicing step is not generated, and FIG. 39B is a diagram showing side surface shapes of actual leads and a support portion where sagging in the dicing step is generated;

FIG. 40A and FIG. 40B are views showing an example of an arrangement of leads and a support portion exposed from the side surface of a sealing body, in which FIG. 40A is a diagram showing side surface shapes of ideal leads and a support portion where sagging in the dicing step is not generated, and FIG. 40B is a diagram showing side surface shapes of actual leads and a support portion where sagging in the dicing step is generated;

DETAILED DESCRIPTION

Figure 1:
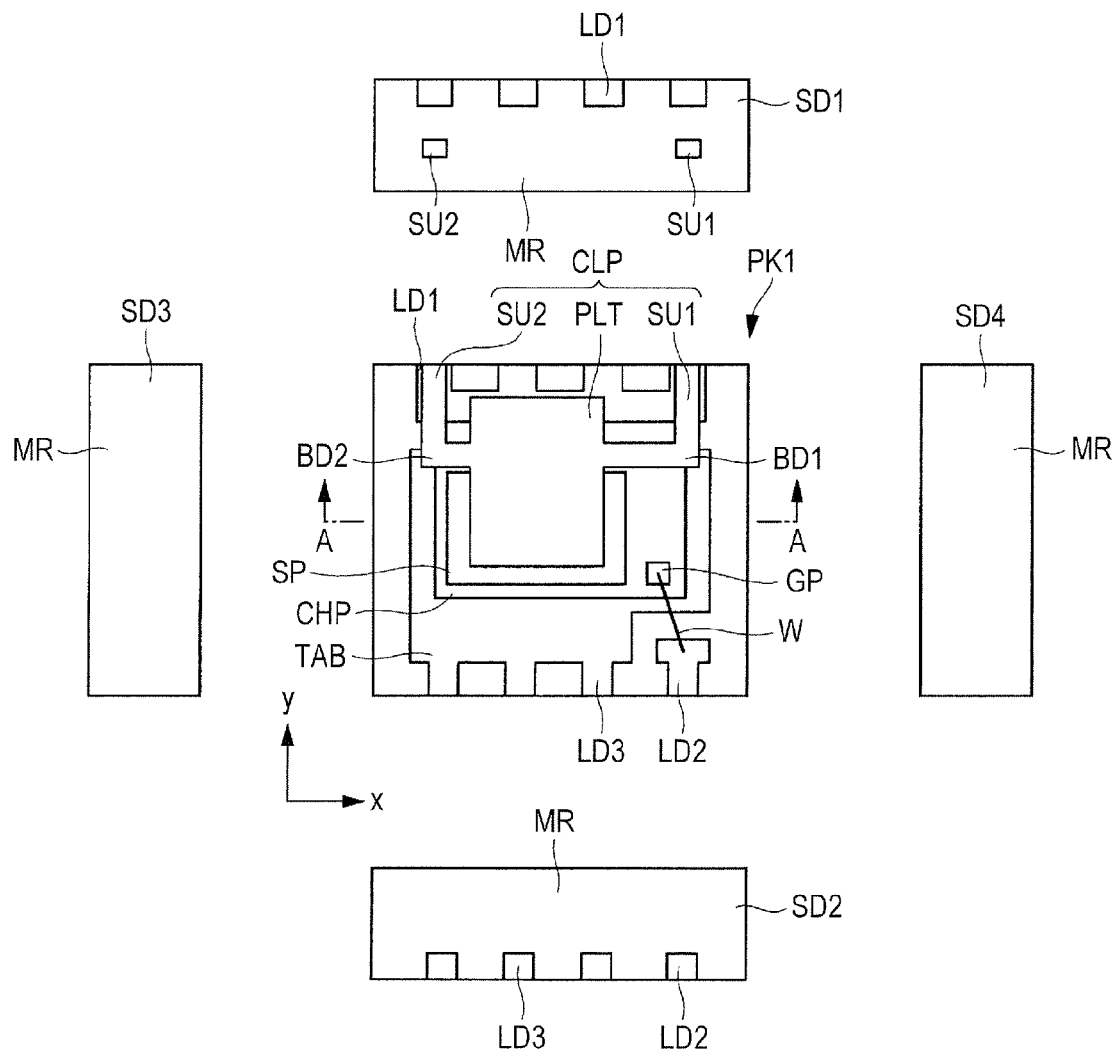
FIG. 1 shows a mounting configuration of a semiconductor device according to a first embodiment.

The invention will be described by being divided into a plurality of sections or embodiments whenever circumstances require it for convenience in the following embodiments. However, unless otherwise specified in particular, they are not irrelevant to one another. One thereof has to do with modifications, details and supplementary explanations of some or all of the other.

When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle.

It is further needless to say that components (including element or factor steps, etc.) employed in the following embodiments are not always essential unless otherwise specified in particular and considered to be definitely essential in principle.

Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

The same reference numerals are respectively attached to the same members in principle in all the drawings for describing the embodiments, and a repeated description thereof will be omitted. Incidentally, even plan views may be hatched for clarity of illustration.

First Embodiment

Mounting Configuration of Semiconductor Device According to First Embodiment FIG. 1 is a view showing a mounting configuration of a semiconductor device PK1 according to the first embodiment. In FIG. 1, first, the semiconductor device PK1 according to the present embodiment has a sealing body MR.

The sealing body MR has, for example, an upper surface, a lower surface located on the side opposite to upper surface, a first side surface positioned between the upper and lower surfaces as viewed in its thickness direction, a second side surface opposite to the first side surface, a third side surface which intersects with the first and second side surfaces, and a fourth side surface which crosses the first and second side surfaces and is opposite to the third side surface.

In FIG. 1, a diagram as seen through the inside from the upper surface of the sealing body MR is shown in its central region. Also in FIG. 1, a side view as seen from a side surface SD1 of the sealing body MR is shown in a region on the side above the central region. A side view as seen from a side surface SD2 of the sealing body MR is shown in a region on the side below the central region. Further, in FIG. 1, a side view as seen from a side surface SD3 of the sealing body MR is shown in the left region of the central region, and a side view as seen from a side surface SD4 of the sealing body MR is shown in the right region of the central region.

As shown in FIG. 1, the semiconductor device PK1 according to the present embodiment has a chip mounting portion TAB. A lead LD3 that serves as an external coupling terminal is formed integrally with the chip mounting portion TAB. Then, a semiconductor chip CHP is disposed over the chip mounting portion TAB. The semiconductor chip CHP is formed with, for example, a power MOSFET. A source pad SP and a gate pad GP are formed in the surface of the semiconductor chip CHP.

Here, a source region of the power MOSFET formed in the semiconductor chip CHP is electrically coupled to the source pad SP, and a gate electrode of the power MOSFET is coupled to the gate pad GP. Incidentally, although not shown in FIG. 1, for example, in the semiconductor device PK1 according to the present embodiment, the back surface of the semiconductor chip CHP functions as a drain electrode, and a drain electrode of the semiconductor chip CHP is electrically coupled to the drain electrode. Thus, the chip mounting portion TAB over which the back surface of the semiconductor chip CHP is disposed also functions as the drain electrode.

Then, leads LD1 and LD2, which function as external coupling terminals are disposed away from the chip mounting portion TAB in the semiconductor device PK1 according to the present embodiment. The gate pad GP and the lead LD2 formed in the surface of the semiconductor chip CHP are coupled to each other by a metal wire W. The metal wire W is comprised of, for example, a gold wire, a copper wire or an aluminum wire.

The source pad SP formed in the surface of the semiconductor chip CHP, and the lead LD1 are coupled to each other by a clip CLP comprised of a conductive member, for example. The clip CLP large in planar region is adopted to reduce an on resistance, considering that a large current flows between the source pad SP of the semiconductor chip CHP and the lead LD1. The clip CLP is comprised of a plate-like portion PLT being a body portion, a support portion SU1 and a support portion SU2. At this time, the support portion SU1 has a bent portion BD1 and extends in an x direction from a portion coupled to the plate-like portion PLT. Thereafter, the support portion SU1 extends while changing its direction in a y direction at the bent portion BD1 and reaches the side surface SD1 of the sealing body MR. Further, the support portion SU2 has a bent portion BD2 and extends in the x direction from a portion coupled to the plate-like portion PLT. Thereafter, the support portion SU2 extends while changing its direction in the y direction at the bent portion BD2 and reaches the side surface SD1 of the sealing body MR.

Incidentally, in the semiconductor device PK1 according to the present embodiment, the support portion SU1 and the support portion SU2 that configure a part of the clip CLP are arranged so as to overlap with the semiconductor chip CHP as seen in a planar view. Moreover, in the semiconductor device PK1 according to the present embodiment, the bent portion BD1 included in the support portion SU1 is formed so as to overlap with the semiconductor chip CHP as seen in a planar view in particular. Likewise, the bent portion BD2 included in the support portion SU2 is formed so as to overlap with the semiconductor chip CHP as seen in a planar view.

Next, in FIG. 1, the side view as viewed from the side surface SD1 of the sealing body MR is shown in the upper region of the central region. It is understood that in the side view, the lead LD1, the end of the support portion SU1 being the component of the clip CLP, and the end of the support portion SU2 being the component of the clip CLP are exposed from the side surface SD1 of the sealing body MR.

On the other hand, in FIG. 1, the side view as seen from the side surface SD2 opposite to the side surface SD1 of the sealing body MR is shown in the lower region of the central region. It is understood that in the side view, the lead LD2 and the lead LD3 are exposed from the side surface SD2 of the sealing body MR.

Further, in FIG. 1, the side view as seen from the side surface SD3 of the sealing body MR is shown in the left region of the central region, and the side view as seen from the side surface SD4 of the sealing body MR is shown in the right region of the central region. It is understood that in these side views, the side surfaces SD3 and SD4 of the sealing body MR are all covered with the sealing body MR.

Figure 2:
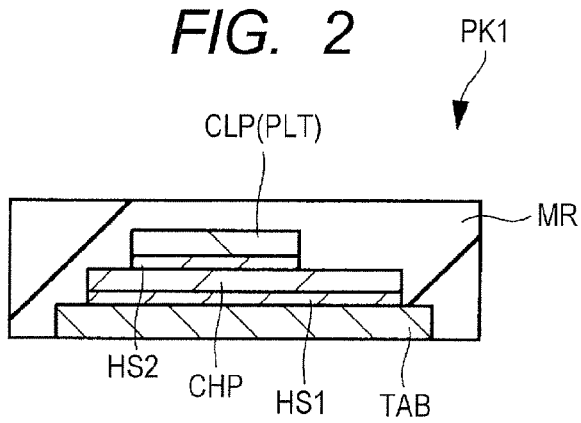
FIG. 2 is a cross-sectional view cut along line A-A of FIG. 1.

Subsequent to the above, FIG. 2 is a cross-sectional view cut along line A-A of FIG. 1. As shown in FIG. 2, in the semiconductor device PK1 according to the present embodiment, the semiconductor chip CHP is mounted over the chip mounting portion TAB through a high-melting point solder HS1 interposed therebetween. The clip CLP is mounted over the semiconductor chip CHP through a high-melting point solder HS2 interposed therebetween. It is understood that the sealing body MR is formed so as to cover these components, but the back surface of the chip mounting portion TAB is exposed from the sealing body MR. That is, in the present embodiment, the sealing body MR seals a part of the chip mounting portion TAB, the semiconductor chip CHP, parts of the leads LD1 through LD3, and the clip CLP comprised of the conductive member.

In the present embodiment, solder other than silver paste is used for coupling between the chip mounting portion TAB and the semiconductor chip CHP and coupling between the semiconductor chip CHP and the clip CLP from the viewpoint of a reduction in on resistance. That is, the silver paste is configured to distribute a silver filler in a thermosetting resin and lower in electrical conductivity and thermal conductivity than solder that is a metal material. From this point, the solder larger in electrical conductivity than the silver paste is used in the semiconductor device PK1 used in a power semiconductor field that needs a reduction in on resistance, for example. Thus, the on resistance of the semiconductor device PK1 is reduced.

However, after the semiconductor device PK1 according to the present embodiment has been completed as a product, it is mounted over a circuit board (mounting substrate). In this case, solder is used for the coupling of the semiconductor device PK1 to the mounting substrate. In the case of their coupling by solder, a heat treatment (reflow) is required because solder is melted to couple them to each other.

Here, when the solder used for the coupling between the semiconductor device PK1 and the mounting substrate, and the solder used inside the above semiconductor device PK1 are of the same material, the solder used inside the semiconductor device PK1 is also melted by the heat treatment (reflow) applied upon coupling between the semiconductor device PK1 and the mounting substrate. In this case, failures of causing cracks in the resin that seals the semiconductor device PK1, due to a volume expansion by the melting of solder and causing leakage of the melted solder to the outside may occur.

From the above, in the present embodiment, the high-melting point solder HS1 and the high-melting point solder HS2 are used for the coupling between the chip mounting portion and the semiconductor chip and the coupling between the semiconductor chip CHP and the clip CLP. In this case, the high-melting point solder HS1 and the high-melting point solder HS2 used inside the semiconductor device PK1 are not melted by the reflow applied when coupling the semiconductor device PK1 and the mounting substrate. It is thus possible to prevent failures of causing cracks in the resin sealing the semiconductor device PK1 due to the volume expansion by the melting of the high-melting point solder HS1 and the high-melting point solder HS2 and causing leakage of the melted solder to the outside.

Here, as the solder used for the coupling between the semiconductor device PK1 and the mounting substrate, a solder typified by Sn (tin)-Silver (Ag)-Copper (Cu), which is about 220° C. in melting point, is used. Upon the reflow, the semiconductor device PK1 is heated to about 260° C. Thus, for example, the high-melting point solder mentioned in the present specification is intended to be solder not melted even if heated to about 260° C. As a typical example, there is cited, for example, solder which is 300° C. or higher in melting point and about 350° C. in reflow temperature and contains Pb of 90 wt. % or more.

Incidentally, in the present embodiment, for example, the high-melting point solder HS1 that couples the chip mounting portion TAB and the semiconductor chip CHP exists and the high-melting point solder HS2 used for the coupling between the semiconductor chip CHP and the clip CLP exists. Basically, in the present embodiment, the above-mentioned high-melting point solders HS1 and HS2 are assumed to be the same material component, but can also be comprised of, for example, material components different from each other.

Further, in the present embodiment, for example, the high-melting point solder HS1 and the high-melting point solder HS2 are used, but there is no limit thereto. Instead of the high-melting point solder HS1 and the high-melting point solder HS2, silver paste can also be used. It is however desirable that in terms of a reduction in the on resistance, the high-melting point solder HS1 and the high-melting point solder HS2 are used rather than the silver paste.

<Features in the First Embodiment>

The semiconductor device PK1 according to the present embodiment is configured as described above. The feature point thereof will be described below. In FIG. 1, the feature point in the present embodiment resides in that the support portion SU1 is provided with the bent portion BD1, and the support portion SU2 is provided with the bent portion BD2.

For example, as shown in FIG. 1, the end of the support portion SU1 is exposed from the side surface SD1 of the sealing body MR in the semiconductor device PK1 according to the present embodiment. It is therefore concerned that the exposed region becomes an inlet of an infiltration path of moisture. In regard to this, since the support portion SU1 has the bent portion BD1 in the present embodiment, it is possible to increase the length of a path that reaches the source pad SP of the semiconductor chip CHP. That is, according to the present embodiment, even when moisture intrudes from the end of the support portion SU1, which is exposed from the side surface SD1 of the sealing body MR, it is possible to increase the length of its entry path that reaches the source pad SP of the semiconductor chip CHP by forming the bent portion BD1 in the support portion SU1. This means that the moisture infiltrated from the end of the support portion SU1 exposed from the side surface SD1 of the sealing body MR can hardly reach over the source pad SP. As a result, according to the present embodiment, it is possible to suppress degradation of reliability due to the moisture infiltrated into the semiconductor device PK1. In other words, according to the present embodiment, the reliability of the semiconductor device PK1 can be improved.

In order to reduce the on resistance of a semiconductor device including a power MOSFET and thereby improve its performance in a power semiconductor field, for example, a semiconductor chip and leads are electrically coupled by a clip being a plate-like conductive member. As a technology for manufacturing the semiconductor device using the clip, for example, there is considered that semiconductor chips are respectively mounted over a plurality of chip mounting portions formed in a lead frame, and thereafter individual clips are respectively mounted over the individual semiconductor chips. In the present technology, however, the individual clips must be mounted every semiconductor chips. Therefore, assembly workability is low and there is a need to improve the assembly workability.

Thus, there has been discussed a technology in which clips are collectively mounted over a plurality of semiconductor chips by using a clip frame in which regions supporting the clips by suspension leads are arranged in plural in a matrix form. This is because according to this technology, assembly workability can be improved since the clips can collectively be mounted over the semiconductor chips.

As a result of investigations by the present inventors, however, the semiconductor chips are sealed in a subsequent process and thereafter each sealing body is cut to make the semiconductor device into individual pieces. At this time, since the suspension leads supporting the clips are also cut in the process of cutting the sealing body, the ends of the suspension leads are exposed from the side surfaces of the individualized sealing bodies.

As a result, a moisture infiltration path is formed in the side surface of each sealing body. Therefore, in order to ensure the reliability of the semiconductor device, there is room for improvement even in the technology using the clip frame. That is, the use of the clip is preferable in that the assembly workability is improved, but it can be said that there is room for improvement in ensuring the reliability of the semiconductor device.

For example, when moisture intrudes from the exposed region where the end of each suspension lead is exposed, the moisture enters the inside of the semiconductor device along the suspension lead. Eventually, the moisture reaches over the source pad formed in the surface of each semiconductor chip. In this case, for example, the moisture adheres from the source pad to the chip mounting portion with the semiconductor chip mounted thereon. At this time, since the chip mounting portion functions as the drain electrode, the chip mounting portion is at a potential different from that of the source pad. Accordingly, a leakage current flows between the source pad and the chip mounting portion (drain electrode) with the moisture interposed therebetween. Further, there is also concern that a short-circuit current flows. That is, it is understood that it is necessary to suppress the infiltration of the moisture into the semiconductor device with a view toward improving the reliability of the semiconductor device.

Thus, in the semiconductor device PK1 according to the present embodiment shown in FIG. 1, the clip CLP is comprised of the plate-like portion PLT being of the body portion, the support portion SU1 and the support portion SU2. Each of the support portions SU1 and SU2 is a member that forms the suspension lead of the clip frame. That is, in the present embodiment, there has been adopted the manufacturing technology using the clip frame in which the regions having supported the clips by the suspension leads are arranged in plural in the matrix form.

Then, as a premise to adopt the present manufacturing technology, in the present embodiment, the bent portion BD1 is formed in the support portion SU1, and the bent portion BD2 is formed in the support portion SU2. Therefore, for example, when focusing on the support portion SU1, the length of the support portion SU1 can be set longer than the case where the support portion SU1 is formed in a linear form.

This means that according to the present embodiment, it is possible to make long the distance where the moisture infiltrated from the end of the support portion SU1 exposed from the sealing body MR travels to reach the source pad SP formed in the surface of the semiconductor chip CHP.

That is, the technical idea according to the present embodiment is indented to, on the assumption that the end of the support portion SU1 is exposed from the sealing body MR, increase the length of the support portion SU1 itself as much as possible and restrain the moisture from reaching the source pad SP formed in the surface of the semiconductor chip CHP. As a result, according to the present embodiment, even if the end of the support portion SU1 is exposed from the side surface of the sealing body MR, the probability of reaching of the moisture to the source pad SP formed in the surface of the semiconductor chip CHP can be reduced by the increase in the length of the support portion SU1 based on the bent portion BD1 being formed in the support portion SU1.

From the above, according to the present embodiment, it is possible to suppress an increase in leakage current due to the adhesion of the moisture over the source pad SP and the chip mounting portion TAB. It is thus possible to suppress degradation of the reliability of the semiconductor device PK1. That is, according to the present embodiment, it is possible to restrain the moisture from infiltrating into the semiconductor device PK1, which is easy to occur where the clip frame is used, while attaining an improvement in assembly workability by using the clip frame. In other words, according to the present embodiment, the reliability of the semiconductor device PK1 can also be improved while achieving the improvement in the assembly workability.

<First Modification>

Figure 3:
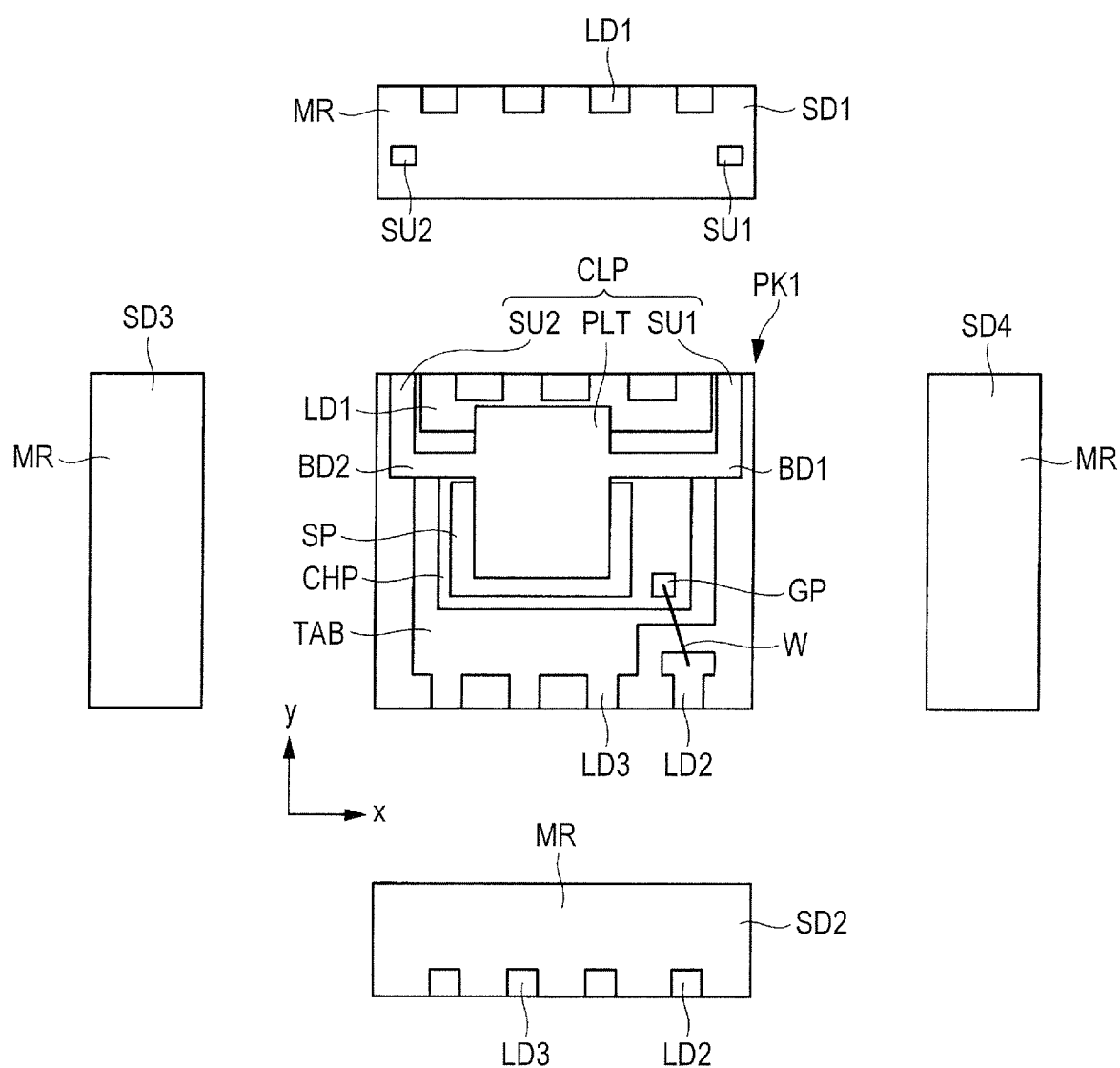
FIG. 3 shows a mounting configuration of a semiconductor device according to a first modification of the first embodiment.

A first modification will next be described. FIG. 3 is a view showing a mounting configuration of a semiconductor device PK1 according to the present modification. The semiconductor device PK1 according to the present modification shown in FIG. 3 is substantially similar in configuration to the semiconductor device PK1 according to the first embodiment shown in FIG. 1. The semiconductor device PK1 will therefore be described centering on differences therebetween.

In FIG. 3, even in the present modification, a clip CLP is comprised of a plate-like portion PLT, a support portion SU1 and a support portion SU2. The support portion SU1 has a bent portion BD1 and the support portion SU2 has a bent portion BD2. At this time, the feature of the present modification resides in that when focusing the support portion SU1, for example, the bent portion BD1 formed in the support portion SU1 is arranged so as not to overlap with a semiconductor chip CHP as seen in a planar view as shown in FIG. 3. Likewise, when focusing on the support portion SU2, the bent portion BD2 formed in the support portion SU2 is arranged so as not to overlap with the semiconductor chip CHP as seen in a planar view.

Thus, according to the present modification, it is possible to keep the bent portion BD1 formed in the support portion SU1 and the bent portion BD2 formed in the support portion SU2 away from the semiconductor chip CHP. As a result, according to the present modification, it is particularly possible to prevent the moisture from adhering onto the semiconductor chip CHP typified on the source pad SP.

This reason will be described below. As with the first embodiment even in the present modification, the basic technical idea resides in that the lengths of the support portions SU1 and SU2 can be increased by providing the bent portion BD1 to the support portion SU1 and providing the bent portion BD2 to the support portion SU2. Therefore, even in the present modification, it is possible to suppress staying of the moisture on the semiconductor chip CHP by increasing a moisture transfer path (infiltration path). That is, the usefulness of providing the bent portion BD1 to the support portion SU1 resides in that it is possible to restrain the moisture from reaching the source pad SP of the semiconductor chip CHP with the support portion SU1 as the infiltration path by increasing the length of the support portion SU1 as has been described in the first embodiment.

With regard to this, the present inventors have found even another usefulness of providing the bent portion BD1 to the support portion SU1. For example, when the moisture intrudes from the end of the support portion SU1 exposed from the sealing body MR, the moisture infiltrated into the semiconductor device PK1 is considered to first intrude in a y direction along the support portion SU1. Thereafter, the moisture having reached the bent portion BD1 is considered to turn in an x direction and further intrudes along the support portion SU1. At this time, it is considered that since the infiltration direction of the moisture is changed by 90° at the bent portion BD1, the moisture is easy to stay in the bent portion BD1 itself. That is, it is considered that since the moisture stays in the bent portion BD1 where the support portion SU1 is provided with the bent portion BD1, the amount of the moisture that reaches up to the source pad SP formed in the surface of the semiconductor chip CHP through the support portion SU1 is reduced. Namely, in the present modification, attention has been given to the fact that the moisture is easy to stay in the bent portion BD1 in addition to the infiltration path of the moisture becoming long by the formation of the bent portion BD1. Further, the present modification is characterized by arranging the bent portion BD1 where it is easy for the moisture to stay, in such a position as not to overlap with the semiconductor chip CHP as seen in a planar view as shown in FIG. 3, for example. In this case, since the bent portion BD1 is away from the semiconductor chip CHP as seen in a planar view even if the moisture stays in the bent portion BD1, it is possible to suppress adhering of the moisture having stayed in the bent portion BD1 onto the semiconductor chip CHP. Particularly since the source pad SP and the bent portion BD1 formed in the surface of the semiconductor chip CHP are away from each other, it is possible to effectively suppress adhering of the moisture to the source pad SP.

Thus, in the present modification, the adhering of the moisture infiltrated into the semiconductor device PK1 onto the semiconductor chip CHP is effectively suppressed using two mechanisms obtained by providing the bent portion BD1 to the support portion SU1. That is, the present modification utilizes the first mechanism that the infiltration path of the moisture which reaches up to the source pad SP formed in the surface of the semiconductor chip can be made longer by providing the bent portion BD1, and the second mechanism that the bent portion BD1 itself is arranged so as not to overlap with the semiconductor chip CHP as seen in a planar view while paying attention to the fact that the moisture is easy to stay in the bent portion BD1 itself. As a result, according to the present modification, the synergistic effect of the first and second mechanisms described above enables a remarkable reduction in the possibility of the moisture adhering onto the source pad SP formed in the surface of the semiconductor chip in particular even when the end of the support portion SU1 is exposed from the side surface of the sealing body MR and such an exposed region serves as the inlet of infiltration of the moisture into the semiconductor device PK1. Thus, even in the present modification, it is possible to achieve an improvement in the assembly workability by the manufacturing technology using the clip CLP having the support portion SU1 and the support portion SU2 and also to suppress degradation of the reliability of the semiconductor device PK1, based on the infiltration of the moisture into the semiconductor device PK1, which is worried due to the adoption of the manufacturing technology. That is, even in the present modification, the improvement in the assembly workability and the improvement in the reliability of the semiconductor device PK1 can be compatibly established.

Incidentally, in the configuration of the present modification, there is a case where as a result that the bent portion BD1 and the bent portion BD2 are arranged away from the semiconductor chip CHP as shown in FIG. 3, for example, the lead LD1 and the support portion SU1, and the lead LD1 and the support portion SU2 are arranged so as not to overlap with one another in a planar view.

<Second Modification>

Figure 4:
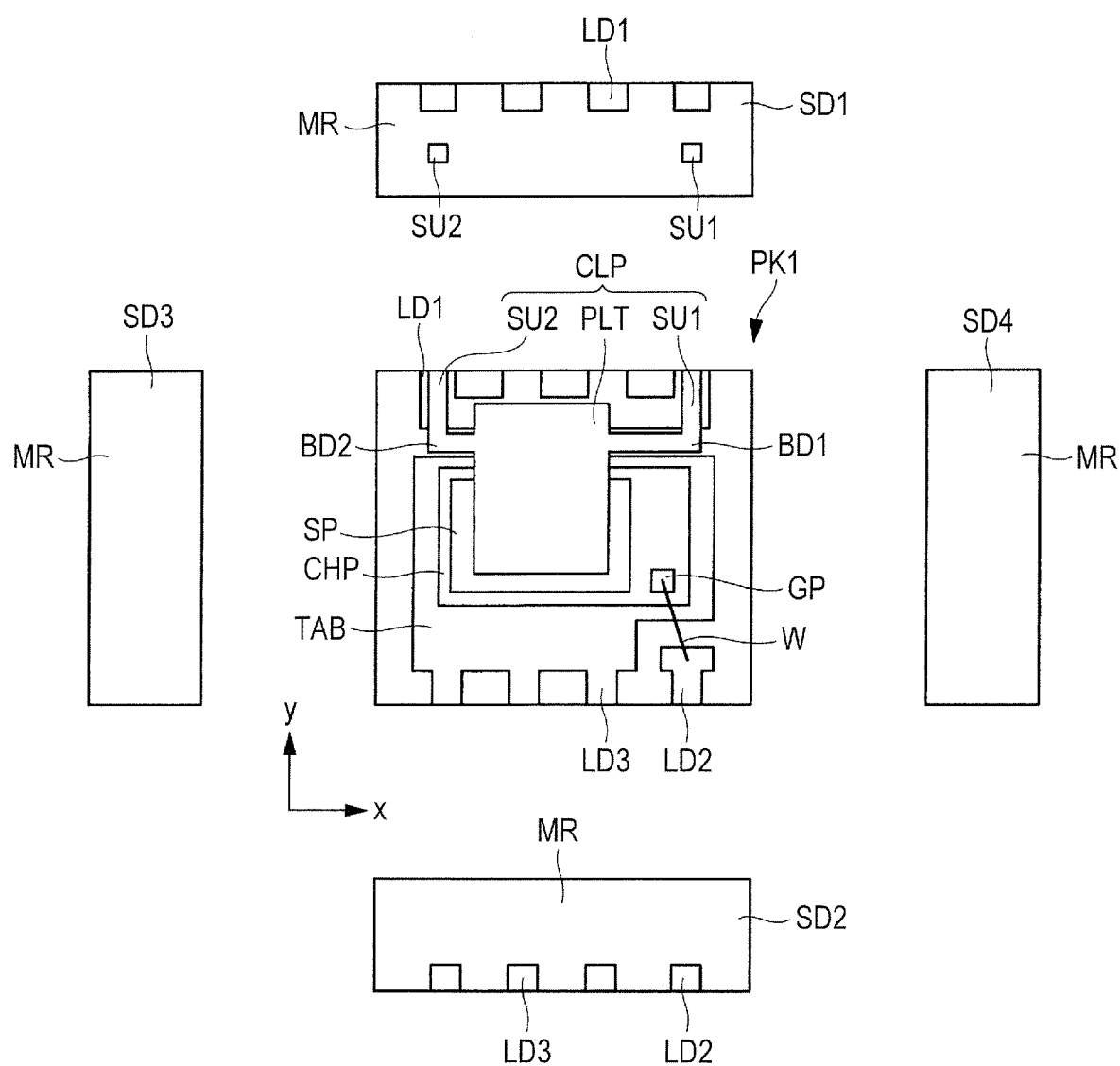
FIG. 4 shows a mounting configuration of a semiconductor device according to a second modification of the first embodiment.

A second modification will be described subsequently. FIG. 4 is a view showing a mounting configuration of a semiconductor device PK1 according to the present modification. The semiconductor device PK1 according to the present modification shown in FIG. 4 is configured substantially similar to the semiconductor device PK1 according to the first embodiment shown in FIG. 1. The semiconductor device PK1 will therefore be described centering on differences therebetween.

In FIG. 4, even in the present modification, a clip CLP is comprised of a plate-like portion PLT, a support portion SU1 and a support portion SU2. The support portion SU1 has a bent portion BD1 and the support portion SU2 has a bent portion BD2. At this time, the feature of the present modification resides in that not only the bent portions BD1 and BD2 but also the entire support portions SU1 and SU2 are arranged so as not to overlap with a chip mounting portion TAB as seen in a planar view. Thus, according to the present modification, particularly, it is possible to effectively prevent moisture from adhering onto a semiconductor chip CHP typified on a source pad SP.

This reason will be described below. As with the first embodiment even in the present modification, the basic technical idea resides in that the lengths of the support portions SU1 and SU2 can be increased by providing the bent portion BD1 to the support portion SU1 and providing the bent portion BD2 to the support portion SU2. Therefore, even in the present modification, it is possible to suppress staying of the moisture on the semiconductor chip CHP by increasing a moisture transfer path (infiltration path).

Also even in the present modification, the bent portion BD1 where the moisture is easy to stay is arranged in the position not to overlap with the semiconductor chip CHP as seen in a planar view as shown in FIG. 4. In this case, since the bent portion BD1 is away from the semiconductor chip CHP as seen in the planar view even if the moisture stays in the bent portion PD1, it is possible to suppress adhering of the moisture staying in the bent portion BD1 onto the semiconductor chip CHP.

Then, the present modification is further characterized in that the entire support portion SU1 including the bent portion BD1 and the entire support portion SU2 including the bent portion BD2 are arranged so as not to overlap with the chip mounting portion TAB as seen in the planar view. For example, when the end of the support portion SU1 exposed from the side surface of a sealing body MR serves as a moisture infiltration path, the infiltrated moisture is considered to travel into the semiconductor device PK1 along the support portion SU1. This means that the support portion SU1 itself servers as a moisture main infiltration path. Thus, it can be considered that the possibility that the moisture will adhere onto the semiconductor chip CHP can be reduced by keeping the semiconductor chip CHP away from the support portion SU1 serving as the main infiltration path for the moisture.

In the present modification, attention is paid to this viewpoint, and further as shown in FIG. 4, the entire support portion SU1 including the bent portion BD1 and the entire support portion SU2 including the bent portion BD2 are arranged so as not to overlap with the chip mounting portion TAB as seen in the planar view. In this case, considering that the semiconductor chip CHP is included in the chip mounting portion TAB in the planar view, the present modification can also be characterized by the entire support portion SU1 including the bent portion BD1 and the entire support portion SU2 including the bent portion BD2 being arranged so as not to overlap with the semiconductor chip CHP as seen in the planar view. Thus, according to the present modification, not only the bent portions BD1 and BD2 in which the moisture is easy to stay, but also the entire support portions SU1 and SU2 each serving as the main infiltration path for the moisture can be separated from the semiconductor chip CHP, thereby making it possible to effectively suppress adhering of the moisture onto the semiconductor chip CHP.

That is, the present modification makes use of a first mechanism that the infiltration path of the moisture that reaches up to the source pad SP formed in the surface of the semiconductor chip can be made longer by providing the bent portion BD1, a second mechanism that the bent portion BD1 itself is arranged so as not to overlap with the semiconductor chip CHP as seen in a planar view while paying attention to the fact that the moisture is easy to stay in the bent portion BD1 itself, and a third mechanism that the entire support portion SU1 is disposed so as not to overlap with the semiconductor chip CHP while paying attention to the fact the support portion SU1 serves as the main moisture infiltration path. As a result, according to the present modification, the synergistic effect of the first, second and third mechanisms described above enables a remarkable reduction in the possibility of the moisture adhering onto the source pad SP formed in the surface of the semiconductor chip in particular even when the end of the support portion SU1 is exposed from the side surface of the sealing body MR and such an exposed region serves as the inlet of infiltration of the moisture into the semiconductor device PK1. Thus, even in the present modification, it is possible to achieve an improvement in the assembly workability by the manufacturing technology using the clip CLP having the support portion SU1 and the support portion SU2 and also to suppress degradation of the reliability of the semiconductor device PK1, based on the infiltration of the moisture into the semiconductor device PK1, which is worried due to the adoption of the manufacturing technology. That is, even in the present modification, an improvement in assembly workability and an improvement in reliability of the semiconductor device PK1 can be compatibly established.

<Third Modification>

Figure 5:
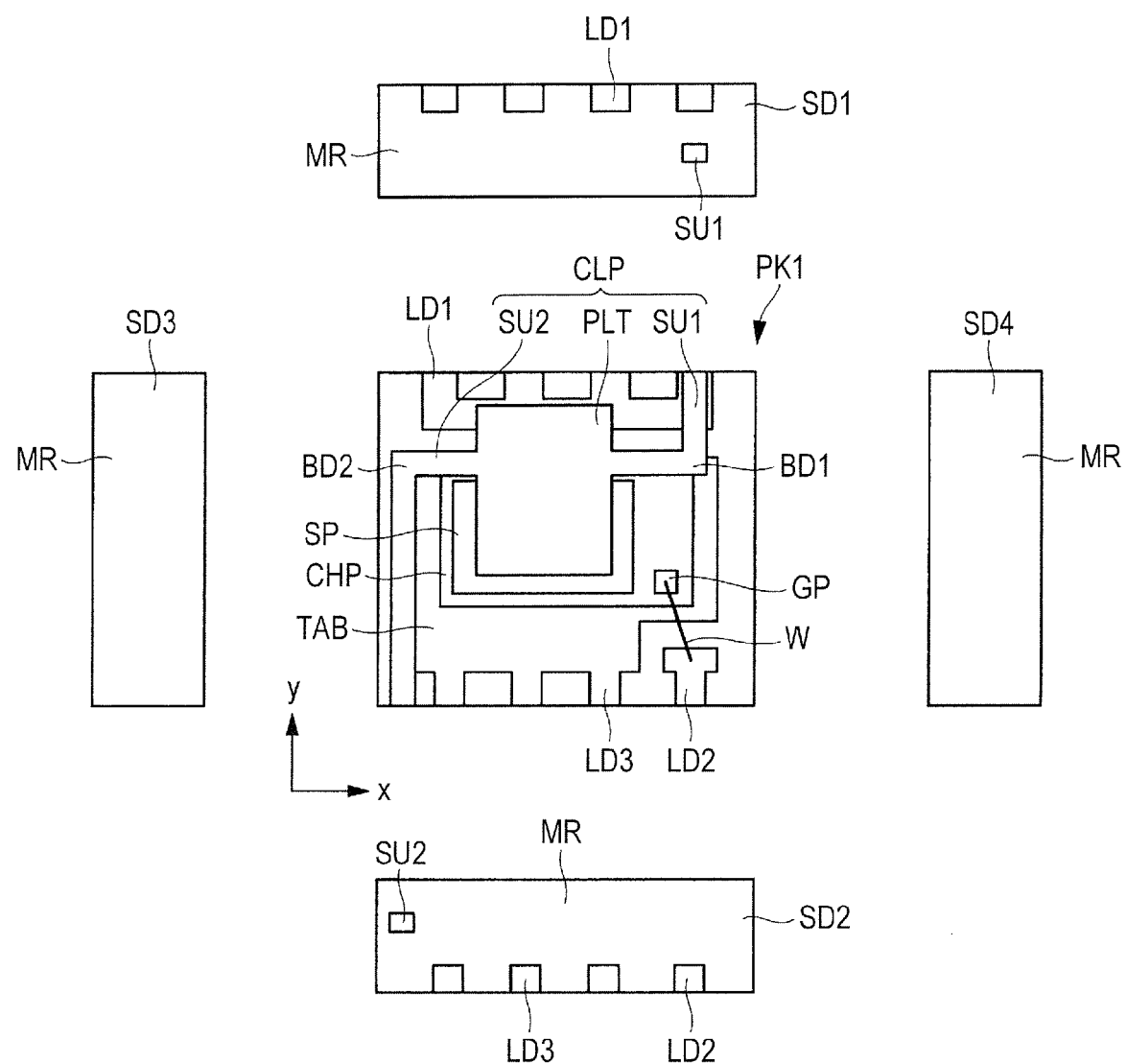
FIG. 5 shows a mounting configuration of a semiconductor device according to a third modification of the first embodiment.

A third modification will next be described. FIG. 5 is a view showing a mounting configuration of a semiconductor device PK1 according to the present modification. The semiconductor device PK1 according to the present modification shown in FIG. 5 is configured substantially similar to the semiconductor device PK1 according to the first embodiment shown in FIG. 1. The semiconductor device PK1 will therefore be described centering on differences therebetween.

As shown in FIG. 5, in the semiconductor device PK1 according to the present modification, the end of a support portion SU1 having a bent portion BD1 is exposed from a side surface SD1 of a sealing body MR, whereas the end of a support portion SU2 having a bent portion BD2 is exposed from a side surface SD2 opposite to the side surface SD1 of the sealing body MR. That is, in the semiconductor device PK1 according to the first embodiment, as shown in FIG. 1, for example, the end of the support portion SU1 and the end of the support portion SU2 have been configured so as to be exposed from the side surface SD1 of the sealing body MR together. On the other hand, in the semiconductor device PK1 according to the present modification, as shown in FIG. 5, for example, the end of the support portion SU1 is exposed from the side surface SD1 of the sealing body MR, whereas the end of the support portion SU2 is exposed from the side surface SD2 of the sealing body MR. Thus, the technical idea in the first embodiment may be realized as the configuration of the third modification shown in FIG. 5 besides the configuration of the first embodiment shown in FIG. 1.

In the semiconductor device PK1 according to the present modification shown in FIG. 5 in particular, the possibility of the moisture infiltrated from the end of the support portion SU2 exposed from the side surface SD2 of the sealing body MR reaching up to the semiconductor chip CHP can remarkably be reduced because the length of the support portion SU2 can be increased.

Further, in the present modification, the end of the support portion SU1 and the end of the support portion SU2 both exposed from the sealing body MR can be configured to be exposed from the separate side surfaces (side surface SD1 and side surface SD2) of the sealing body MR. This means that the number of ends exposed form one side surface can be limited to one. In other words, it means that the end of the support portion SU1 and the end of the support portion SU2 both exposed from the side surface can be distributed to the side surfaces different from each other. Therefore, according to the present modification, the moisture infiltration inlets are formed in the plural side surfaces of the sealing body MR, but the possibility of a large amount of moisture being locally infiltrated can be reduced because the region of the infiltration inlet at each side surface becomes small. That is, since the end of the support portion SU1 and the end of the support portion SU2 are exposed from the same side surface SD1 in the configuration of the semiconductor device PK1 according to the first embodiment shown in FIG. 1, there is a possibility that a lot of moisture will be infiltrated from the side surface SD1 as compared with the infiltration of the moisture from the other side surface SD2. On the other hand, in the configuration of the semiconductor device PK1 according to the present modification shown in FIG. 5, the end of the support portion SU1 is exposed from the side surface SD1 whereas the end of the support portion SU2 is exposed from the side surface SD2. It is therefore possible to distribute the possibility of the moisture being infiltrated from both of the side surfaces SD1 and SD2 and restrain a lot of moisture from being infiltrated from a specific side surface. From this point of view, for example, when it is apparent that the probability of the moisture being infiltrated differs at each side surface, the configuration of exposing the end of the support portion SU1 and the end of the support portion SU2 from the side surfaces low in the moisture infiltration probability as in the semiconductor device PK1 according to the first embodiment shown in FIG. 1 is useful. On the other hand, for example, when the moisture infiltration probability is the same or unknown at each side surface, the configuration of distributing the risk of the possibility that the moisture will be infiltrated and reducing the infiltrated amount of moisture from each individual side surface as in the semiconductor device PK1 according to the present modification shown in FIG. 5 is useful.

Even in the present modification configured in this way, it is possible to achieve an improvement in assembly workability by a manufacturing technology using a clip CLP having the support portions SU1 and SU2. Further, it is also possible to suppress degradation of reliability of the semiconductor device PK1 based on the infiltration of the moisture into the semiconductor device PK1, which is worried due to the adoption of the manufacturing technology. That is, even in the present modification, an improvement in assembly workability and an improvement in reliability of the semiconductor device PK1 can be compatibly established.

<Fourth Modification>

Figure 6:
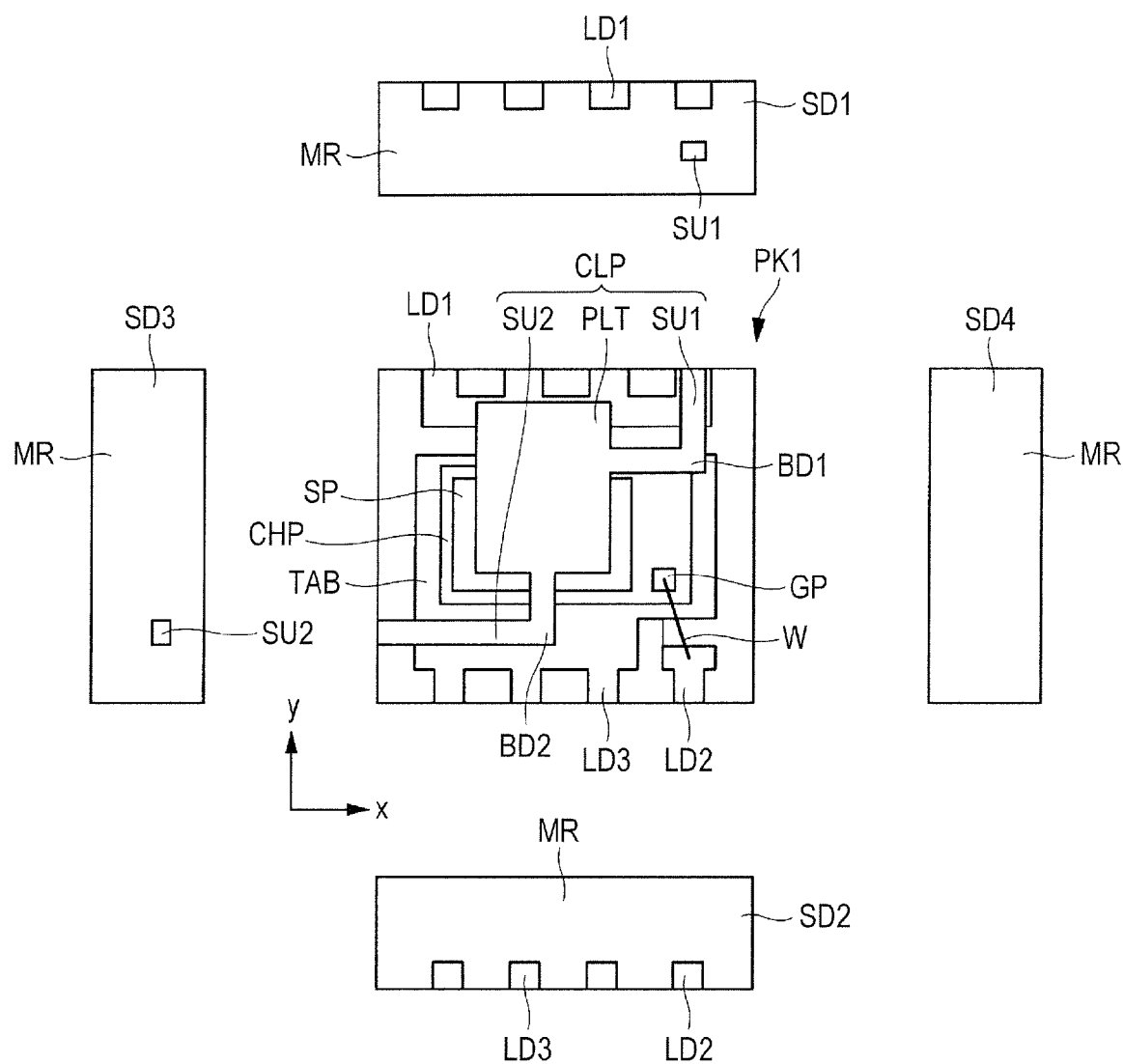
FIG. 6 shows a mounting configuration of a semiconductor device according to a fourth modification of the first embodiment.

A fourth modification will be described subsequently. FIG. 6 is a view showing a mounting configuration of a semiconductor device PK1 according to the present modification. The semiconductor device PK1 according to the present modification shown in FIG. 6 is configured substantially similar to the semiconductor device PK1 according to the first embodiment shown in FIG. 1. The semiconductor device PK1 will therefore be described centering on differences therebetween.

In the semiconductor device PK1 according to the present modification as shown in FIG. 6, the end of a support portion SU1 having a bent portion BD1 is exposed from a side surface SD1 of a sealing body MR, whereas the end of a support portion SU2 having a bent portion BD2 is exposed from a side surface SD3 that crosses the side surface SD1 of the sealing body MR. Thus, the technical idea in the first embodiment can also be realized as the configuration of the fourth modification shown in FIG. 6 besides the configuration of the first embodiment shown in FIG. 1.

Even in the present modification, it is possible to achieve an improvement in assembly workability by a manufacturing technology using a clip CLP having the support portions SU1 and SU2. It is also possible to suppress degradation of reliability of the semiconductor device PK1 based on the infiltration of the moisture into the semiconductor device PK1, which is worried due to the adoption of the manufacturing technology. That is, even in the present modification, an improvement in assembly workability and an improvement in reliability of the semiconductor device PK1 can be compatibly established.

<Fifth Modification>

Figure 7:
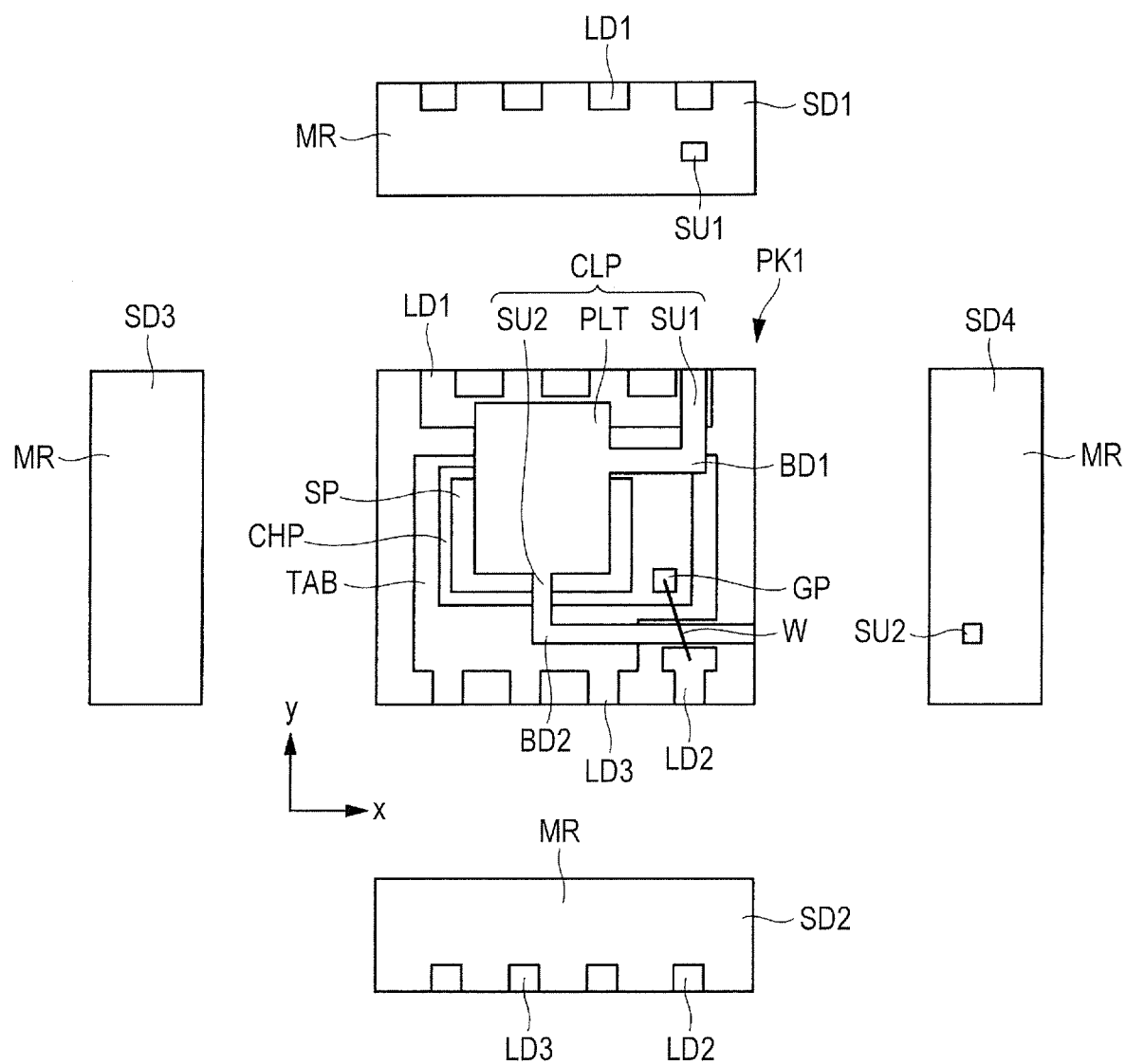
FIG. 7 shows a mounting configuration of a semiconductor device according to a fifth modification of the first embodiment.

A fifth modification will next be described. FIG. 7 is a view showing a mounting configuration of a semiconductor device PK1 according to the present modification. The semiconductor device PK1 according to the present modification shown in FIG. 7 is configured substantially similar to the semiconductor device PK1 according to the first embodiment shown in FIG. 1. The semiconductor device PK1 will therefore be described centering on differences therebetween.

In the semiconductor device PK1 according to the present modification, as shown in FIG. 7, the end of a support portion SU1 having a bent portion BD1 is exposed from a side surface SD1 of a sealing body MR, whereas the end of a support portion SU2 having a bent portion BD2 is exposed from a side surface SD4 that crosses the side surface SD1 of the sealing body MR. Thus, the technical idea in the first embodiment can also be realized as the configuration of the fifth modification shown in FIG. 7 besides the configuration of the first embodiment shown in FIG. 1.

Here, in the first embodiment and the first through fourth modifications, the support portion SU1 and the support portion SU2 are arranged so as not to interfere with a metal wire W that couples a gate pad GP with a lead LD2. In other words, in the first embodiment and the first through fourth modifications, the support portion SU1 and the support portion SU2 are arranged so as not to overlap with the metal wire W as seen in a planar view.

When the support portion SU1 and the support portion SU2 are arranged in this way, it is possible to avoid a short circuit failure between a clip CLP and the metal wire W. This can therefore be considered to be a desired arrangement from the viewpoint of avoiding the short circuit failure. However, the technical idea in the first embodiment is not limited to the arrangements shown in the first embodiment and the first through fourth modifications, and can be applied even to the case where the support portion SU2 and the metal wire W are arranged so as to intersect as seen in a planar view as in the fifth modification shown in FIG. 7, for example. That is, there is also considered a case where the support portion SU2 and the metal wire W must be arranged so as to intersect as seen in the planar view as shown in FIG. 7, depending on restrictions on the layout arrangement and the like. Even in this case, however, the short circuit failure can be avoided by forming the metal wire W so as to straddle the support portion SU2 and avoiding direct contact between the support portion SU2 and the metal wire W.

Even in the fifth modification configured in this manner, it is possible to achieve an improvement in assembly workability by a manufacturing technology using the clip CLP having the support portions SU1 and SU2. It is also possible to suppress degradation of reliability of the semiconductor device PK1 based on the infiltration of moisture into the semiconductor device PK1, which is worried due to the adoption of the manufacturing technology. That is, even in the present modification, an improvement in assembly workability and an improvement in reliability of the semiconductor device PK1 can be compatibly established. As is apparent from the fifth modification in particular, it is understood that the technical idea in the first embodiment can be realized without being affected by the layout arrangement of the support portions SU1 and SU2 that support the clip CLP.

Second Embodiment

While the first embodiment has described the examples in each of which one bent portion is provided to one support portion, the second embodiment will explain examples in each of which a plurality of bent portions are provided with respect to one support portion.

Figure 8:
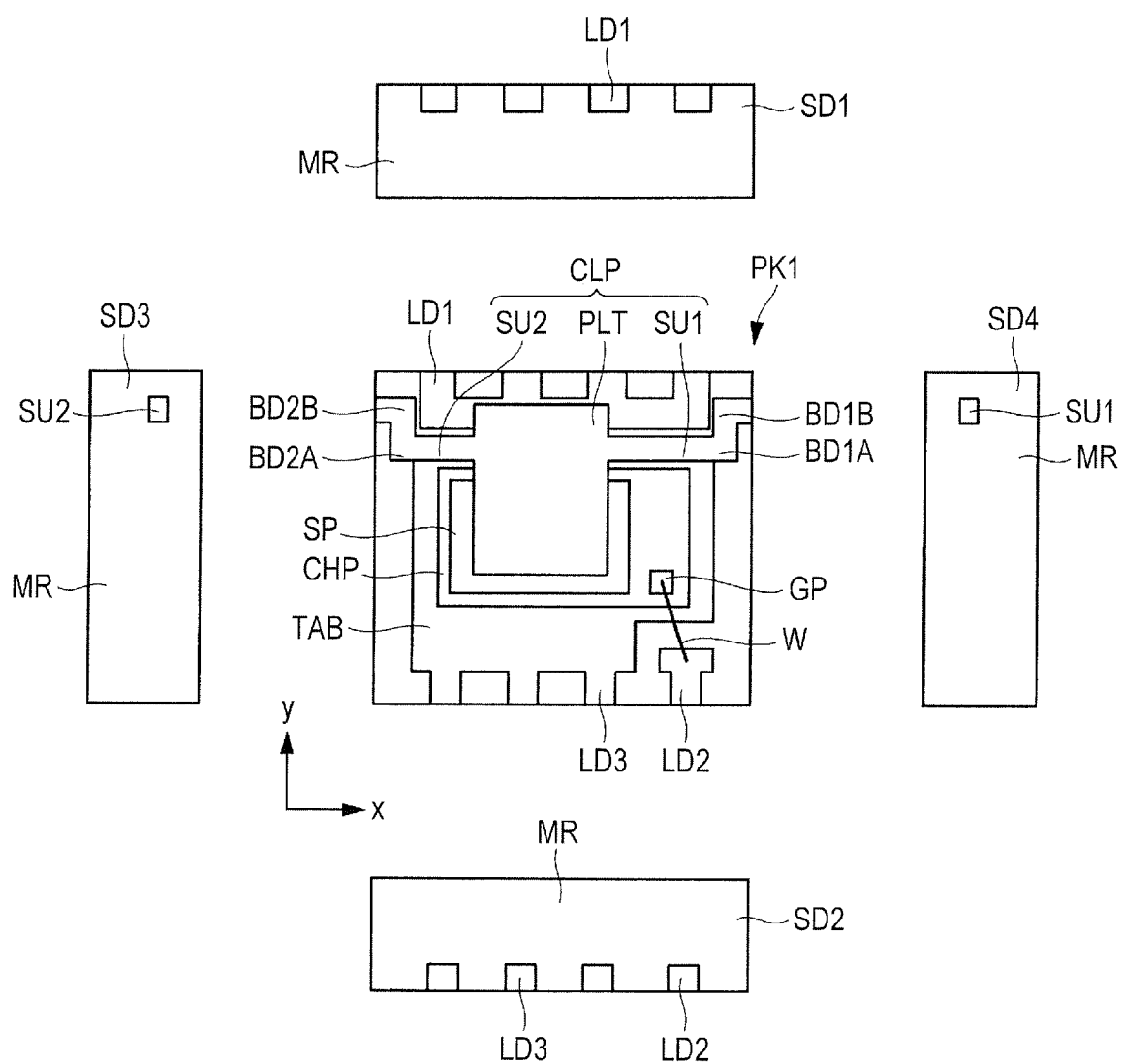
FIG. 8 shows a mounting configuration of a semiconductor device according to a second embodiment.

FIG. 8 is a view showing a mounting configuration of a semiconductor device PK1 according to the second embodiment. The semiconductor device PK1 according to the present embodiment shown in FIG. 8 is configured substantially similar to the semiconductor device PK1 according to the first embodiment shown in FIG. 1. The semiconductor device PK1 will therefore be described centering on differences therebetween.

Even in the semiconductor device PK1 according to the second embodiment, as shown in FIG. 8, a clip CLP is comprised of a plat-like portion PLT, a support portion SU1 and a support portion SU2. At this time, in the semiconductor device PK1 according to the second embodiment, as shown in FIG. 8, the support portion SU1 is formed with two bent portions BD1A and BD1B, and the support portion SU2 is also formed with two bent portions BD2A and BD2B. This is a feature point according to the second embodiment. Then, in the second embodiment, the end of the support portion SU1 is exposed from a side surface SD4 of a sealing body MR, whereas the end of the support portion SU2 is exposed from a side surface SD3 opposite to the side surface SD4 of the sealing body MR.

For example, when attention is given to the support portion SU1, the length of the support portion SU1 can be increased because the support portion SU1 is formed with the bent portions BD1A and BD1B in the second embodiment, as compared with the case where the support portion SU1 has a linear shape or the case where the support portion SU1 is provided with the single bent portion BD1 as in the first embodiment. According to the second embodiment, this means that the distance where moisture infiltrated from the end of the support portion SU1 exposed from the sealing body MR travels to reach a source pad SP formed in the surface of a semiconductor chip CHP can be increased as compared with the case where the support portion SU1 has a linear shape and the case where the single bent portion BD1 is provided.

That is, as with the technical idea in the first embodiment, the technical idea in the second embodiment is intended to increase the length of the support portion SU1 as much as possible and restrain the moisture from reaching the source pad SP formed in the surface of the semiconductor chip CHP, on the assumption that the end of the support portion SU1 is exposed from the side surface of the sealing body MR. Then, in the second embodiment, further devising has been made from the viewpoint of increasing the length of the support portion SU1 on the basis of the technical idea in the first embodiment. Specifically, in the second embodiment, the support portion SU1 is provided with the plural bent portions BD1A and BD1B to further increase the length of the support portion SU1 itself. As a result, according to the second embodiment, even if the end of the support portion SU1 is exposed from the side surface of the sealing body MR, it is possible to further reduce the probability of the moisture reaching the source pad SP formed in the surface of the semiconductor chip CHP with the increase in the length of the support portion SU1 due to the formation of the support portion SU1 with the two bent portions BD1A and BD1B.

From the above, even according to the second embodiment, it is possible to suppress an increase in leakage current due to the adhesion of the moisture over the source pad SP and a chip mounting portion TAB. It is thus possible to suppress degradation of the reliability of the semiconductor device PK1. That is, according to the present embodiment, it is possible to restrain the moisture from infiltrating into the semiconductor device PK1, which becomes easy to occur where a clip frame is used, while attaining an improvement in assembly workability by using the clip frame. In other words, according to the present embodiment, the reliability of the semiconductor device PK1 can also be improved while achieving the improvement in the assembly workability.

<First Modification>

Figure 9:
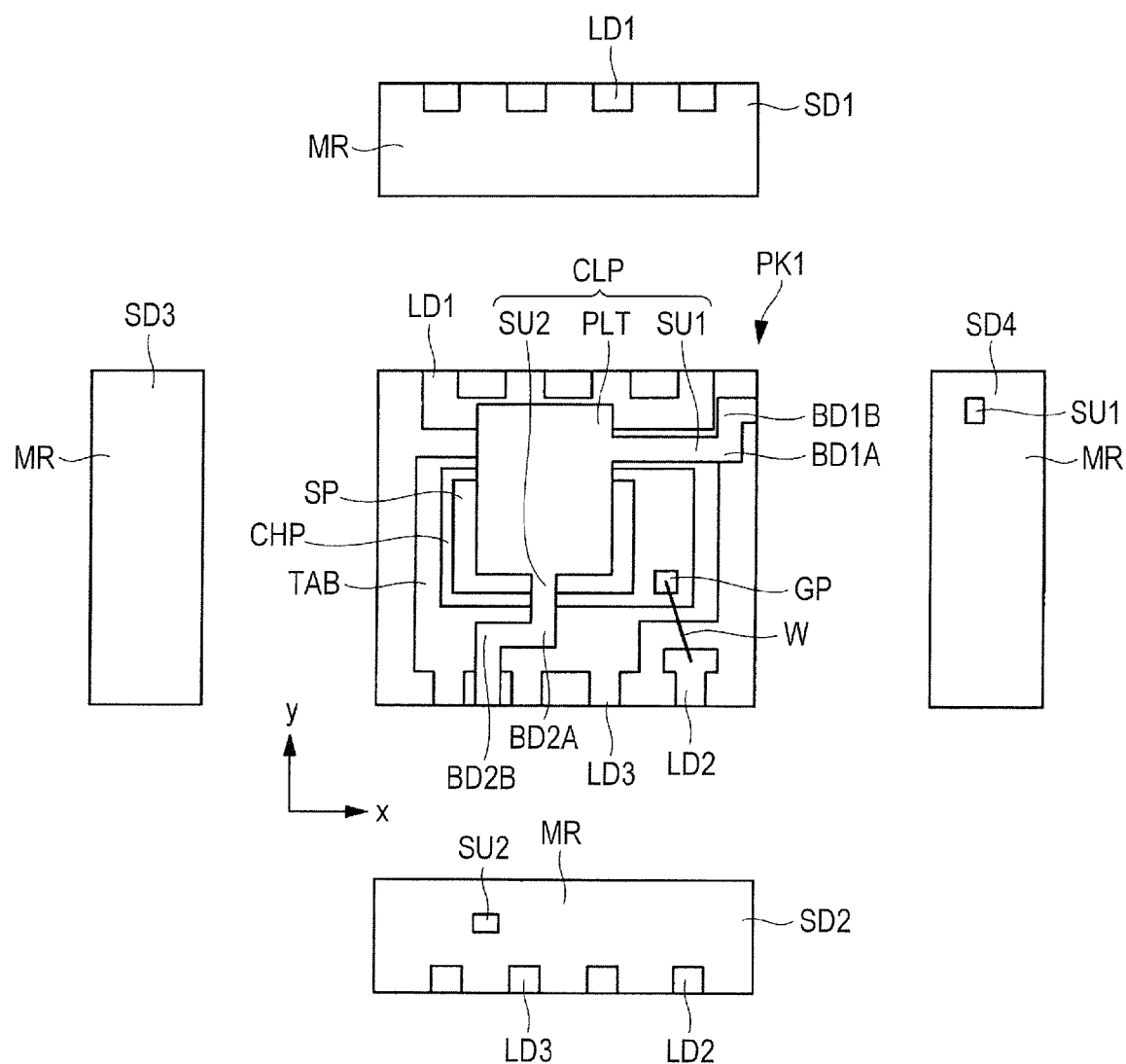
FIG. 9 shows a mounting configuration of a semiconductor device according to a first modification of the second embodiment.

A first modification will next be described. FIG. 9 is a view showing a mounting configuration of a semiconductor device PK1 according to the present modification. The semiconductor device PK1 according to the present modification shown in FIG. 9 is substantially similar in configuration to the semiconductor device PK1 according to the second embodiment shown in FIG. 8. The semiconductor device PK1 will therefore be described centering on differences therebetween.

For example, the semiconductor device PK1 according to the second embodiment is configured in such a manner that as shown in FIG. 8, the end of the support SU1 is exposed from the side surface SD4 of the sealing body MR, whereas the end of the support portion SU2 is exposed from the side surface SD3 opposite to the side surface SD4 of the sealing body MR. On the other hand, in the semiconductor device PK1 according to the present modification, as shown in FIG. 9, for example, the end of a support portion SU1 having two bent portions BD1A and BD1B is exposed from a side surface SD4 of a sealing body MR, whereas the end of a support portion SU2 having two bent portions BD2A and BD2B is exposed from a side surface SD2 which crosses the side surface SD4 of the sealing body MR. Thus, the technical idea in the second embodiment can be realized even by the configuration of the semiconductor device PK1 according to the first modification.

<Second Modification>

In the semiconductor device PK1 according to the second embodiment shown in FIG. 8 and the semiconductor device PK1 according to the first modification shown in FIG. 9, there have been described the examples in which the bent portions BD1A and BD1B provided to the support portion SU1 are bent in the in-plane direction parallel to the surface of the semiconductor chip CHP. The second modification will explain an example in which bent portions BD1A and BD1B provided to a support portion SU1 are bent in an out-plane direction which intersects the surface of a semiconductor chip CHP.

Figure 10:
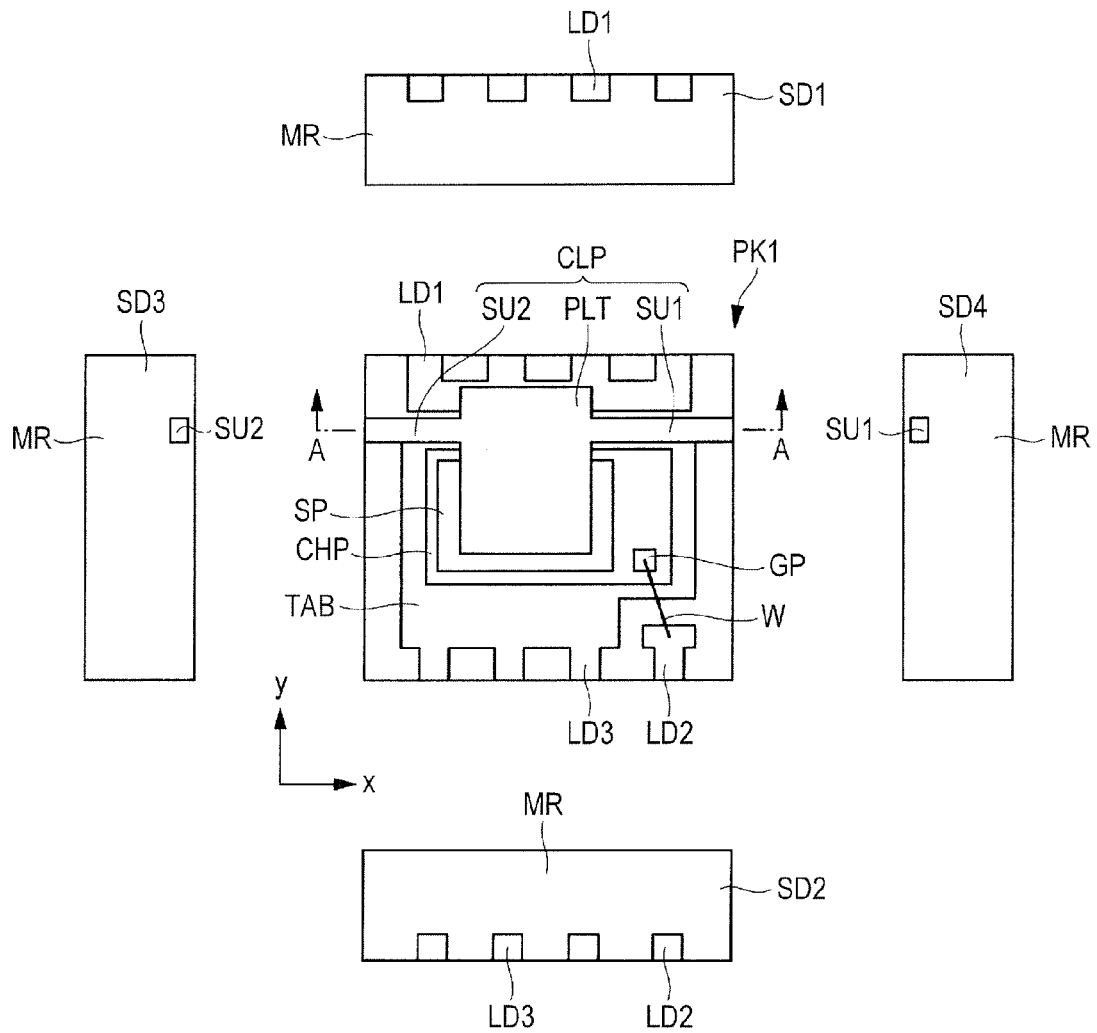
FIG. 10 shows a mounting configuration of a semiconductor device according to a second modification of the second embodiment.

FIG. 10 is a view showing a mounting configuration of a semiconductor device PK1 according to the second modification. The semiconductor device PK1 according to the present modification shown in FIG. 10 is substantially similar in configuration to the semiconductor device PK1 according to the second embodiment shown in FIG. 8. The semiconductor device PK1 will therefore be described centering on differences therebetween.

In FIG. 10, even in the semiconductor device PK1 according to the second modification, a clip CLP is comprised of a plate-like portion PLT and the support portions SU1 and SU2. As viewed from FIG. 10, however, the support portions SU1 and SU2 are both formed in a linear form and seem not to have bent portions. This is because in the second modification, the support portion SU1 is provided with the bent portion bent in the out-plane direction (vertical direction of a sealing body MR) intersecting the in-plane direction (xy plane) without providing the bent portion bent in the in-plane direction (xy plane) parallel to the surface of the semiconductor chip CHP. That is, in the present modification, the bent portions provided to the support portions SU1 and SU2 are not illustrated in FIG. 10.

Figure 11:
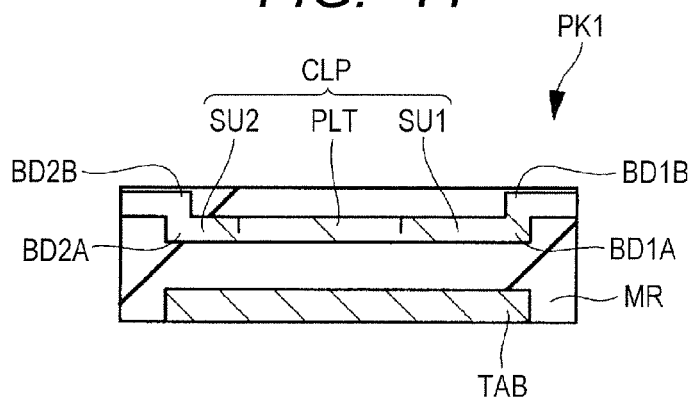
FIG. 11 is a cross-sectional view cut along line A-A of FIG. 10.

Thus, the bent portions bent in the vertical direction of the sealing body MR will be illustrated using the drawings shown below. FIG. 11 is a cross-sectional view cut along line A-A of FIG. 10. As shown in FIG. 11, in the semiconductor device PK1 according to the second modification, the clip CLP is disposed above a chip mounting portion TAB, and the support portion SU1 being the component of the clip CLP is formed with the bent portions BD1A and BD1B bent in the vertical direction of the sealing body MR. Likewise, the support portion SU2 is also formed with bent portions BD2A and BD2B bent in the vertical direction of the sealing body MR. In this case, as is apparent from FIG. 11, the height as viewed from the chip mounting portion TAB, of the end of the support portion SU1, which is exposed from the sealing body MR, is greater than the height of the plate-like portion PLT from the chip mounting portion TAB. In other words, it can also be said that the height of the end of the support portion SU1 exposed from the sealing body MR as viewed from the bottom surface of the sealing body MR becomes greater than the height of the plate-like portion PLT as viewed from the bottom surface of the sealing body MR.

Even in the case where the present modification is configured in this manner, it is possible to further reduce the probability of moisture reaching a source pad SP formed in the surface of the semiconductor chip CHP with an increase in the length of the support portion SU1 and the length of the support portion SU2 due to the formation of the support portion SU1 with the bent portions BD1A and BD1B and the formation of the support portion SU2 with the bent portions BD2A and BD2B. That is, it is understood that the technical idea in the second embodiment is not limited to the case where the bent portions bent in the in-plane direction (the xy plane) as in the second embodiment shown in FIG. 8 and the first modification shown in FIG. 9, but can be applied even to the case where the bent portions bent in the out-plane direction (vertical direction of the sealing body MR) are provided as in the second modification shown in FIG. 11.

From the above, an increase in leakage current due to the adhesion of the moisture over the source pad SP and the chip mounting portion TAB can be suppressed even by the second modification that is an example illustrative of an embodied mode of the technical idea according to the second embodiment. It is thus possible to suppress degradation of the reliability of the semiconductor device PK1. That is, even according to the second modification, it is possible to restrain the moisture from infiltrating into the semiconductor device PK1, which becomes easy to occur where the clip frame is used, while attaining an improvement in assembly workability by using the clip frame. In other words, according to the second modification, the reliability of the semiconductor device PK1 can also be improved while achieving the improvement in the assembly workability.

Incidentally, as an advantage specific to the present modification, there may be mentioned that since the height of the end of the support portion SU1 and the height of the end of the support portion SU2, both of which are exposed from the sealing body MR, becomes greater, the moisture becomes hard to infiltrate from the exposed end.

Third Embodiment

In the first and second embodiments, the technical idea has been described which increases the length of the support portion by providing the bent portions to the support portion and making longer the infiltration path of the moisture up to the semiconductor chip. The third embodiment will however explain an example in which another technical idea for restraining moisture from infiltrating into a semiconductor device is also combined therewith. This technical idea is intended to reduce as much as possible, the area of the end of a support portion, which is exposed from a sealing body. In other words, it can also be said that the present technical idea is intended to make an infiltration inlet of moisture existing in the sealing body as small as possible.

Figure 12:
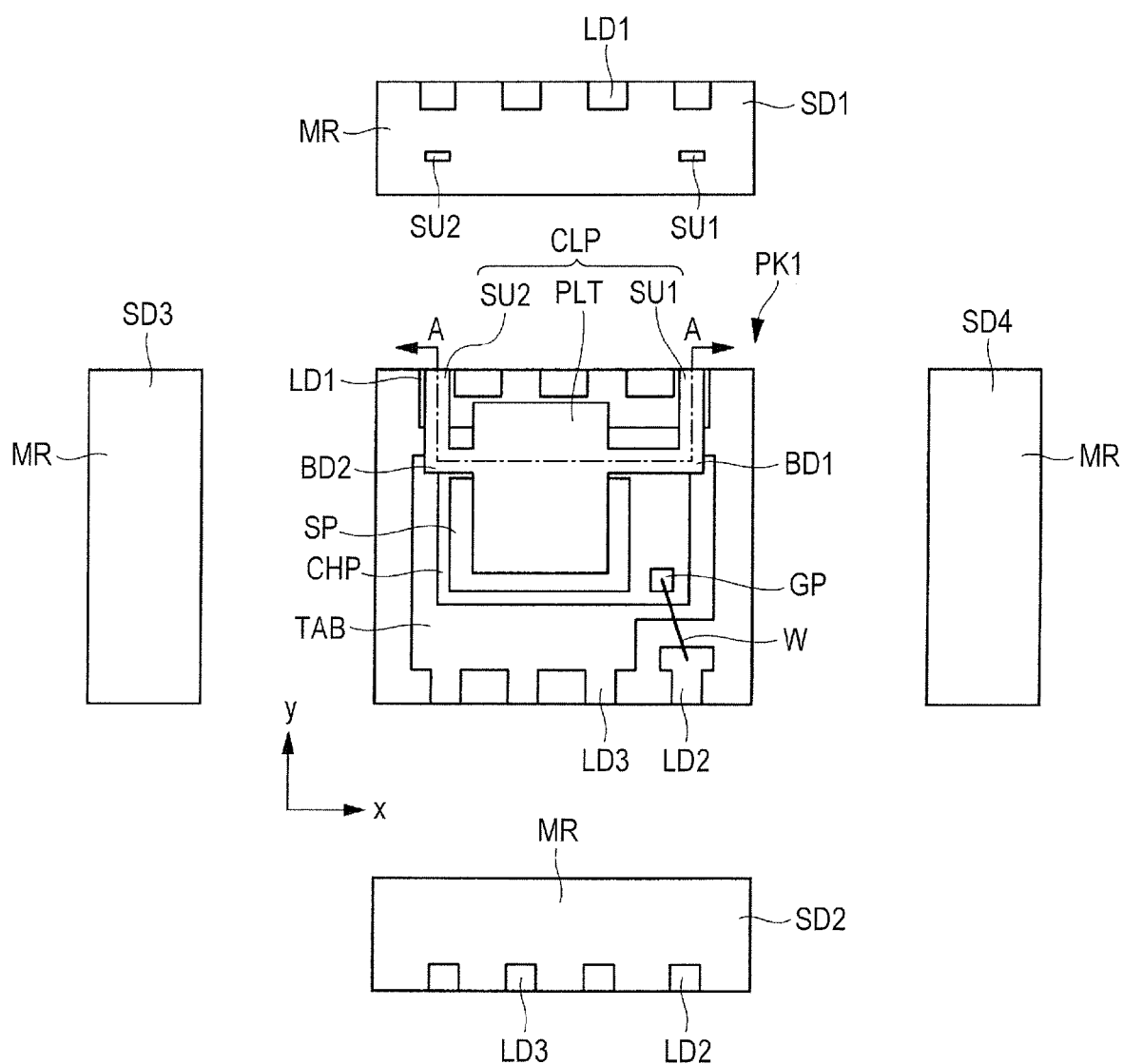
FIG. 12 shows a mounting configuration of a semiconductor device according to a third embodiment.

A description will be made below of a configuration example of a semiconductor device in which the technical idea in the third embodiment is embodied. FIG. 12 is a view showing a mounting configuration of a semiconductor device PK1 according to the third embodiment. The semiconductor device PK1 according to the third embodiment shown in FIG. 12 is configured substantially similar to the semiconductor device PK1 according to the first embodiment shown in FIG. 1. The present semiconductor device PK1 will therefore be described centering on differences therebetween.

In FIG. 12, the feature of the third embodiment resides in that the thickness (thickness in the vertical direction of a sealing body MR) of each of support portions SU1 and SU2 exposed from a side surface SD1 of the sealing body MR illustrated in an upper region becomes thinner. Thus, according to the third embodiment, it is possible to reduce the area of the end of the support portion SU1 exposed from the sealing body MR and the area of the end of the support portion SU2 exposed therefrom. This means that the infiltration inlet of the moisture becomes narrower. Thus, according to the semiconductor device PK1 according to the third embodiment, it is possible to reduce the probability of the moisture reaching a source pad SP formed in the surface of a semiconductor chip CHP.

In particular, according to the third embodiment, the synergistic effect of embodying the technical idea that the support portion SU1 is provided with the bent portion BD1 to thereby make the infiltration path of the moisture up to the semiconductor chip CHP and embodying the technical idea that the area of the end of the support portion SU1 exposed from the sealing body MR is reduced as much as possible enables a further reduction in the probability of the moisture reaching the source pad SP formed in the surface of the semiconductor chip CHP.

From the above, even according to the third embodiment, it is possible to suppress an increase in leakage current due to the adhesion of the moisture over the source pad SP and the chip mounting portion TAB. It is thus possible to suppress degradation of the reliability of the semiconductor device PK1. That is, according to the third embodiment, it is possible to restrain the moisture from infiltrating into the semiconductor device PK1, which becomes easy to occur where the clip frame is used, while attaining an improvement in assembly workability by using the clip frame. In other words, according to the third embodiment, the reliability of the semiconductor device PK1 can also be improved while achieving the improvement in the assembly workability.

Configuration examples in each of which the area of the end of the support portion SU1 exposed from the sealing body MR is reduced will specifically be described below with reference to cross-sectional views.

Figure 13:
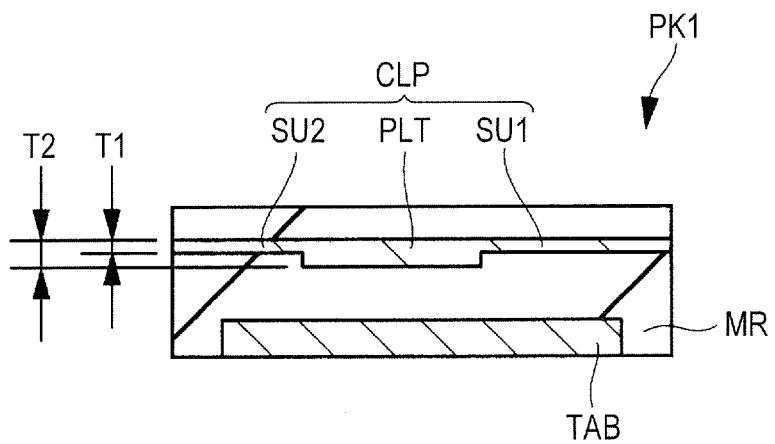
FIG. 13 is a cross-sectional view showing a configuration example, which is cut along line A-A of FIG. 12.

FIG. 13 is a cross-sectional view showing a configuration example, which is cut along line A-A of FIG. 12. As shown in FIG. 13, a clip CLP is comprised of a plate-like portion PLT, a support portion SU1 and a support portion SU2. When, at this time, the thickness of the support portion SU1 and the thickness of the support portion SU2 are taken to be T1, and the thickness of the plate-like portion PLT is taken to be T2 as shown in FIG. 13, T1<T2 is established. That is, the thickness of the support portion SU1 and the thickness of the support portion SU2 are thinner than the thickness of the plate-like portion PLT. It is thus possible to reduce the areas of the end of the end of the support portion SU1 and the area of the end of the support portion SU2 both exposed from the sealing body MR. Specifically, in FIG. 13, T1<T2 is realized by a structure in which the upper surface of the support portion SU1, the upper surface of the support portion SU2 and the upper surface of the plate-like portion PLT become flush with each other, and the lower surface of the support portion SU1 and the lower surface of the support portion SU2 become higher than the lower surface of the plate-like portion PLT. As a method for forming such a shape, there is considered a method for performing half etching from the lower surface side of the support portion SU1 and the lower surface side of the support portion SU2.

Figure 14:
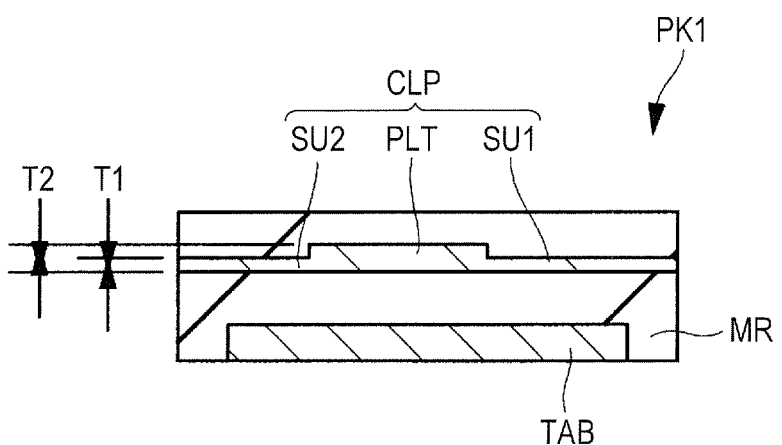
FIG. 14 is a cross-sectional view showing a configuration example, which is cut along line A-A of FIG. 12.

Subsequent to the above, FIG. 14 is a cross-sectional view showing a configuration example, which is cut along line A-A of FIG. 12. As shown in FIG. 14, a clip CLP is comprised of a plate-like portion PLT, a support portion SU1 and a support portion SU2. When, at this time, the thickness of the support portion SU1 and the thickness of the support portion SU2 are taken to be T1, and the thickness of the plate-like portion PLT is taken to be T2 as shown in FIG. 14, T1<T2 is established. That is, the thickness of the support portion SU1 and the thickness of the support portion SU2 are thinner than the thickness of the plate-like portion PLT. It is thus possible to reduce the areas of the end of the support portion SU1 and the end of the support portion SU2 both exposed from a sealing body MR. Specifically, in FIG. 14, T1<T2 is realized by a structure in which the lower surface of the support portion SU1, the lower surface of the support portion SU2 and the lower surface of the plate-like portion PLT become flush with each other, and the upper surface of the support portion SU1 and the upper surface of the support portion SU2 become lower than the upper surface of the plate-like portion PLT. As a method for forming such a shape, there is considered a method for performing half etching from the upper surface side of the support portion SU1 and the upper surface side of the support portion SU2.

Figure 15:
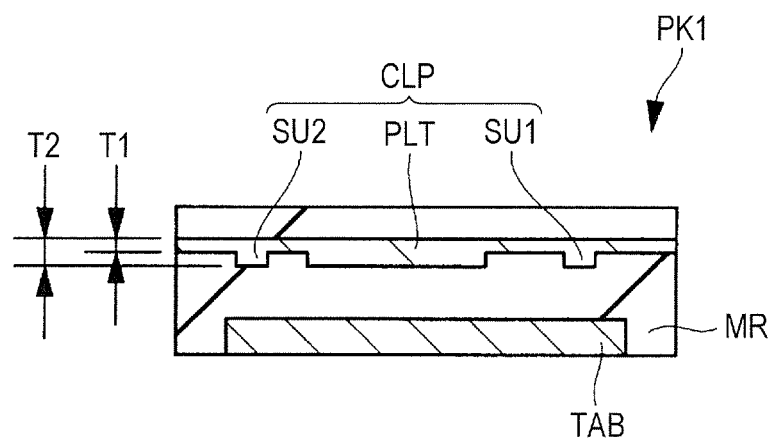
FIG. 15 is a cross-sectional view showing a configuration example, which is cut along line A-A of FIG. 12.

Next, FIG. 15 is a cross-sectional view showing a configuration example, which is cut along line A-A of FIG. 12. As shown in FIG. 15, a clip CLP is comprised of a plate-like portion PLT, a support portion SU1 and a support portion SU2. At this time, as shown in FIG. 15, the support portion SU1 and the support portion SU2 are respectively provided with a first portion having a thickness of T1 and a second portion having a thickness T2 thicker than the thickness T1. The thickness of the plate-like portion PLT becomes T2. Further, in the configuration example shown in FIG. 15, the first portion whose thickness is thin is formed on the end side of the support portion SU1 rather than the second portion whose thickness is thick. It is thus possible to reduce the areas of the end of the support portion SU1 and the end of the support portion SU2 both exposed from a sealing body MR. Further, in the structure shown in FIG. 15, the support portion SU1 is formed with concave and convex shapes based on the first and second portions. Therefore, the effect of making it hard to infiltrate moisture along the support portion SU1 can also be obtained. That is, since the second portion of the support portion SU1 forming the convex shape functions as a breakwater for restraining the moisture from infiltrating in the structure shown in FIG. 15, it is possible to reduce the areas of the end of the support portion SU1 and the end of the support portion SU2 both exposed from the sealing body MR and also obtain the effect of making it easy to infiltrate the moister into the semiconductor device PK1 in the case of the structure shown in FIG. 15.

Incidentally, in FIG. 15, the upper surface of the support portion SU1, the upper surface of the support portion SU2 and the upper surface of the plate-like portion PLT are flush with one another, and the concave and convex shapes are formed in the lower surface of the support portion SU1 and the lower surface of the support portion SU2. As a method for forming such shapes, there is considered a method for performing half etching from the lower surface side of the support portion SU1 and the lower surface side of the support portion SU2 while covering a portion for forming the second portion with a mask.

<First Modification>

Figure 16:
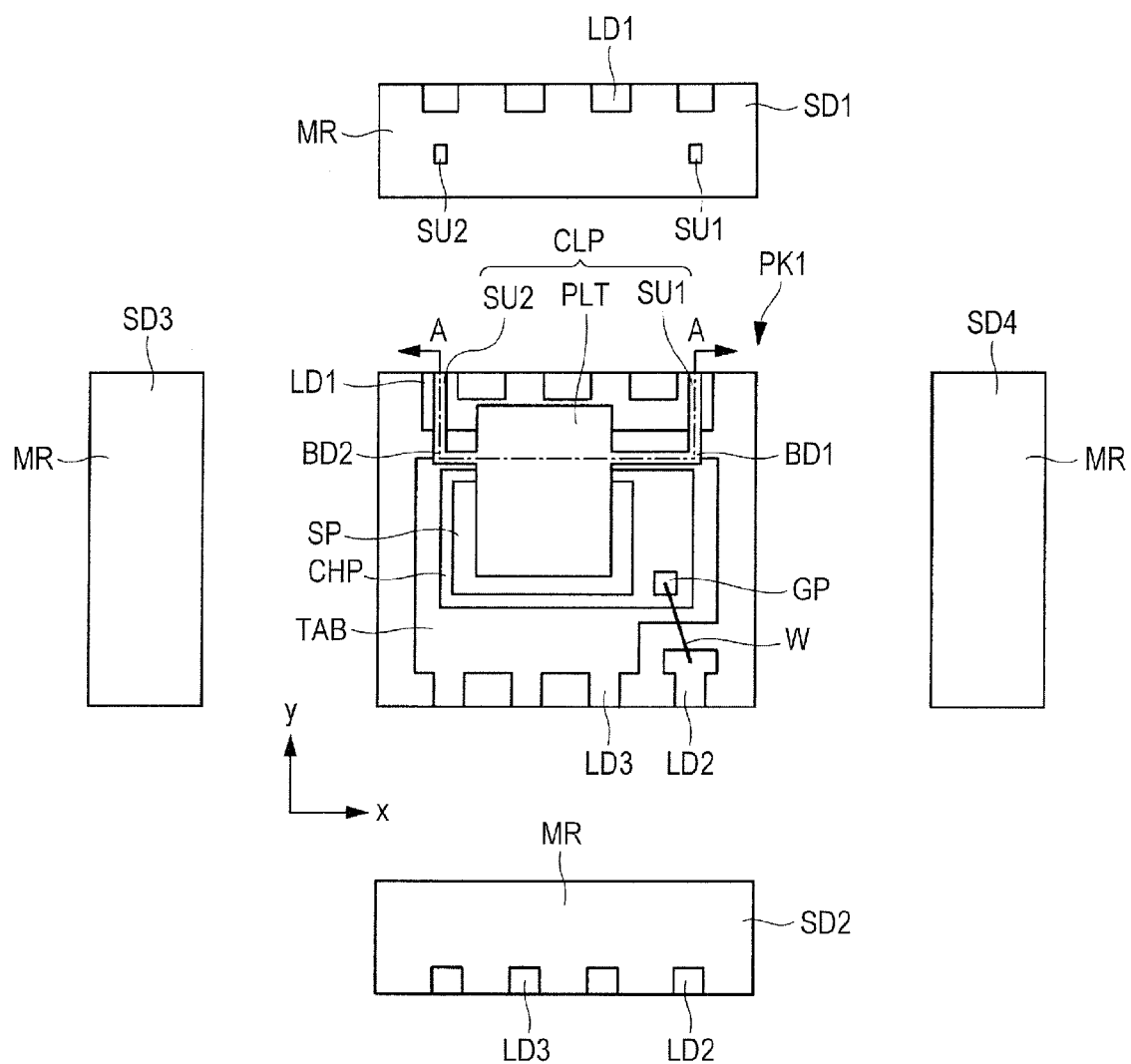
FIG. 16 shows a mounting configuration of a semiconductor device according to a first modification of the third embodiment.

A first modification will be described subsequently. FIG. 16 is a view showing a mounting configuration of a semiconductor device PK1 according to the first modification. The semiconductor device PK1 according to the present modification shown in FIG. 16 is configured substantially similar to the semiconductor device PK1 according to the third embodiment shown in FIG. 12. The present semiconductor device PK1 will therefore be described centering on differences therebetween.

For example, in the semiconductor device PK1 according to the third embodiment, the area of the end of the support portion SU1 exposed from the side surface SD1 of the sealing body MR is reduced by making thinner the thickness of the support portion SU1 as shown in FIG. 12. In contrast, in the semiconductor device PK1 according to the present modification, when focusing on a support portion SU1, for example, the end of the support portion SU1 is exposed from a side surface SD1 of a sealing body MR shown in the upper region of FIG. 16, but the width in an x direction, of the exposed end of support portion SU1 becomes small. Thus, even in the present modification, the area of the end of the support portion SU1, which is exposed from the side surface SD1 of the sealing body MR, can be reduced.

That is, the third embodiment shown in FIG. 12 and the present modification shown in FIG. 16 are common in the sense of reducing the area of the end of the support portion SU1 exposed from the sealing body MR. They however differ from each other in that in the third embodiment shown in FIG. 12, the area of the end is reduced by making thinner the thickness of the support portion SU1, whereas in the present modification shown in FIG. 16, the area of the end is reduced by making the x-direction width of the support portion SU1 smaller.

Even by the configuration of the semiconductor device PK1 according to such a first modification, the technical idea that makes the area of the end of the support portion SU1 exposed from the sealing body MR as small as possible, in other words, the technical idea that makes the infiltration inlet of moisture existing in the sealing body MR as small as possible can be realized.

<Second Modification>

The third embodiment has described the configuration example in which as shown in FIG. 12, for example, the technical idea that the support portion SU1 is provided with the bent portion BD1 to thereby increase the length of the support portion SU1 and make the infiltration path of the moisture up to the semiconductor chip CHP longer, and the technical idea that the thickness of the support portion SU1 is set thinner to thereby make the area of the end of the support portion SU1 exposed from the sealing body MR as small as possible are combined together. It can be said that the present configuration example is of a configuration desirable in the light of restraining the moisture from being infiltrated into the semiconductor device PK1. It is however considered that superiority in restraining the moisture from infiltrating into the semiconductor device PK1 is obtained even only by the configuration of embodying the technical idea that makes the area of the end of the support portion SU1 exposed from the sealing body MR as small as possible. Thus, in the second modification, a description will be made of a configuration example in which only the technical idea that the area of the end of the support portion SU1 exposed from the sealing body MR is made as small as possible is embodied.

Figure 17:
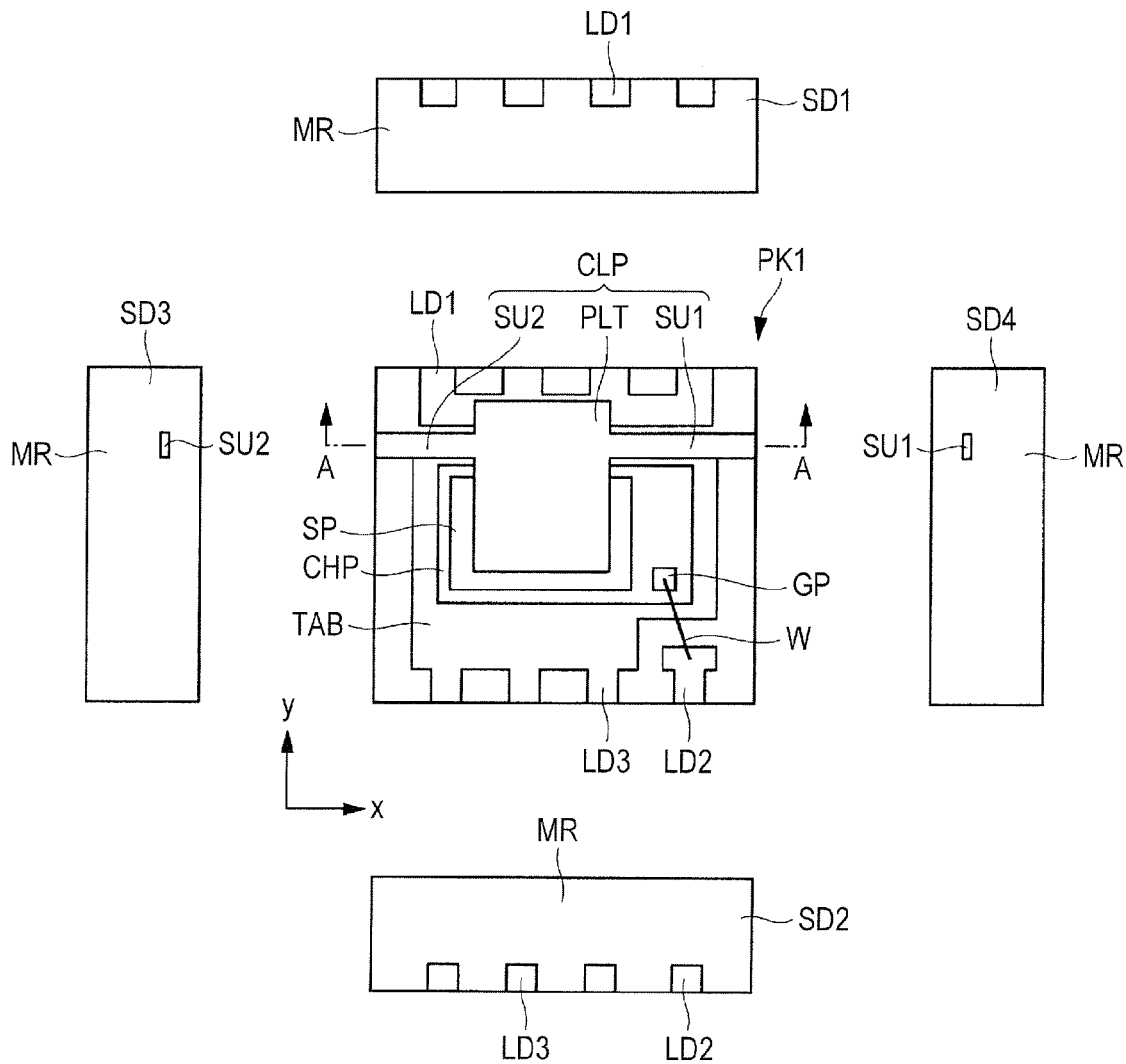
FIG. 17 shows a mounting configuration of a semiconductor device according to a second modification of the third embodiment.
Figure 18:
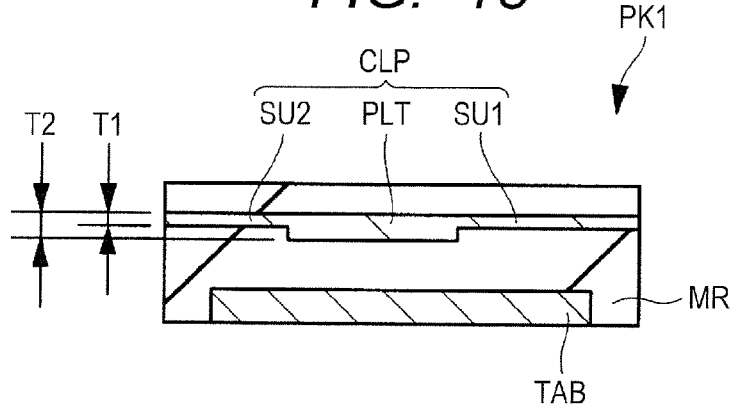
FIG. 18 is a cross-sectional view cut along line A-A of FIG. 17.

FIG. 17 is a view showing a mounting configuration of a semiconductor device PK1 according to the second modification. In FIG. 17, a clip CLP is formed of a plate-like portion PLT, a support portion SU1 and a support portion SU2. The support portions SU1 and SU2 are not provided with the bent portions and formed in a linear shape. As shown in FIG. 17, the end of the support portion SU1 is exposed form a side surface SD4 of a sealing body MR, and the end of the support portion SU2 is exposed from a side surface SD3 opposite to the side surface SD4 of the sealing body MR. At this time, in the present modification, the thickness of the end of the support portion SU1 and the thickness of the end of the support portion SU2 become thin. Specifically, FIG. 18 is a cross-sectional view cut along line A-A of FIG. 17. It is understood that as shown in FIG. 18, the thickness (T1) of the support portion SU1 and the thickness (T2) of the support portion SU2 are thinner than the thickness (T2) of the plate-like portion PLT. It is understood from this point of view that the technical idea that the area of the end of the support portion SU1 exposed from the sealing body MR is made as small as possible by the configuration according to the present modification, in other words, the technical idea that the infiltration inlet of moisture existing in the sealing body MR is made as small as possible has been embodied. Even in the present modification configured in this way, it is possible to restrain the moisture from infiltrating into the semiconductor device PK1.

Fourth Embodiment

A fourth embodiment will explain an example in which the technical idea in the first embodiment is applied to a semiconductor device that acts as a component of a DC/DC converter, for example.

<Circuit Configuration and Operation of DC/DC Converter>

Figure 19:
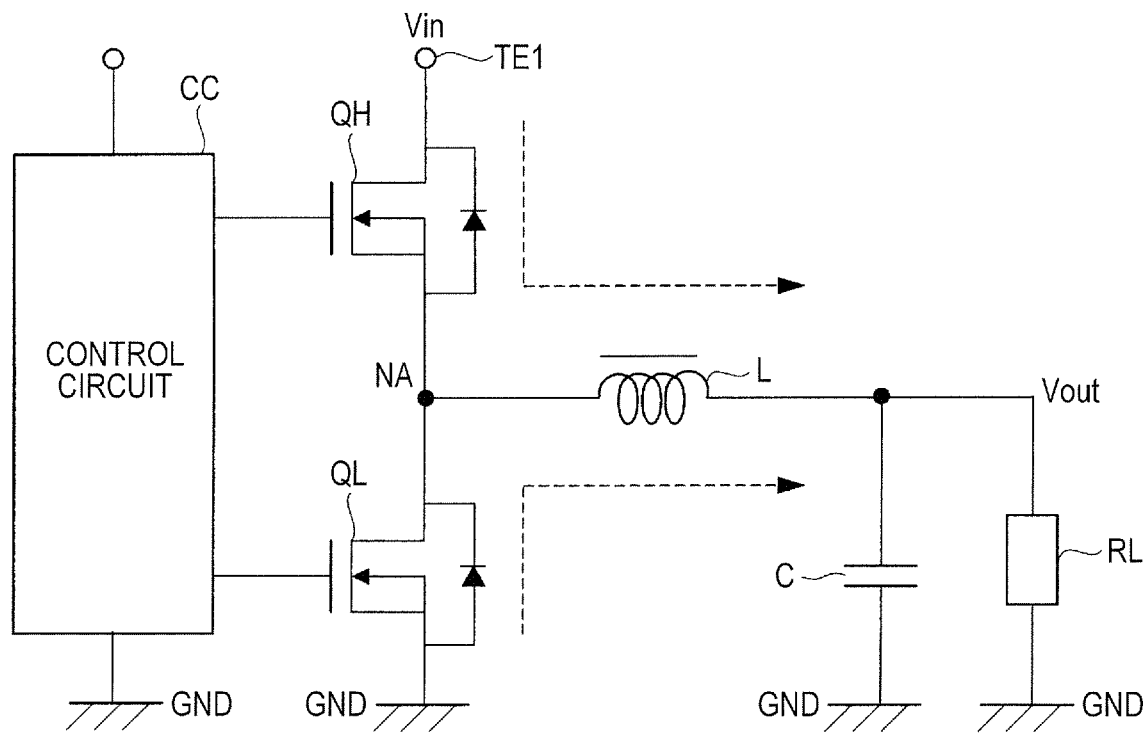
FIG. 19 is shows a circuit configuration of a step-down DC/DC converter.

FIG. 19 is a view showing a circuit configuration of a step-down DC/DC converter. As shown in FIG. 19, in the step-down DC/DC converter, a high side MOS transistor QH and a low side MOS transistor QL are coupled in series between an input terminal TE1 and a ground GND. Then, an inductor L and a load RL are coupled in series between a node NA provided between the high side MOS transistor QH and the low side MOS transistor QL and the ground GND. A capacitor C is coupled in parallel to the load RL.

Further, a gate electrode of the high side MOS transistor QH and a gate electrode of the low side MOS transistor QL are coupled to a control circuit CC. On/off of the high side MOS transistor QH and on/off of the low side MOS transistor QL are controlled by the control circuit CC. Specifically, the control circuit CC controls the low side MOS transistor QL to be turned off when turning on the high side MOS transistor, and controls the low side MOS transistor QL to be turned on when turning off the high side MOS transistor QH.

Here, for example, when the high side MOS transistor QH is turned on and the low side MOS transistor QL is turned off, current flows from the input terminal TE1 to the load RL through the high side MOS transistor QH and the inductor L. Thereafter, when the high side MOS transistor QH is turned off and the low side MOS transistor QL is turned on, the high side MOS transistor QH is first turned off so that the current flowing from the input terminal TE1 to the load RL via the high side MOS transistor QH and the inductor L is cut off. That is, the current flowing through the inductor L is cut off. When, however, the current is decreased (cut off), the inductor L tries to maintain the current flowing therethrough. Since the low side MOS transistor QL is being turned on at this time, current flows from the ground GND to the load RL through the low side MOS transistor QL and the inductor L. Thereafter, again, the high side MOS transistor QH is turned on and the low side MOS transistor QL is turned off. By repeating such operations, in the step-down DC/DC converter shown in FIG. 19, an output voltage Vout lower than an input voltage Vin is output across the load RL when the input voltage Vin is input to the input terminal TE1.

A description will briefly be made below of the reason why when the input voltage Vin is input to the input terminal TE1, the output voltage Vout lower than the input voltage Vin is output across the load RL by repeating the above-described switching operation. Incidentally, the current flowing through the inductor L is to be treated as being not interrupted below.

First, the high side MOS transistor QH is to be switching-operated during an on period $T_{ON}$ and an off period $T_{OFF}$ by control by the control circuit CC. A switching frequency in this case becomes $f=1/(T_{ON}+T_{OFF})$.

Here, for example, in FIG. 19, the capacitor C inserted in parallel to the load RL has the function of preventing the output voltage Vout from greatly varying in a short time. That is, since the capacitor C having a relatively large capacitance value is inserted in parallel to the load RL in the step-down DC/DC converter shown in FIG. 19, the ripple voltage included in the output voltage Vout becomes a value smaller than the output voltage Vout in a steady state. Therefore, a fluctuation in the output voltage Vout during one cycle of the switching operation can be ignored.

First consider where the high side MOS transistor QH is turned on. Since, at this time, it is assumed that the output voltage Vout does not vary within one cycle, the voltage applied to the inductor L can be taken to be constant at (Vin−Vout). As a result, when the inductance of the inductor L is taken as L1, an increase $\Delta I_{on}$ in current during the on period $T_{ON}$ is given by an equation (1):

$$\Delta I_{on}=(V\text{in}-V\text{out})/L1 \times T_{ON} \quad (1)$$

Next consider where the high side MOS transistor QH is turned off. Since the low side MOS transistor QL is turned on in this case, the voltage applied to the inductor L becomes 0−Vout=−Vout. Thus, an increase $\Delta I_{OFF}$ in current during the off period $T_{OFF}$ is given by an equation (2):

$$\Delta I_{OFF}=-V\text{lout}-/L1-T_{OFF} \quad (2)$$

When the steady state is reached at this time, the current flowing through the inductor L does not increase or decrease during one cycle of the switching operation. In other words, when the current flowing through the inductor L increases or decrease during one cycle, it means that the steady state is not reached yet. Accordingly, an equation (3) is established in the steady state.

$$\Delta I_{ON}+\Delta I_{OFF}=0 \quad (3)$$

Substituting the relation of the equation (1) and the relation of the equation (2) in the equation (3) can yield an equation (4) shown below:

$$V\text{out}=V\text{in} \times T_{ON}/(T_{ON}+T_{OFF}) \quad (4)$$

Since $T_{ON} \geq 0$ and $T_{OFF} \geq 0$ in the equation (4), it turns out that Vout<Vin. That is, the step-down DC/DC converter shown in FIG. 19 is found to be a circuit which outputs the output voltage Vout lower than the input voltage Vin. It turns out from the equation (4) that when the on period $T_{ON}$ and the off period $T_{OFF}$ are changed by controlling the switching operation by the control circuit CC, an optional output voltage Vout lower than the input voltage Vin can be obtained. If the on period $T_{ON}$ and the off period $T_{OFF}$ are controlled to be constant in particular, then a constant output voltage Vout can be obtained.

According to the step-down DC/DC converter shown in FIG. 19 as described above, it is understood that the on/off of the high side MOS transistor QH and the on/off of the low side MOS transistor QL are controlled by the control circuit CC to thereby enable the output of the output voltage Vout lower than the input voltage Vin.

<Mounting Configuration of Semiconductor Device According to Fourth Embodiment>

The control circuit CC, the low side MOS transistor QL and the high side MOS transistor QH included in the above-described DC/DC converter are made into a product as a one-packaged semiconductor device, for example. Since the one-packaged semiconductor device is a semiconductor device that configures a part of the DC/DC converter because it does not include the inductor L and the capacitor C shown in FIG. 19, but it may also be called a semiconductor device that configures the DC/DC converter for the sake of convenience.

The semiconductor device is formed of a semiconductor chip formed with semiconductor elements such as a MOS-FET (Metal Oxide Semiconductor Field Effect Transistor) and the like, and a package formed so as to cover the semiconductor chip. The package has (1) the function of electrically coupling the semiconductor element formed in the semiconductor chip and an external circuit to each other and (2) the function of protecting the semiconductor chip from the external environment such as atmospheric humidity and temperature and preventing vibrations, damage due to impact and degradation of the characteristic of the semiconductor chip. Further, the package has both (3) the function of making handling of the semiconductor chip easier and (4) the function of radiating heat generated upon the operation of the semiconductor chip and exhibiting the function of the semiconductor element to the maximum, etc.

As a package structure for the semiconductor device, there are known various types like, for example, a BGA (Ball Grid Array) package, a QFP (Quad Flat Package) package, a QFN (Quad Flat Non-Leaded Package) package and the like. Of such various package types, the semiconductor device that forms the part of the above-described DC/DC converter is mount-configured in the QFN package. Thus, the mounting configuration of the semiconductor device comprised of the QFN package, which configures the part of the DC/DC converter, will be described below.

Figure 20:
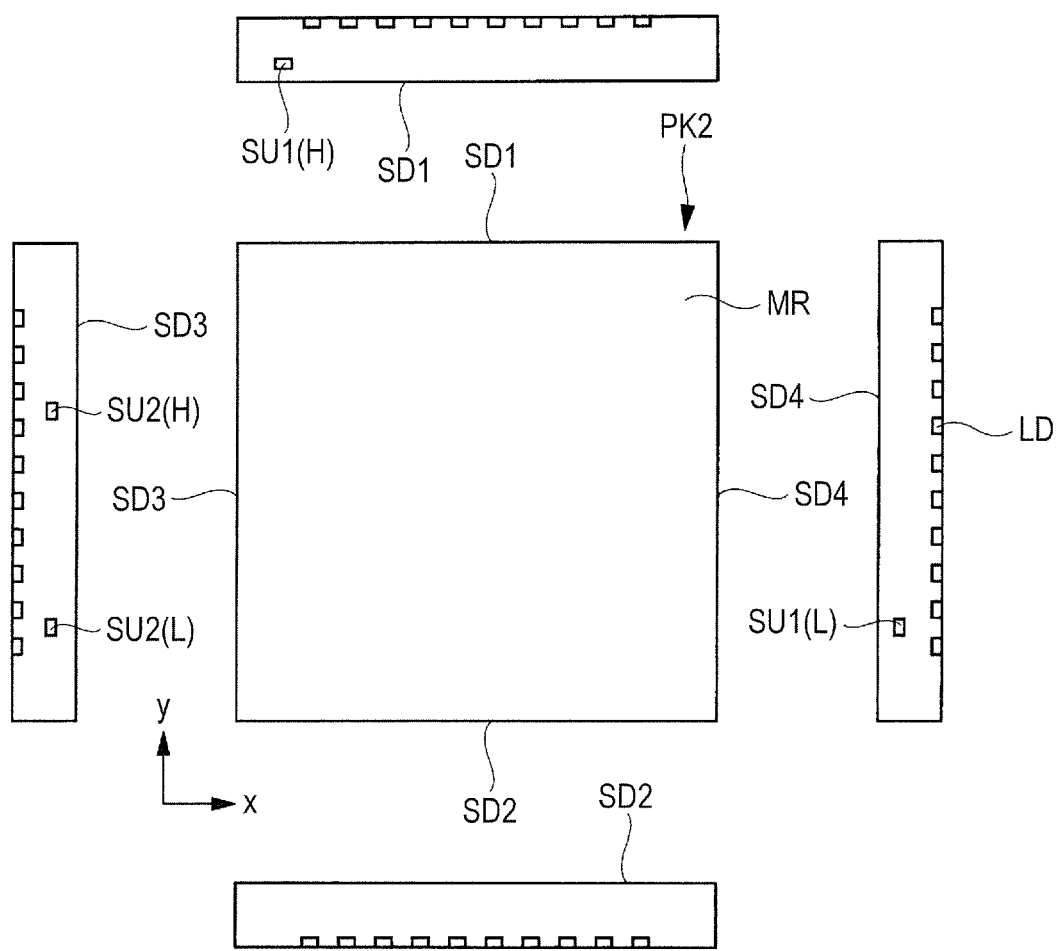
FIG. 20 shows a mounting configuration of a semiconductor device according to a fourth embodiment.

FIG. 20 is a view showing a mounting configuration of a semiconductor device PK2 according to the fourth embodiment. In FIG. 20, the drawing shown in its center is a plan view of the semiconductor device PK2 as viewed from its upper surface (surface), and side views are shown on four sides respectively. As shown in FIG. 20, the semiconductor device PK2 according to the fourth embodiment is covered with a sealing body MR shaped in a rectangular form. It is understood that as can be seen from the side views that leads LD are exposed from the sealing body MR on the side surfaces of the semiconductor device PK2.

The sealing body has a rectangular shape (e.g., quadrangular shape) as seen in a planar view and includes an upper surface, a lower surface opposite to the upper surface and a plurality of side surfaces (four side surfaces) arranged between the upper and lower surfaces. Specifically, as shown in FIG. 20, it is understood that when the four side surfaces are referred to as SD1 through SD4 respectively, the leads LD are exposed from the sealing body MR in the side surfaces SD1 through SD4. Further, in the fourth embodiment, the ends of support portions SU1 (L), SU2 (L), SU1 (H) and SU2 (H) are also exposed from the side surfaces of the semiconductor device PK2. Described specifically, the support portion SU1 (H) is exposed from the side surface SD1. Further, the support portions SU2 (L) and SU2 (H) are exposed from the side surface SD3, and the support portion SD1 (L) is exposed from the side surface SD4.

Figure 21:
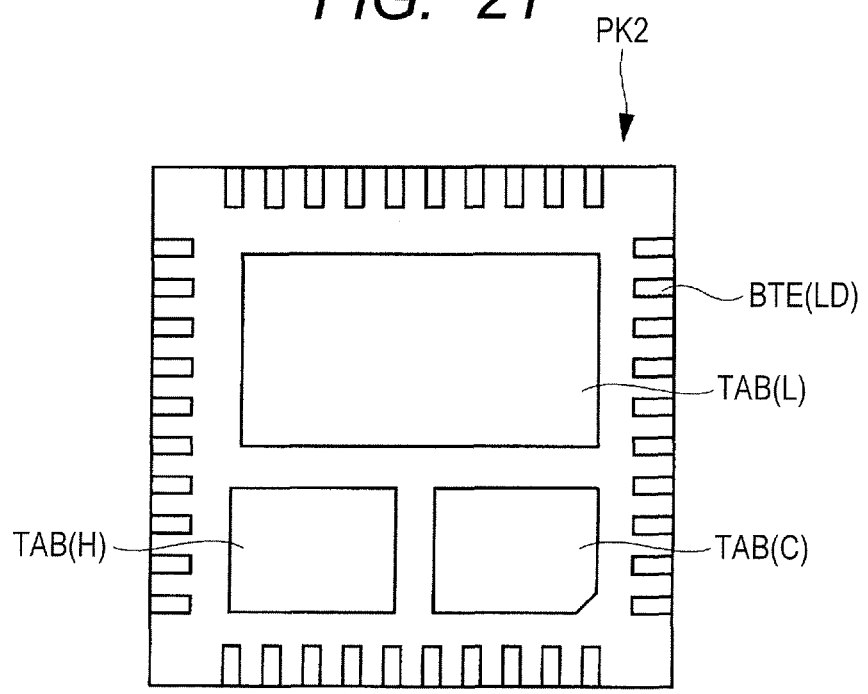
FIG. 21 is a plan view of the semiconductor device according to the fourth embodiment as viewed from its lower surface.

Next, FIG. 21 is a plan view of the semiconductor device PK2 according to the fourth embodiment as viewed from its lower surface (back surface). As shown in FIG. 21, the back surface of the semiconductor device PK2 is also covered with the sealing body MR, but parts (back surfaces) of a chip mounting portion TAB (L), a chip mounting portion TAB (H) and a chip mounting portion TAB (C) are exposed from the sealing body MR. The parts of the chip mounting portion TAB (L), the chip mounting portion TAB (H) and the chip mounting portion TAB (C) are exposed from the back surface of the semiconductor device PK2 in this way, thereby making it possible to enhance radiation efficiency of the semiconductor device PK2. Further, a plurality of back terminals BTE are exposed in the outer peripheral regions (outer peripheral portions) of the semiconductor device PK2 shaped in the rectangular form. The back terminals BTE configure parts of the leads LD.

Figure 22:
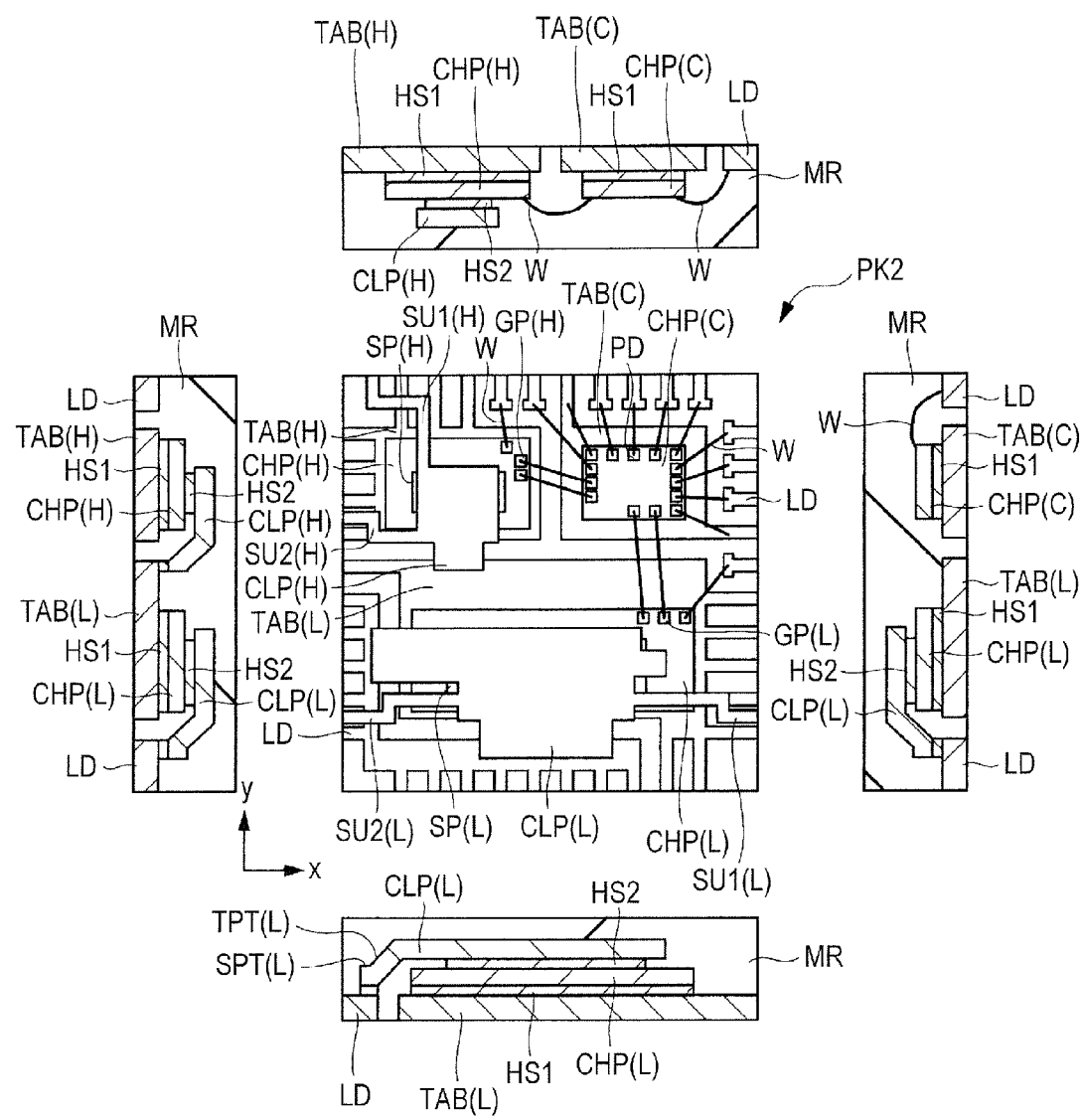
FIG. 22 is a diagram showing an internal configuration of the semiconductor device according to the fourth embodiment.

An internal structure of the semiconductor device PK2 will be described subsequently. FIG. 22 is a view showing the internal configuration of the semiconductor device PK2 according to the fourth embodiment. In FIG. 22, the drawing shown in its center is a plan view of the inside of the semiconductor device PK2 as viewed from the upper surface side seen through the sealing body MR. Cross-sectional views are shown on the four sides respectively.

In the drawing shown in the center of FIG. 22, a low side MOS chip CHP (L) comprised principally of, for example, silicon is mounted over the chip mounting portion TAB (L). Then, a source pad SP (L) and a gate pad GP (L) comprised of, for example, an aluminum film are formed in the surface of the low side MOS chip CHP (L). Incidentally, in order to electrically couple a low side MOS clip CLP (L) to be described later onto the source pad SP (L) through a high-melting point solder HS2, a nickel (Ni)-gold (Au) film is formed over the source pad SP (L) herein.

Leads LD are arranged in part of the outside of the chip mounting portion TAB (L). The leads LD, the low side MOS chip CHP (L) and the source pad SP (L) are electrically coupled to one another by the low side MOS clip CLP (L). That is, a low side MOS clip (L) comprised of, for example, a steel material is mounted over the source pad SP (L) of the low side MOS chip CHP (L). The end of the low side MOS clip CLP (L) is coupled to its corresponding lead LD. Described specifically, as shown in the cross-sectional view located on the lower side of FIG. 22, the low side MOS chip CHP (L) is mounted over the chip mounting portion TAB (L) through a high-melting point solder HS1 interposed therebetween. The low side MOS clip CLP (L) is mounted so as to straddle over the lead LD from above the low side MOS chip CHP (L) through the high-melting point solder HS2 interposed therebetween.

Next, in the drawing shown in the center of FIG. 22, a high side MOS chip CHP (H) comprised principally of, for example, silicon is mounted over the chip mounting portion TAB (H). Then, a source pad SP (H) and a gate pad GP (H) comprised of, for example, an aluminum film are formed in the surface of the high side MOS chip CHP (H). Incidentally, in order to electrically couple a high side MOS clip CLP (H) to be described later onto the source pad SP (H) through a high-melting point solder HS2, a nickel (Ni)-gold (Au) film is formed over the source pad SP (H) herein.

The chip mounting portion TAB (L) is disposed adjacent to the chip mounting portion TAB (H). The chip mounting portion TAB (L) and the source pad SP (H) of the high side MOS chip CHP (H) are electrically coupled to each other by the high side MOS clip CLP (H). That is, the high side MOS clip CLP (H) comprised of, for example, a steel material is mounted over the source pad SP (H) of the high side MOS chip CHP (H). The end of the high side MOS clip CLP (H) is coupled to the chip mounting portion TAB (L). Described specifically, as shown in the cross-sectional view located on the left side of FIG. 22, the high side MOS chip CHP (H) is mounted over the chip mounting portion TAB (H) through a high-melting point solder HS1 interposed therebetween. The high side MOS clip CLP (H) is mounted so as to straddle over the chip mounting portion TAB (L) from above the high side MOS chip CHP (H) through the high-melting point solder HS2 interposed therebetween.

Subsequent to the above, a driver IC chip CHP (C) comprised principally of, for example, silicon is mounted over its corresponding chip mounting portion TAB (C) in the drawing shown in the center of FIG. 22. Described specifically, as shown in the cross-sectional view located on the right or upper side of FIG. 22, the driver IC chip CHP (C) is mounted over the chip mounting portion TAB (C) through a high-melting point solder HS1. The control circuit CC shown in FIG. 19 is formed inside the driver IC chip CHP (C). Then, pads PD each comprised of, for example, an aluminum film are formed in the surface of the driver IC chip CHP (C). Leads LD are arranged in part of the outside of the chip mounting portion TAB (C). The leads LD and the pads PD formed in the surface of the driver IC chip CHP (C) are electrically coupled to one another by metal wires W each comprised of, for example, a gold wire. Further, as shown in FIG. 22, the gate pad GP (L) formed in the low side IC chip CHP (C) and the pad PD formed in the driver IC chip CHP (C) are coupled to each other by a metal wire W. Likewise, the gate pad GP (H) formed in the high side MOS chip CHP (H) and the pad PD formed in the driver IC chip CHP (C) are coupled to each other by a metal wire W.

A description will be made about the case in which the semiconductor device PK2 according to the fourth embodiment configured in this way configures the part of the DC/DC converter. In the drawing shown in the center of FIG. 22, the low side MOS transistor QL (switching field effect transistor) shown in FIG. 19 is formed inside the low side MOS chip CHP (L) mounted over the chip mounting portion TAB (L). Then, the source pad SP (L) is formed in the surface of the low side MOS chip CHP (L), but is electrically coupled to its corresponding source region of the low side MOS transistor QL formed inside the low side MOS chip CHP (L). Besides, the gate pad GP (L) is formed in the surface of the low side MOS chip CHP (L). The gate pad GP (L) is electrically coupled to its corresponding gate electrode of the low side MOS transistor QL formed inside the low side MOS chip CHP (L). Further, the back surface of the low side MOS chip CHP (L) serves as the drain region (drain electrode) of the low side MOS transistor QL.

Likewise, in the drawing shown in the center of FIG. 22, the high side MOS transistor QH (switching field effect transistor) shown in FIG. 19 is formed inside the high side MOS chip CHP (H) mounted over the chip mounting portion TAB (H). Then, the source pad SP (H) is formed in the surface of the high side MOS chip CHP (H), but is electrically coupled to its corresponding source region of the high side MOS transistor QH formed inside the high side MOS chip CHP (H). Besides, the gate pad GP (H) is formed in the surface of the high side MOS chip CHP (H). The gate pad GP (H) is electrically coupled to its corresponding gate electrode of the high side MOS transistor QH formed inside the high side MOS chip CHP (H). Further, the back surface of the high side MOS chip CHP (H) serves as the drain region (drain electrode) of the high side MOS transistor QH.

Here, as shown in FIG. 22, the back surface (drain electrode) of the low side MOS chip CHP (L) is electrically coupled to the chip mounting portion TAB (L). Then, the chip mounting portion TAB (L) and the source pad SP (H) formed in the high side MOS chip CHP (H) are coupled to each other by the high side MOS clip CLP (H). For this reason, it is understood that the drain electrode of the low side MOS chip CHP (L) and the source pad SP (H) of the high side MOS chip CHP (H) are electrically coupled to each other so that the series coupling between the high side MOS transistor QH ands low side MOS transistor QL shown in FIG. 19 is realized.

The source pad SP (L) formed in the surface of the low side MOS chip CHP (L) is electrically coupled to the corresponding lead LD through the low side MOS clip CLP (L). Therefore, the source region of the low side MOS transistor QL shown in FIG. 19 can be coupled to the ground GND by coupling the corresponding lead LD electrically coupled to the low side MOS clip CLP (L) to the ground.

On the other hand, the back surface (drain electrode) of the high side MOS chip CHP (H) is electrically coupled to the chip mounting portion TAB (H) via the high-melting point solder HS1. Thus, the drain region (drain electrode) of the high side MOS transistor QH shown in FIG. 19 can be coupled to the input terminal TE1 by electrically coupling the chip mounting portion TAB (H) to the input terminal TE1. It is understood that the semiconductor device PK2 according to the fourth embodiment shown in FIG. 22 configures part of the DC/DC converter in the above-described manner.

<Features of Fourth Embodiment>

The features of the fourth embodiment will next be described.

In the present embodiment, as shown in FIG. 22, the low side MOS clip CLP (L) has the support portion SU1 (L) and the support portion SU2 (L). Then, the support portion SU1 (L) is provided with the bent portion, and the support portion SU2 (L) is also provided with the bent portion. Therefore, even in the present embodiment, it is possible to increase the distance where the moisture infiltrated from the end of the support portion SU1 (L) or the end of the support portion SU2 (L), which is exposed from the sealing body MR, travels to reach the source pad SP (L) formed in the surface of the low side MOS chip CHP (L). As a result, according to the present embodiment, even if the end of the support portion SU1 (L) or the end of the support portion SU2 (L) is exposed from the side surface of the sealing body MR, the probability of reaching of the moisture to the source pad SP (L) formed in the surface of the low side MOS chip CHP (L) can be reduced by increasing the length of the support portion SU1 (L) or the support portion SU2 (L) based on the bent portion being formed in the support portion SU1 (L) or SU2 (L).

Likewise, the high side MOS clip CLP (H) has the support portion SU1 (H) and the support portion SU2 (H). Then, the support portion SU1 (H) is provided with the bent portion, and the support portion SU2 (H) is also provided with the bent portion. Therefore, even in the present embodiment, it is possible to increase the distance where the moisture infiltrated from the end of the support portion SU1 (H) or the end of the support portion SU2 (H), which is exposed from the sealing body MR, travels to reach the source pad SP (H) formed in the surface of the high side MOS chip CHP (H). As a result, according to the present embodiment, even if the end of the support portion SU1 (H) or the end of the support portion SU2 (H) is exposed from the side surface of the sealing body MR, the probability of reaching of the moisture to the source pad SP (H) formed in the surface of the high side MOS chip CHP (H) can be reduced by increasing the length of the support portion SU1 (H) or the support portion SU2 (H) based on the bent portion being formed in the support portion SU1 (H) or SU2 (H).

Here, the fourth embodiment includes feature points in the arrangement position of each of the support portion SU1 (L) and the support portion SU2 (L) that serve as the components of the low side MOS clip CLP (L) and the arrangement position of each of the support portion SU1 (H) and the support portion SU2 (H) that serve as the components of the high side MOS clip CLP (H). That is, as shown in FIG. 22, since a plurality of semiconductor chips are disposed in one package in the semiconductor device PK2 according to the fourth embodiment, there are restrictions on the layout of their components. As for this, devising has been made to the arrangement positions of the support portions SU1 (L) and SU2 (L) and the arrangement positions of the support portion SU1 (H) and SU2 (H) while considering the restrictions on the layout thereof.

Described specifically, as shown in FIG. 22, the support portions SU1 (L) and SU2 (L) supporting the low side MOS clip CLP (L) are first arranged in such a manner that the ends thereof are exposed from the side surfaces opposing to each other. This intends to consider allowing the low side MOS clip CLP (L) to be supported sufficiently because the size of the low side MOS clip CLP (L) increases corresponding to the size of the low side MOS chip CHP (L). The arrangement of the support portions SU1 (L) and SU2 (L) is first determined in this manner.

Subsequent to the above, it is necessary to determine the arrangement position of each of the support portions SU1 (H) and SU2 (H) that support the high side MOS clip CLP (H). At this time, it is desirable that from the viewpoint of stably supporting the high side MOS clip CLP (H), the support portion SU1 (H) and the support portion SU2 (H) are also arranged in such a manner that the ends thereof are exposed from the side surfaces opposing to each other as with the support portions SU1 (L) and SU2 (L) that support the low side MOS clip CLP (L).

As can be seen from FIG. 22, however, in the region on the right-hand side of the high side MOS clip CLP (H) on the paper, the driver IC chip CHP (C) is disposed and a plurality of metal wires W are disposed. The low side MOS clip CLP (L) is arranged in the region on the side below the high side MOS clip CLP (H) on the paper. Thus, since it is necessary to arrange these components so as not to interfere with each other, it becomes difficult to arrange the support portions SU1 (H) and SU2 (H) supporting the high side MOS clip CLP (H) in such a manner that the ends thereof are exposed from the side surfaces opposing to each other as with the support portions SU1 (L) and SU2 (L) supporting the low side MOS clip CLP (L).

Thus, in the fourth embodiment, as shown in FIG. 22, the support portions SU1 (H) and SU2 (H) supporting the high side MOS clip CLP (H) are arranged in such a manner that the ends thereof are exposed from the side surfaces that cross each other. In this case, the strength for supporting the high side MOS clip CLP (H) is considered to be weak, but the size of the high side MOS clip CLP (H) is smaller than that of the low side MOS clip CLP (L), thus making it possible to sufficiently support them even in such arrangement positions as described above. From the above, in the fourth embodiment, both of the support portions SU1 (L) and SU2 (L) supporting the low side MOS clip CLP (L) and the support portions SU1 (H) and SU2 (H) supporting the high side MOS clip CLP (H) are respectively provided with the bent portions and brought to such layout arrangements as shown in FIG. 22. Thus, according to the semiconductor device PK2 of the fourth embodiment, the supports portions SU1 (L), SU2 (L), SU1 (H) and SU2 (H) can respectively be provided with the bent portions under restrictions in the layout arrangements. Consequently, according to the fourth embodiment, it is possible to improve the reliability of the semiconductor device PK2.

<Method for Manufacturing Semiconductor Device According to Fourth Embodiment>

The semiconductor device PK2 according to the fourth embodiment is configured as described above. A method for manufacturing the same will be described below with reference to the accompanying drawings.

1. A Base Material (Lead Frame and Clip Frame) Providing Step

Figure 23A:
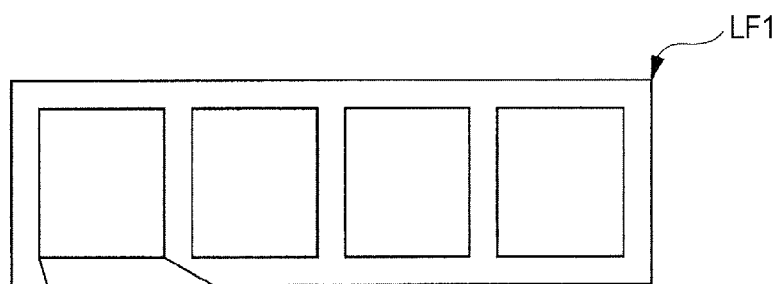
FIG. 23A is a diagram showing a typical whole configuration of a lead frame.
Figure 23B:
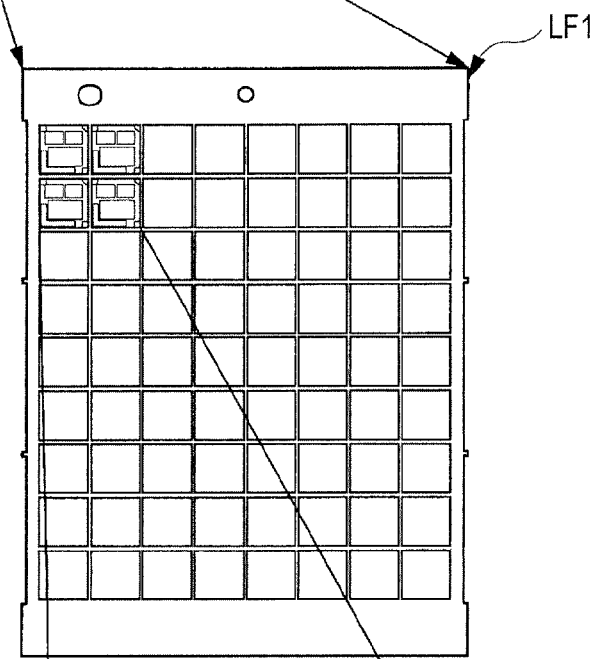
FIG. 23B is a diagram showing in an enlarged form, a part of the lead frame shown in FIG. 23A.
Figure 23C:
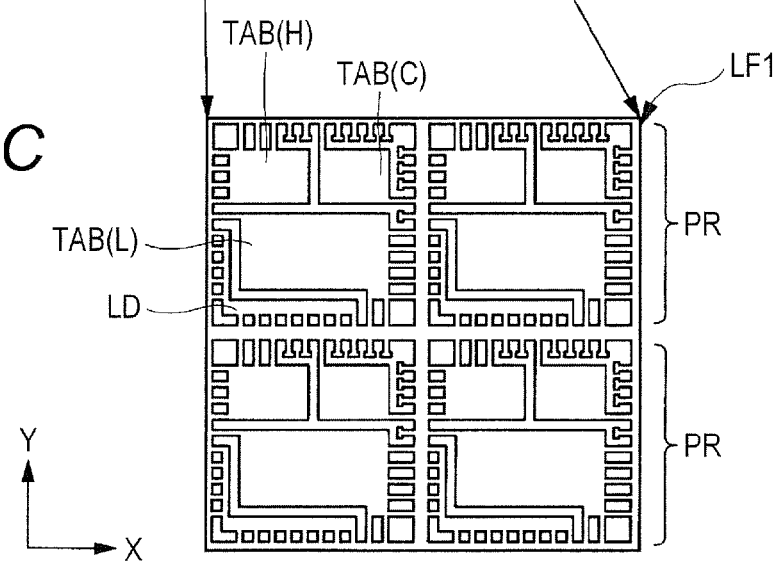
FIG. 23C is a diagram showing in a further enlarged form, the part of the lead frame shown in FIG. 23B.

First, a lead frame LF1 is provided as shown in FIG. 23. A typical whole configuration of the lead frame LF1 is shown FIG. 23A, and a part of the lead frame LF1 shown in FIG. 23A is shown in an enlarged form in FIG. 23B. Further, the part of the lead frame LF1 shown in FIG. 23B is shown in a further enlarged form in FIG. 23C.

It is understood that as shown in FIG. 23C, the lead frame LF1 in the fourth embodiment includes product regions PR each having a chip mounting portion TAB (C), a chip mounting portion TAB (H), a chip mounting portion TAB (L) and leads LD, which are arranged in plural in a matrix form (X and Y directions).

Figure 24A:
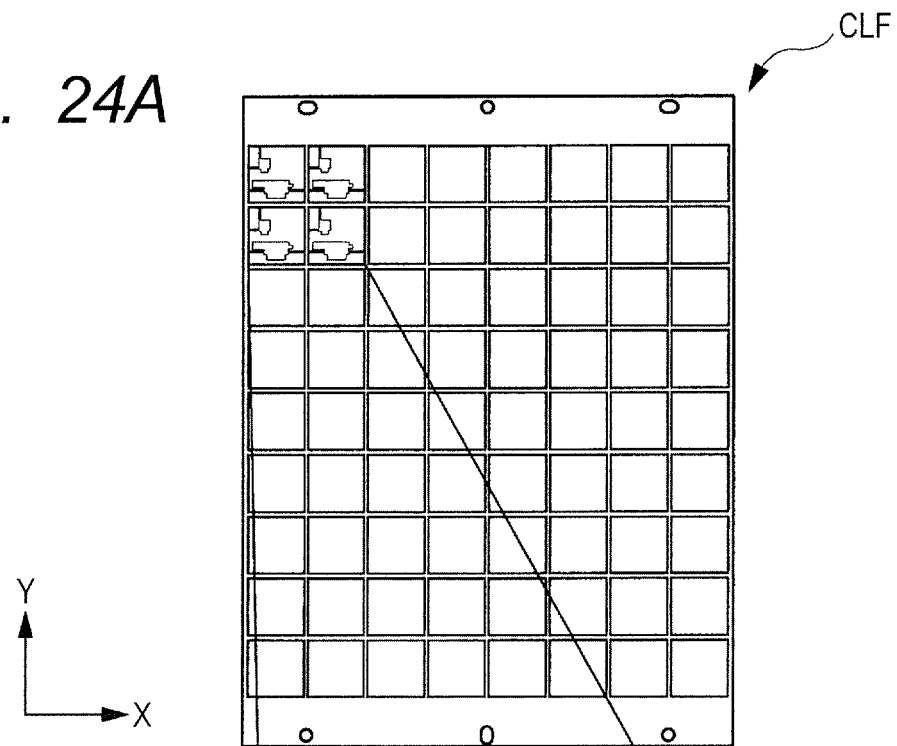
FIG. 24A is a diagram showing a typical whole configuration of a clip frame.
Figure 24B:
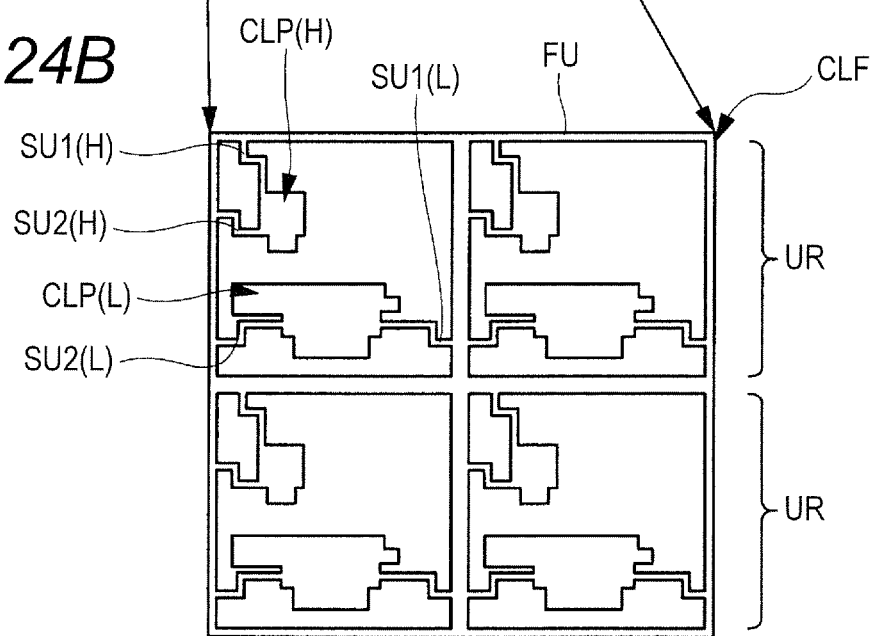
FIG. 24B is a diagram showing in an enlarged form, a part of the clip frame.

Further, in the fourth embodiment, such a clip frame CLF as shown in FIG. 24 is provided. The present embodiment is characterized in that the clip frame CLF is used. A typical whole configuration of the clip frame CLF is shown in FIG. 24A. A part of the clip frame CLF is shown in an enlarged form in FIG. 24B. As shown in FIG. 24B, the clip frame CLF includes a plurality of unit regions UR each provided with a high side MOS clip CLP (H) and a low side MOS clip CLP (L). The unit regions UR are arranged in a matrix form. Incidentally, the high side MOS clip CLP (H) and the low side MOS clip CLP (L) are respectively comprised of, for example, a metal plate with copper as a material component.

A detailed configuration of the clip frame CLF shown in FIGS. 24A and 24B will be described below. As shown in FIG. 24B, for example, the unit regions UR arranged in the matrix form are respectively formed with the high side MOS clips CLP (H) and the low side MOS clips CLP (L). Then, each of the unit regions UR has a frame unit FU, and the high side MOS clip CLP (H) is supported on the frame unit FU by support portions SU1 (H) and SU2 (H) that are suspension leads. Likewise, in each unit region UR, the low side MOS clip CLP (L) is supported on the frame unit FU by support portions SU1 (L) and SU2 (L) that are suspension leads. At this time, the support portions SU1 (H), SU2 (H), SU1 (L) and SU2 (L) are respectively formed with a plurality of bent portions, for example. Parts of the support portions SU1 (H), SU2 (H), SU1 (L) and SU2 (L) may be configured to be thinner in thickness than other portions by being given half etching in advance. Here, for example, the surface side of the above-described parts may be given half etching, or the back surface side thereof may be given half etching. Further, for example, the above-described parts may be configured as parts closer to the side coupling to the frame unit FU than other portions of the support portions SU1 (H), SU2 (H), SU1 (L) and SU2 (L).

In the clip frame CLF in the fourth embodiment, the unit regions UR are disposed so as to be arranged in X and Y directions as shown in FIGS. 24A and 24B. That is, the clip frame CLF in the present embodiment is formed with the unit regions UR in matrix along the X and Y directions. For example, in the clip frame CLF in the present embodiment, the unit regions UR are arranged at a first prescribed interval (first pitch) in the X direction and arranged at a second prescribed interval (second pitch) in the Y direction.

Now when focusing on the lead frame LF1 shown in FIGS. 23A through 23C, as shown in FIG. 23C, for example, the product regions PR formed in the lead frame LF1 are disposed so as to be arranged in the X and Y directions. That is, the lead frame LF1 shown in FIGS. 23A through 23C are formed with the produce regions PR in matrix along the X and Y directions. In the lead frame LF1, for example, the product regions PR are arranged at a first prescribed interval (first pitch) in the X direction and arranged at a second prescribed interval (second pitch) in the Y direction.

That is, in the fourth embodiment, the arrangement pitch of the produce regions PR in the X direction, which are formed in the lead frame LF1, and the arrangement pitch of the unit regions UR in the X direction, which are formed in the clip frame CLF, become identical to each other. Further, the arrangement pitch of the product regions PR in the Y direction, which are formed in the lead frame LF1, and the arrangement pitch of the unit regions UR in the Y direction, which are formed in the clip frame CLF, become identical to each other.

Here, the arrangement pitches in the X direction (first direction) and Y direction (second direction) perpendicular to the X direction, of the high side MOS clips CLP (H) and low side MOS clips CLP (L) formed in the clip frame CLF are taken to be first and second pitches.

In this case, the arrangement pitches in the X and Y directions, of the chip mounting portions (chip mounting portion TAB (C), chip mounting portion TAB (H) and chip mounting portion TAB (L)) formed in the lead frame LF1 also become the first and second pitches.

As a result, in the fourth embodiment, the product regions PR formed in the lead frame LF1 and the unit regions UR formed in the clip frame CLF can respectively be arranged so as to overlap each other as seen in a planar view. Described more specifically, for example, the chip mounting portion TAB (H) shown in FIG. 23C and the high side MOS clip CLP (H) shown in FIG. 24B can be arranged so as to overlap each other planarly. Further, the chip mounting portion TAB (L) shown in FIG. 23C and the low side MOS clip CLP (L) shown in FIG. 24B can be arranged so as to overlap each other planarly.

2. Chip Mounting Step

Figure 25:
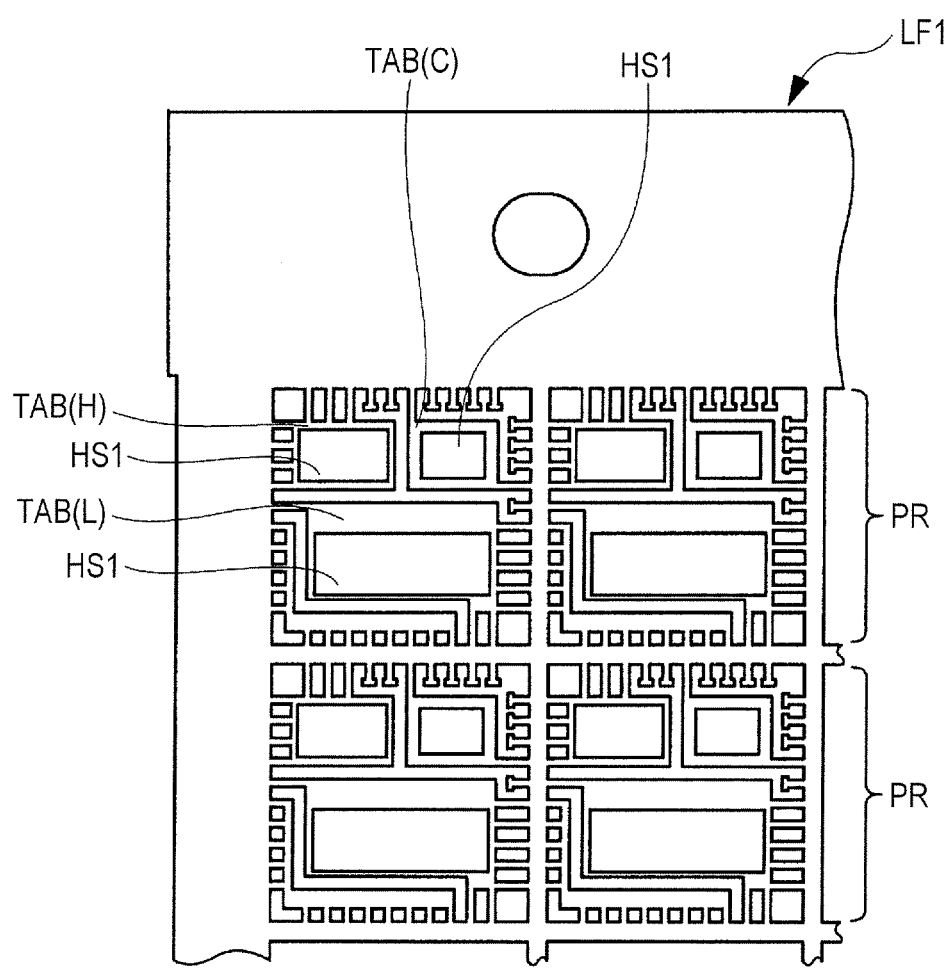
FIG. 25 is a plan view illustrating a manufacturing step of the semiconductor device according to the fourth embodiment.

Next, as shown in FIG. 25, a high-melting point (high-melting point solder paste) HS1 is supplied onto the chip mounting portion TAB (C), the chip mounting portion TAB (H) and the chip mounting portion TAB (L) in the respective product regions PR formed in the lead frame LF1. Specifically, for example, the high-melting point solder HS1 is printed onto the chip mounting portion TAB (C), the chip mounting portion TAB (H) and the chip mounting portion TAB (L) by using a solder printing method.

The high-melting point solder HS1 referred to here is intended for solder not melting even if it is heated to about 260° C. There can be mentioned, for example, solder which is about 300° C. in melting point and about 350° C. in reflow temperature and which contains Pb (lead) of 90 wt % or more.

Incidentally, the method of supplying the high-melting point solder HS1 onto the chip mounting portion TAB (C), the chip mounting portion TAB (H) and the chip mounting portion TAB (L) by the solder printing method has been explained here, but is not limited thereto. For example, a high-melting point solder HS1 contained in a syringe may be provided, and the high-melting point solder HS1 is applied and supplied onto the chip mounting portion TAB (C), the chip mounting portion TAB (H) and the chip mounting portion TAB (L) from a coating nozzle attached to the tip of the syringe. It is however had better to use the solder printing method because the high-melting point solder HS1 can be supplied to plural points at a time using a solder mask, thus making it possible to shorten the working hours of the present step.

Figure 26:
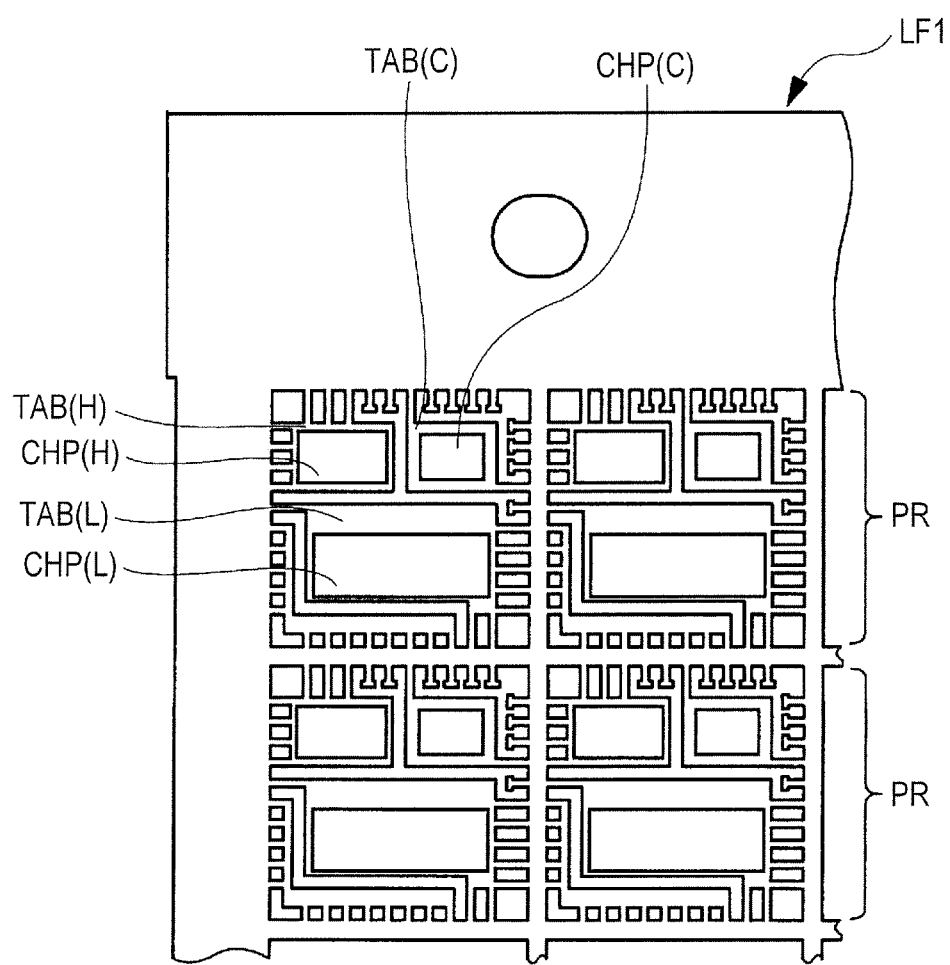
FIG. 26 is a plan view showing a manufacturing step of the semiconductor device, following FIG. 25.

Following to the above, as shown in FIG. 26, a driver IC chip CHP (C) is mounted (arranged) over its corresponding chip mounting portion TAB (C) in each of the produce regions PR formed in the lead frame LF1. Then, a high side MOS chip CHP (H) is mounted over its corresponding chip mounting portion TAB (H) and thereafter a low side MOS chip CHP (L) is mounted over its corresponding chip mounting portion TAB (L). Incidentally, the order of mounting of the driver IC chip CHP (C), the high side MOS chip CHP (H) and the low side MOS chip CHP (L) is not limited to this, but can also be changed suitably.

3. Electrical Coupling Step

Figure 27:
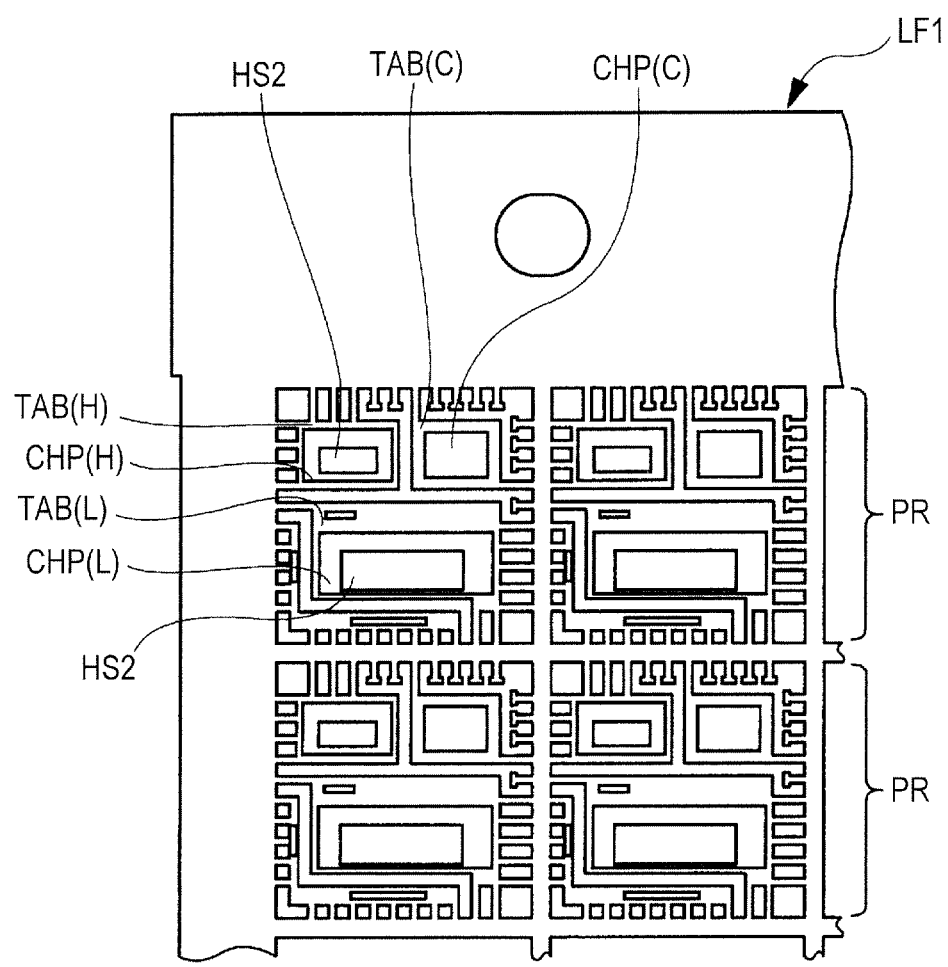
FIG. 27 is a plan view showing a manufacturing step of the semiconductor device, following FIG. 26.

Subsequently, as shown in FIG. 27, a high-melting point solder (high-melting point solder paste) HS2 is supplied onto the high side MOS chip CHP (H) in each of the product regions PR formed in the lead frame LF1. Thereafter, the high-melting point solder HS2 is supplied onto the low side MOS chip CHP (L). Described in detail, the high-melting point solder HS2 is supplied onto a source pad (not shown) formed in the high side MOS chip CHP (H), and the high-melting point solder HS2 is supplied onto a source pad (not shown) formed in the low side MOS chip CHP (L). Further, as shown in FIG. 27, the high-melting point solder HS2 is supplied even onto a partial region of the chip mounting portion TAB (L) and a partial region of each lead.

Specifically, the high-melting point solder HS2 is applied onto the high side MOS chip CHP (H), the low side MOS chip CHP (L), the partial region of the chip mounting portion TAB (L) and the partial region of the lead by using a coating method, for example. The high-melting point solder HS2 formed at this time may be the same material component as the high-melting point solder HS1 mentioned above or may be a different material component.

Thereafter, as shown in FIG. 28, the clip frame CLF is set to a position-fixing exclusive jig. Specifically, as shown in FIG. 28, an opening OP2 formed in the clip frame CLF is further inserted into a positioning pin in which an opening OP1 defined in the lead frame LF1 is inserted. Thus, according to the fourth embodiment, the clip frame CLF can be arranged so as to be superimposed over the lead frame LF1. That is, each of the product regions PR formed in the lead frame LF1 and each of the unit regions UR formed in the clip frame CLF can be superimposed planarly by inserting the opening OP1 formed in the lead frame LF1 and the opening OP2 formed in the clip frame CLF into the positioning pin provided in the exclusive jig as described above. When superimposing the clip frame CLF over the lead frame LF1 at this time, the bent portions formed in the support portions SU1 (H), SU2 (H), SU1 (L) and SU2 (L) are formed so as not to overlap with the high side MOS chip CHP (H) and the low side MOS chip CHP (L), for example, as seen in a planar view.

According to the fourth embodiment, each of the product regions PR and each of the unit regions UR can be superimposed planarly by simply superimposing the clip frame CLF over the lead frame LF1. This means that the high side MOS clips CHP (H) respectively formed in the unit regions UR can be mounted over the high side MOS chips CHP (H) respectively formed in the product regions PR at a time. Likewise, this means that the low side MOS clips CLP (L) respectively formed in the unit regions UR can be mounted over the low side MOS chips CHP (L) respectively formed in the product regions PR at a time. As a result, according to the fourth embodiment, it is possible to simplify a manufacturing step as compared with the case where the high side MOS clips CLP (H) and the low side MOS clips CLP (L) are respectively individually mounted over the high side MOS chips CHP (H) and the low side MOS chips CHP (L). Thus, according to the fourth embodiment, it is possible to reduce the manufacturing cost of the semiconductor device PK.

Subsequently, reflow is performed on the high-melting solder (high-melting point solder HS1, high-melting point solder HS2). Specifically, the lead frame LF1 including the high-melting point solder is heated at a temperature (first temperature) of about 350° C., for example. Thus, the high-melting point solder is melted so that the back surface (drain electrode) of each high side MOS chip CHP (H) and the chip mounting portion TAB (H), and the back surface (drain electrode) of each low side MOS chip CHP (L) and the chip mounting portion TAB (L) are respectively electrically coupled to one another. Further, the high side MOS clip CLP (H), the source pad of the surface of the high side MOS chip CHP (H) and the chip mounting portion TAB (L), and the low side MOS clip CLP (L), the source pad of the surface of the low side MOS chip CHP (L) and the lead supplied with a reference potential are electrically coupled to one another.

Incidentally, in the present embodiment, for example, the coupling between each chip and each clip is performed at a time by one time reflow, but the reflow may be divided into plural times. That is, after the mounting of each chip, a first reflow is performed, and after the mounting of each clip, a second reflow may be performed. However, after even the mounting of each clip is performed consecutively after the mounting of each chip as described above, the reflow may be performed because the number of times of reflow may result in once. It is therefore possible to shorten the steps.

Thereafter, flux cleaning is carried out to remove flux contained in the high-melting point solder. Then, in terms of improving the bonding characteristic of each wire in a wire bonding step performed in a subsequent step, the surface of the lead frame LF1 is given plasma processing to thereby clean the surface of the lead frame LF1.

Incidentally, the plasma processing may not be carried out. That is, in the flux cleaning step, when the cleaning of the surface of the lead frame LF1 is maintained to such an extent that no hindrance provides to its subsequent wire bonding, the plasma processing step can be omitted.

Figure 29A:
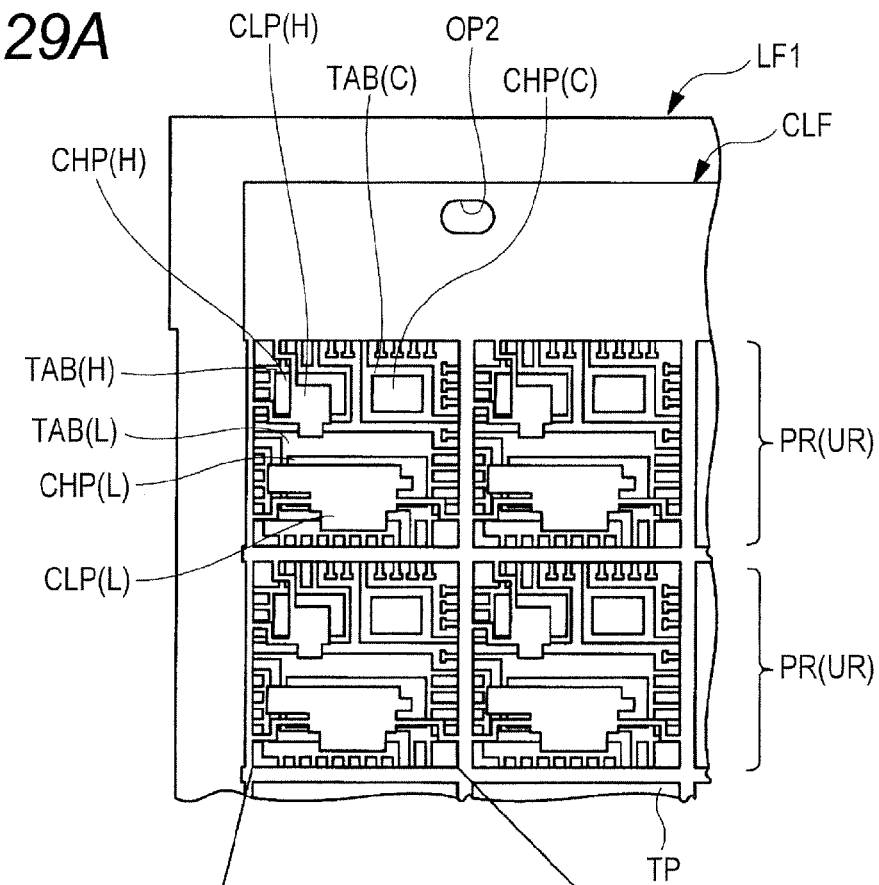
Figure 29B:
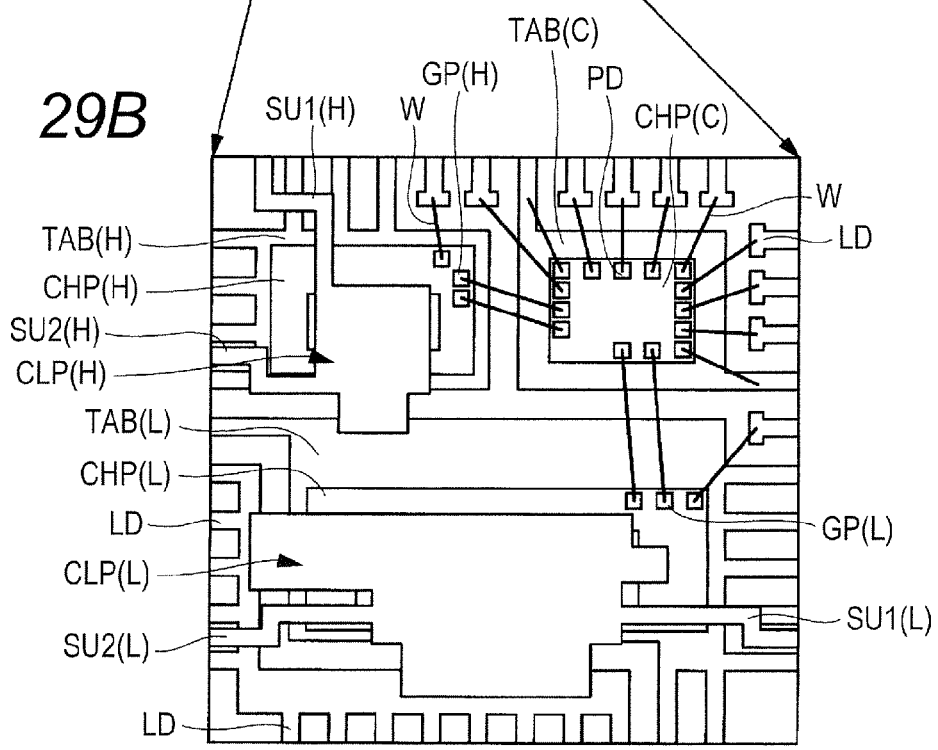

Subsequently, the wire bonding step is performed as shown in FIGS. 29A and 29B. FIG. 29A is a view showing the lead frame LF1 when the wire bonding step is carried out. In FIG. 29A, however, components (wires) at the time that an actual wire bonding step is performed are omitted. The components (wires) are shown in FIG. 29B that is an enlarged view of one product region PR shown in FIG. 29A.

It is understood in FIG. 29B that a plurality of pads PD formed in a driver IC chip CHP (C) and a plurality of leads LD are coupled by a plurality of metal wires W. Further, as shown in FIG. 29B, a gate pad GP (H) formed in a high side IC chip CHP (C), and a pad PD formed in the driver IC chip CHP (C) are coupled to each other by a metal wire W. Likewise, a gate pad GP (L) formed in a low side MOS chip CHP (L), and a pad PD formed in the driver IC chip CHP (C) are coupled to each other by a metal wire W. Thus, according to the fourth embodiment, it is understood that the high side MOS transistor QH (refer to FIG. 19) formed in the high side MOS chip CHP (H) and the low side MOS transistor QL (refer to FIG. 19) formed in the low side MOS chip CHP (L) are electrically controlled by the control circuit CC (refer to FIG. 19) formed in the driver IC chip CHP (C).

4. Sealing (Mold) Step

Next, as shown in FIG. 30, the product regions formed in the lead frame LF1 are collectively molded with a resin to thereby form a sealing body MR. In other words, the product regions PR in the lead frame LF1 are collectively sealed with a resin so as to cover the driver IC chip CHP (C), the high side MOS chip CHP (H) and the low side MOS chip CHP (L) shown in FIG. 29B to thereby form the sealing body MR.

At this time, the sealing body MR is formed to have, for example, an upper surface, a lower surface on the side opposite to the upper surface, a first side surface located between the upper and lower surfaces as viewed in the thickness direction thereof, a second side surface opposite to the first side surface, a third side surface that intersects with the first and second side surfaces, and a fourth side surface that crosses the first and second side surfaces and is opposite to the third side surface.

In the fourth embodiment, as a technology for sealing the semiconductor chip with a resin, there has been adopted a technology called a "so-called MAP mold technology (MAP: Matrix Array Package: batch mold technology) for containing a plurality of product regions PR in a cavity and collectively sealing them with a resin. According to the MAP mold technology, since it is not necessary to provide a resin injecting path every product region PR, the produce regions PR can be arranged densely. Thus, according to the MAP mold technology, it is possible to improve the acquired number of products. Consequently, it is possible to achieve a reduction in the product cost.

5. Exterior Plating Step

Thereafter, a plating film (solder film) that is a conductor film is formed in the surfaces of the parts of the chip mounting portion TAB (C), the chip mounting portion TAB (H), the chip mounting portion TAB (L) and the leads LD exposed from the back surface of the sealing body MR. Incidentally, the plating film formed in this step is comprised of so-called lead-free solder (solder material) that substantially dose not contain lead (Pb), and is, for example, only tin (Sn) or tin-bismuth (Sn—Bi) or the like. Here, the lead-free solder means solder containing a lead content of 0.1 wt % or less. This lead content is defined on the basis of the RoHS (Restriction of Hazardous Substances) directive.

6. Marking Step

Following to the above, information (mark) such as a product name, a model number or the like is formed in the surface of the sealing body MR. Incidentally, as a method for forming the mark, there can be used a method for printing according to a printing system or a method for engraving by irradiating the surface of the sealing body with laser.

7. Individualizing Step

Figure 31A:
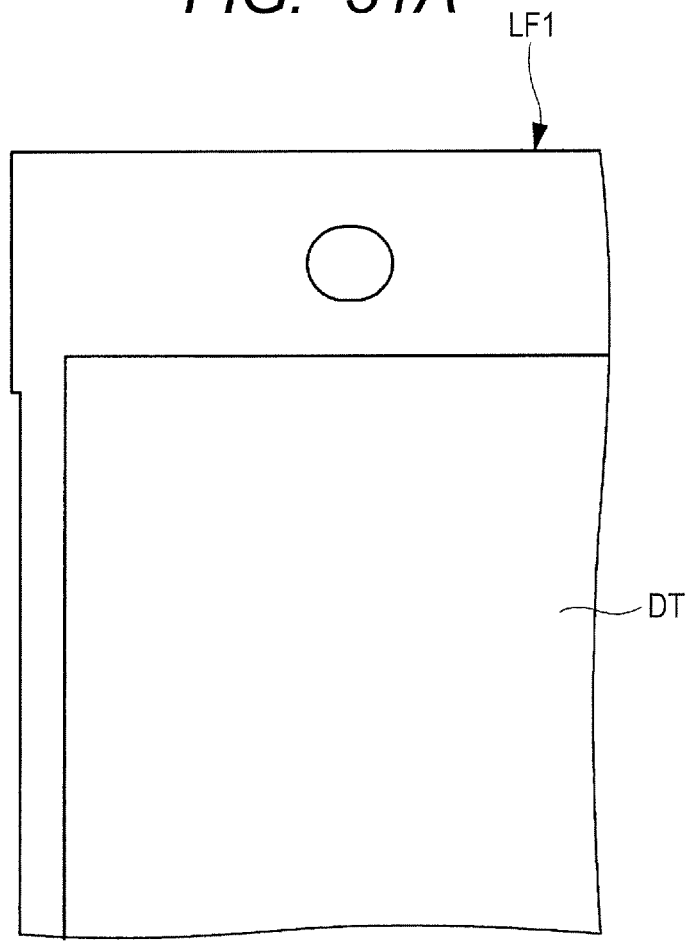
Figure 31B:
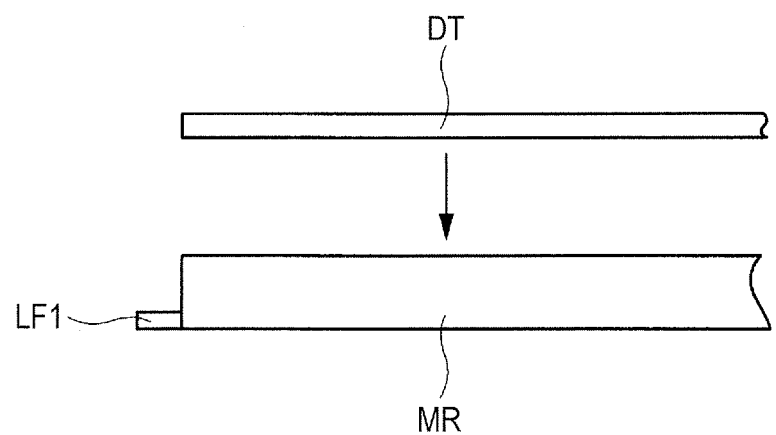
Figure 32A:
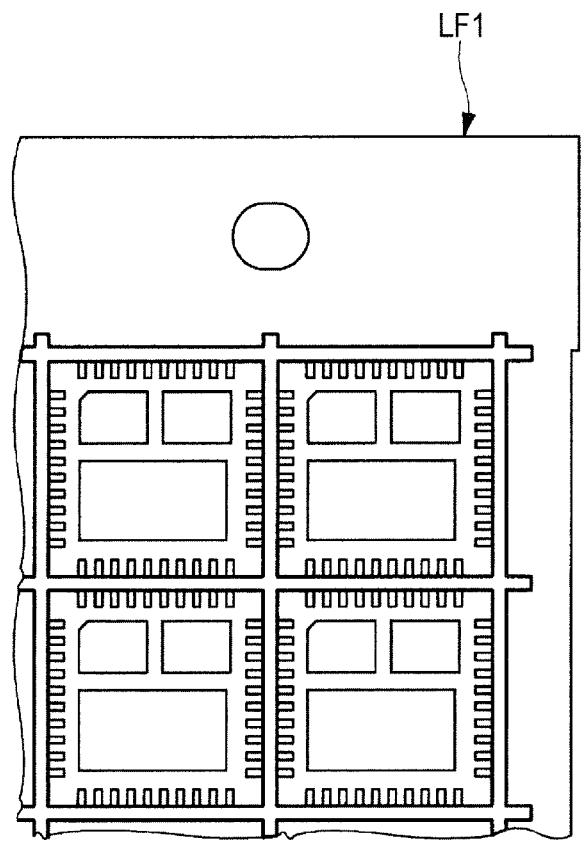
Figure 32B:
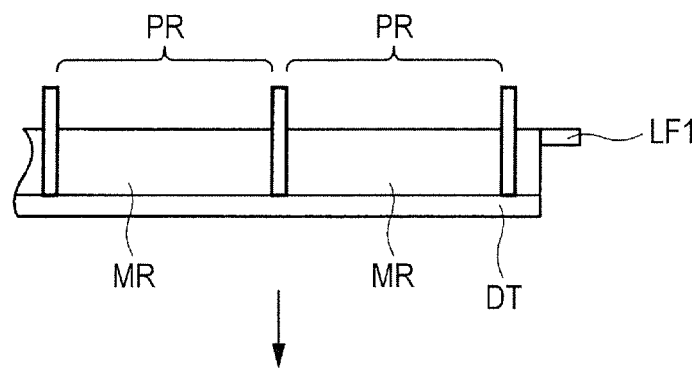
Figure 32C:
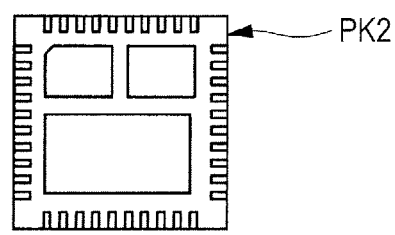

Next, as shown in FIGS. 31A and 31B, a dicing tape DT is stuck to the surface of the sealing body MR. Then, as shown in FIGS. 32A and 32B, the sealing body MR is cut every product region PR (package dicing). Specifically, partition regions (boundary regions) for partitioning the product regions PR formed in the lead frame LF1 are cut by a dicing blade that is a rotating disk-like cutting blade to thereby individualize the respective product regions PR. Consequently, the semiconductor device PK2 according to the fourth embodiment such as shown in FIG. 32C, for example, can be obtained. At this time, the support portions SU1 (H), SU2 (H), SU1 (L) and SU2 (L) formed in the clip frame CLF are cut. As a result, as shown in FIG. 20, for example, the ends of the support portions SU1 (H), SU2 (H), SU1 (L) and SU2 (L) are exposed from the side surface of the semiconductor device PK2.

Thereafter, the individual semiconductor devices PK2 brought into the individual pieces are selected by a characteristic inspection so that each semiconductor device PK2 judged as non-defective is packaged and shipped. It is possible to manufacture the semiconductor device PK2 according to the fourth embodiment in the above-described manner.

<Utility in Dicing Step>

In the fourth embodiment, the support portions SU1 (H), SU2 (H), SU1 (L) and SU2 (L) have been formed with the bent portions respectively. As a result, it has utility in the dicing step in terms of improving the reliability of the semiconductor device.

This will be described below while making a comparison with a related art technology in which no bent portions are formed in their corresponding support portions SU1 (H), SU2 (H), SU1 (L) and SU2 (L).

Figure 33:
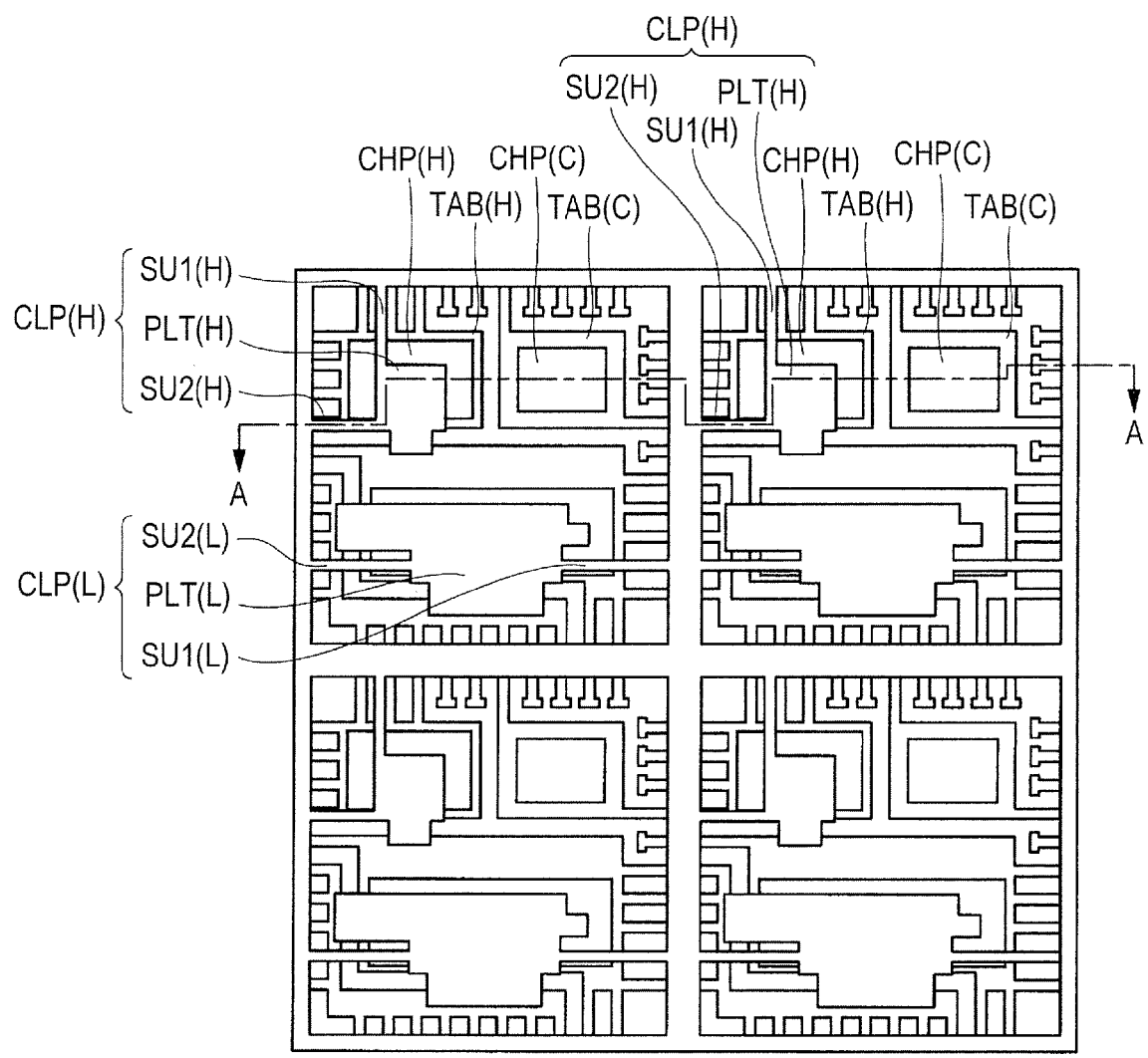
FIG. 33 is a diagram showing a configuration of a related art technology immediately before execution of a dicing step.
Figure 34:
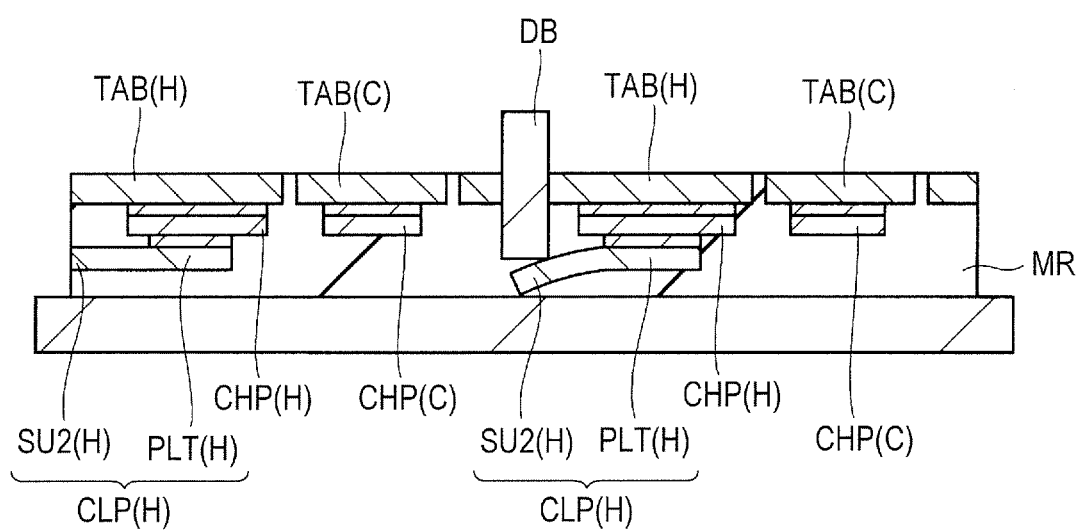
FIG. 34 is a cross-sectional view cut along line A-A of FIG. 33.

FIG. 33 is a view showing a related art technology immediately before execution of a dicing step. It is understood that in the related art technology as shown in FIG. 33 in particular, a plate-like portion PLT (H) of a high side MOS clip CLP (H) is supported by the support portions SU1 (H) and SU2 (H) with no bent portions formed therein, and a plate-like portion PLT (L) of a low side MOS clip CLP (L) is supported by the support portions SU1 (L) and SU2 (L) with no bent portions formed therein. FIG. 34 is a cross-sectional view cut along line A-A of FIG. 33 and shows a state in which the dicing step is being performed.

In the related art technology in FIG. 34, for example, a dicing blade DB is pressed against the support portion SU2 (H) that supports the high sided MOS clip CLP (H) to thereby cut the support portion SU2 (H). At this time, the support portion SU2 (H) is flexed by pressing the dicing blade DB against the support portion SU2 (H). Here, in the related art technology, the force caused by pressing the dicing blade DB against the support portion SU2 (H) is directly applied to the plate-like portion PLT (H) as a result of the fact that the bent portion is not provided at the support portion SU2 (H). Therefore, in the related art technology, the plate-like portion PLT (H) becomes easy to peel off from the high side MOS chip CHP (H). That is, in the related art technology, damage becomes easy to be applied to the junction between the plate-like portion PLT (H) and the high side MOS chip CHP (H) due to the fact that the bent portion is not provided at the support portion SU2 (H), for example.

Figure 35:
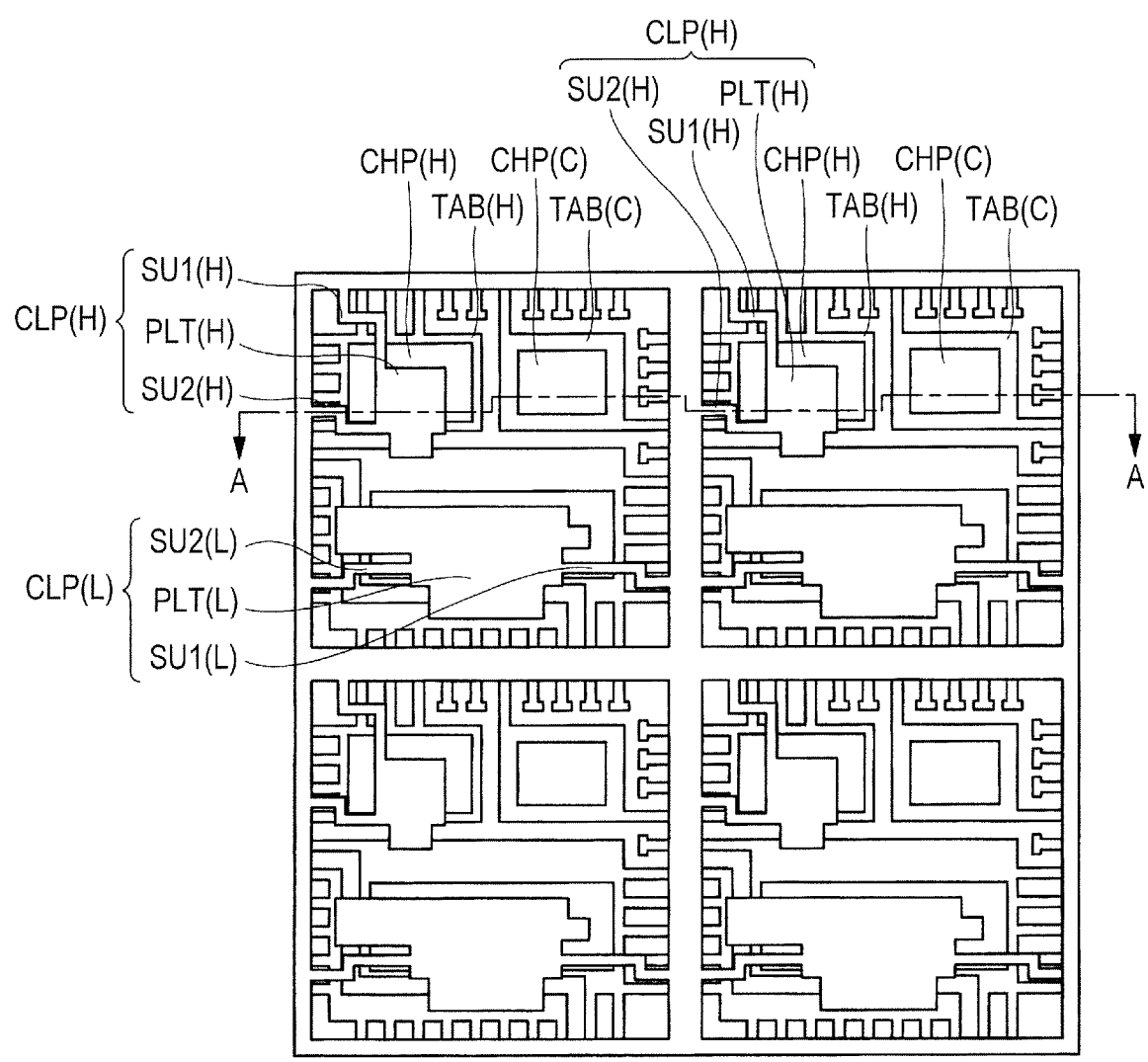
FIG. 35 shows a configuration immediately before execution of a dicing step in the manufacturing process of the semiconductor device according to the fourth embodiment.
Figure 36:
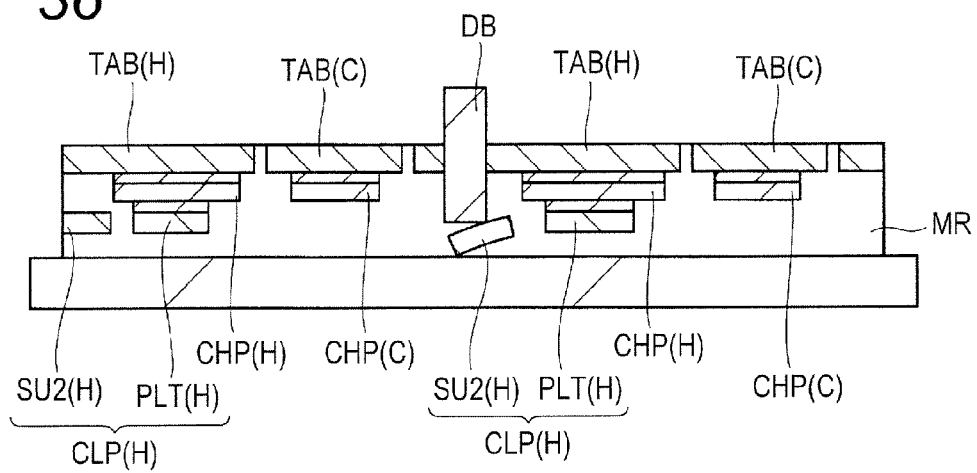
FIG. 36 is a cross-sectional view illustrating a configuration example, which is cut along line A-A of FIG. 35.

On the other hand, according to the fourth embodiment, it has utility shown below. FIG. 35 is a view showing a configuration immediately before execution of the dicing step in the manufacturing process of the semiconductor device according to the fourth embodiment. As shown in FIG. 35 in particular, in the fourth embodiment, it is understood that plate-like portions PLT (H) of high side MOS clips CLP (H) are supported by support portions SU1 (H) and SU2 (H) formed with a plurality of bent portions, and plate-like portions PLT (L) of low side MOS clips CLP (L) are supported by support portions SU1 (L) and SU2 (L) formed with a plurality of bent portions. FIG. 36 is a cross-sectional view cut along line A-A of FIG. 35 and shows a state in which the dicing step is being carried out.

As shown in FIG. 36, in the fourth embodiment, the force caused by pressing the dicing blade DB against the support portion SU2 (H) can be reduced which is applied to the plate-like portion PLT (H) as compared with the above-described related art technology because the bent portion is provided to the support portion SU2 (H) even if the dicing blade DB is pressed against the support portion SU2 (H) supporting the high side MOS clip CLP (H), for example. Therefore, in the dicing step in the fourth embodiment, the plate-like portion PLT (H) becomes hard to peel off from the high side MOS chip CHP (H). That is, in the fourth embodiment, for example, it is possible to reduce damage applied to the junction between the plate-like portion PLT (H) and the high side MOS chip CHP (H) owing to the provision of the bent portion to the support portion SU2 (H). Thus, according to the fourth embodiment, a failure of a semiconductor device used as a product becomes hard to be caused in the dicing step from the result that the bent portions are respectively formed in the support portions SU1 (H), SU2 (H), SU1 (L) and SU2 (L). As a result, according to the method of manufacturing the semiconductor device of the fourth embodiment, an improvement in yield can be achieved.

Figure 37:
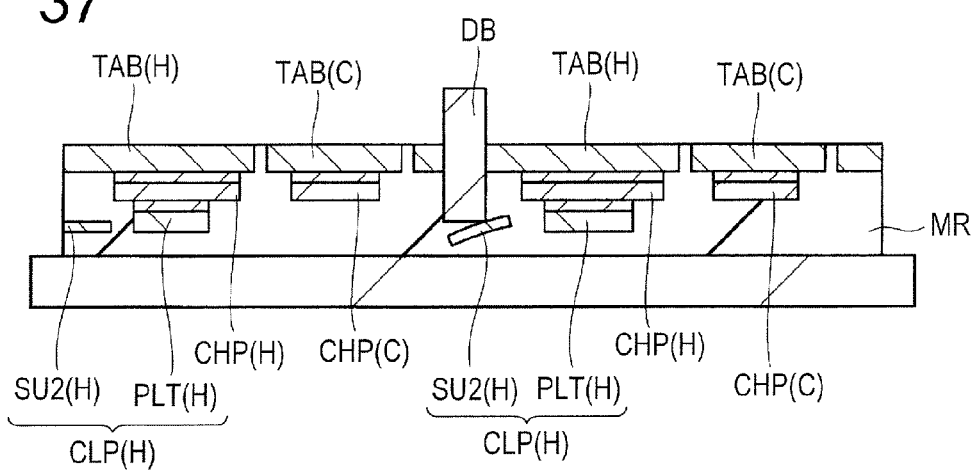
FIG. 37 is a cross-sectional view showing a configuration example, which is cut along line A-A of FIG. 35.

Further, FIG. 37 is a cross-sectional view cut along line A-A of FIG. 35 and a view showing a dicing step where the thickness of the support portion SU2 (H) is made thin. When the support portion SU2 (H) is made thin in thickness as shown in FIG. 37, the support portion SU2 (H) becomes easier to deform and the force caused by pressing the dicing blade BF against the support portion SU2 (H) is absorbed by deformation of the support portion SU2 (H). Therefore, even when the support portion SU2 (H) is configured as shown in FIG. 37, it is possible to reduce damage applied to the junction between the plate-like PLT (H) and the high side MOS chip CHP (H).

Figure 38:
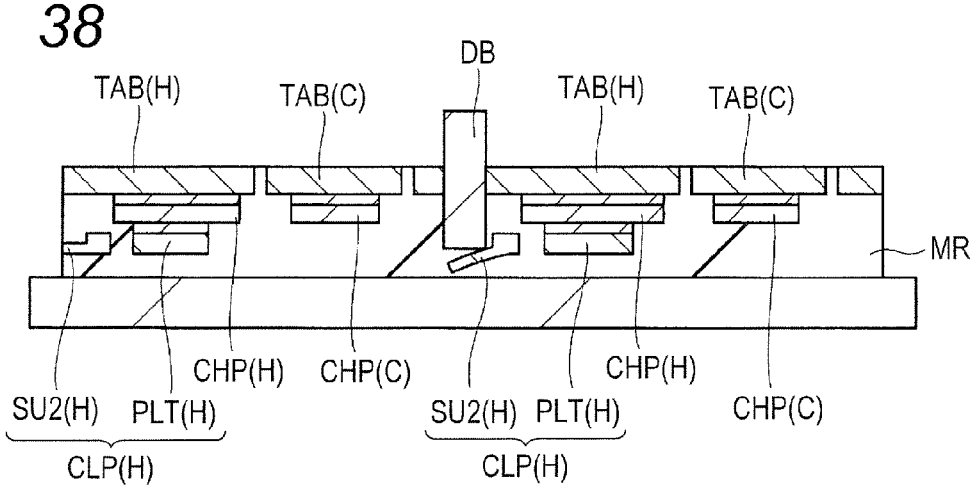
FIG. 38 is a cross-sectional diagram depicting a configuration example, which is cut along line A-A of FIG. 35.

Further, FIG. 38 is a cross-sectional view cut along line A-A of FIG. 35 and a view showing a dicing step where the thickness of a part of the support portion SU2 (H) is made thin. Even in FIG. 38, the support portion SU2 (H) becomes easy to deform by making thinner the thickness of the part of the support portion SU2 (H) which is brought into contact with the dicing blade DB. The force caused by pressing the dicing blade DB against the support portion SU2 (H) is absorbed by the deformation of the support portion SU2 (H). Therefore, even when the support portion SU2 (H) is configured as shown in FIG. 38, it is possible to reduce damage applied to the junction between the plate-like portion PLT (H) and the high side MOS chip CHP (H).

<Arrangement of Support Portions Considering Dicing Step>

Figure 39A:
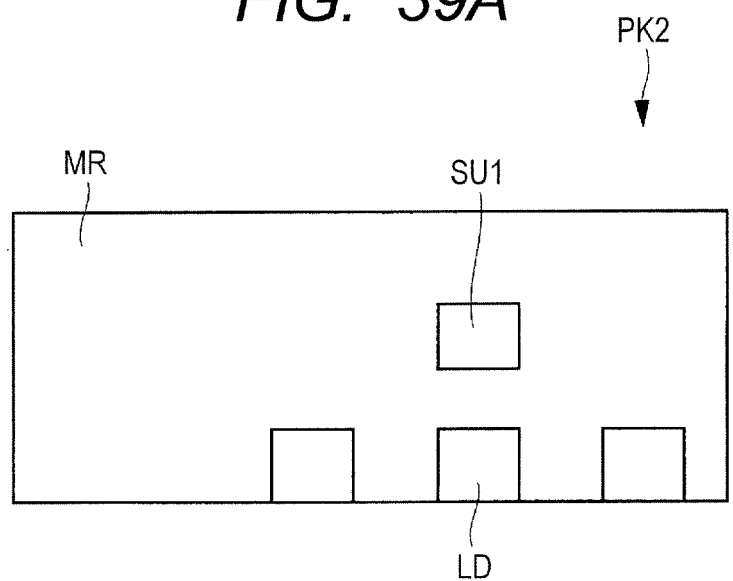
Figure 39B:
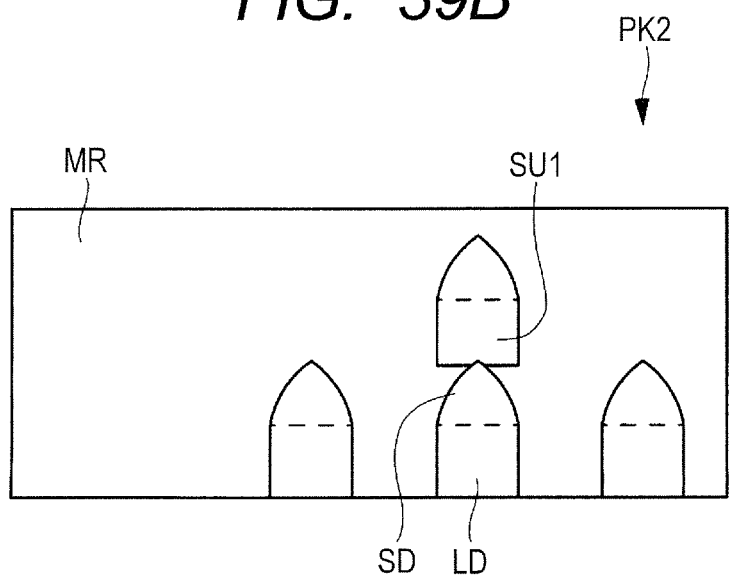

A description will finally be made about examples of arrangement of support portions considering the dicing step. FIGS. 39A and 39B are views showing an example of arrangement of each lead LD and support portion SU1 exposed from the side surface of a sealing body MR in the semiconductor device PK2 according to the fourth embodiment. In particular, FIG. 39A is a view showing side surface shapes of the ideal leads LD and the support portion SU1 where sagging in the dicing step is not generated, and FIG. 39B is a view showing side surface shapes of the actual leads LD and the support portion SU1 where sagging in the dicing step is generated.

First, as shown in FIG. 39A, the end of the lead LD and the end of the support portion SU1 are exposed from the side surface of the sealing body MR. At this time, the lead LD and the support portion SU1 are arranged so as to overlap each other in a planar view as seen from the upper surface side of the sealing body MR. Even such an arrangement is considered to cause no problem where sagging in the dicing step is not generated.

In the dicing step, however, the lead LD and the support portion SU1 are cut by the dicing blade, but sagging may occur in the end of the lead LD and the end of the support portion SU1 due to the rotation of the dicing blade at the cutting thereof. Now, as shown in FIG. 39B, when the lead LD and the support portion SU1 are arranged so as to overlap each other in a planar view as viewed from the upper surface side of the sealing body MR, there is a risk that sagging SD generated in the lead LD will contact the support portion SU1.

Here, as shown in FIG. 39A, even in the arrangement example in which the lead LD and the support portion SU1 are arranged so as to overlap each other in the planar view as seen from the upper surface side of the sealing body MR, a short circuit failure due to the sagging is considered not to be actualized where the vertical distance between the lead LD and the support portion SU1 is large. Thus, in the fourth embodiment, the can be adopted the arrangement example in which the lead LD and the support portion SU1 are arranged so as to overlap each other in the vertical direction in the planar view as seen from the upper surface side of the sealing body MR.

However, considering that there is a possibility that sagging will be generated in the dicing step, there is a possibility that a short circuit failure will be caused between the lead LD and the support portion SU1 where the vertical distance between the lead LD and the support portion SU1 is small. Therefore, particularly when the vertical distance between the lead LD and the support portion SU1 is small in the arrangement example shown in FIG. 39A, there is room for improvement from the viewpoint of improving the reliability of the semiconductor device PK2.

Figure 40A:
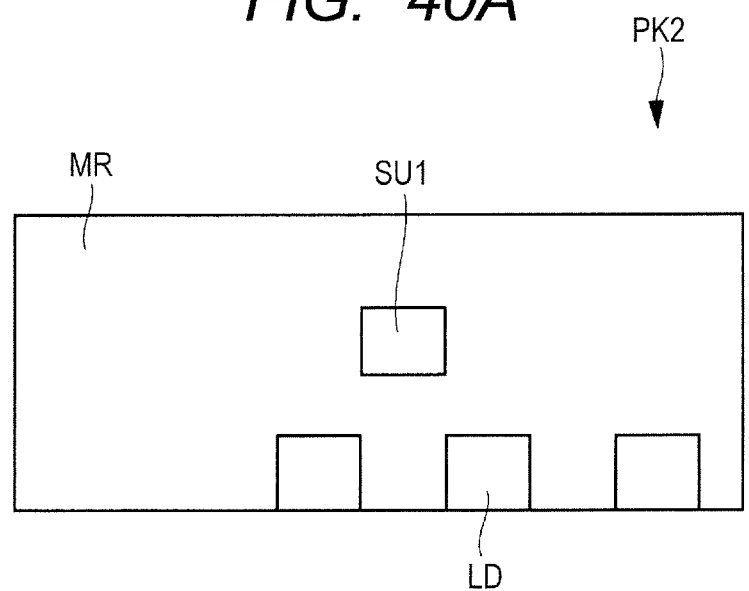
Figure 40B:
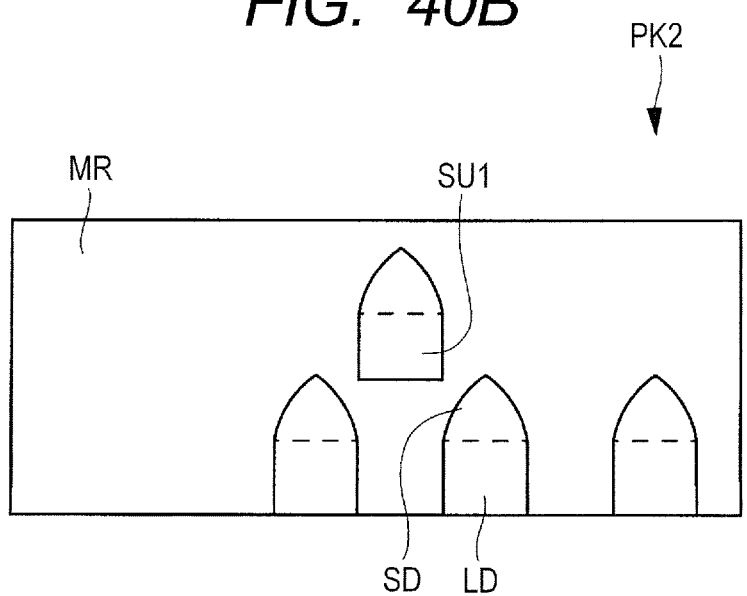

FIGS. 40A and 40B are views showing another arrangement example of each lead LD and support portion SU1 exposed from the side surface of a sealing body MR in the semiconductor device PK2 according to the fourth embodiment. In particular, FIG. 40A is a view showing side surface shapes of the ideal leads LD and the support portion SU1 where sagging in the dicing step is not generated, and FIG. 40B is a view showing side surface shapes of the actual leads LD and the support portion SU1 where sagging in the dicing step is generated.

As shown in FIG. 40A, in the semiconductor device PK2 according to the fourth embodiment, the lead LD and the support portion SU1 can also be arranged so as not to overlap each other in a planar view as seen from the upper surface side of the sealing body MR. In this case, it is possible to avoid contact of sagging SD generated in the lead LD with the support portion SU1 from the result that the lead LD and the support portion SU1 are arranged so as not to overlap each other in a planar view as seen from the upper surface side of the sealing body MR as shown in FIG. 40B. That is, in terms of avoiding a short circuit failure caused by the generation of sagging in the dicing step and enhancing the reliability of the semiconductor device PK2, it can be said that the arrangement example shown in FIGS. 40A and 40B is more desirable than the arrangement example shown in FIGS. 39A and 39B.

Figure 41:
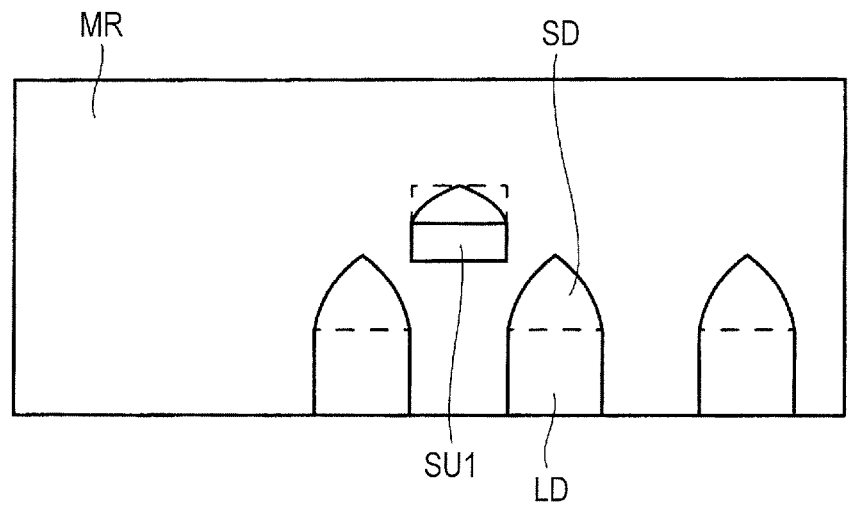
FIG. 41 shows a configuration example in which the thickness of a support portion is made thin.

Incidentally, FIG. 41 is a view illustrating a configuration example in which the thickness of a support portion SU1 is made thin on the premise of the arrangement of FIG. 40 that each lead LD and the support portion SU1 do not overlap each other in a planar view as seen from the upper surface side of a sealing body MR. Since each lead LD and the support portion SU1 are arranged so as not to overlap each other as with the configuration example shown in FIGS. 40A and 40B even in the configuration example shown in FIG. 41, it is possible to avoid a short circuit failure between the lead LD and the support portion SU1 even where the sagging SD in the dicing step occurs.

Since, however, the thickness of the support portion SU1 is made thin by performing half etching from the surface side (upper side) of the support portion SU1 in FIG. 41, there is room for further improvement in terms of lengthening the distance between the sagging SD generated in the lead LD and the support portion SU1 and further reducing a short circuit failure between the lead LD and the support portion SU1 as shown in FIG. 41, but the configuration example shown in FIG. 41 can also be adopted in the fourth embodiment.

Figure 42:
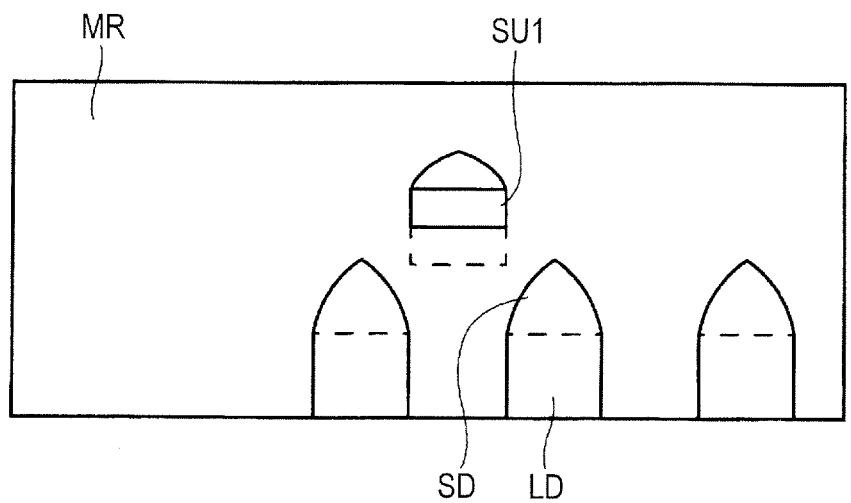
FIG. 42 shows a configuration example in which the thickness of a support portion is made thin.

Next, FIG. 42 is a view showing another configuration example in which the thickness of a support portion SU1 is made thin on the premise of the arrangement of FIG. 40 that the lead LD and the support portion SU1 do not overlap each other in a planar view as seen from the upper surface side of the sealing body MR. Since each lead LD and the support portion SU1 are arranged so as not to overlap each other in the vertical direction of the sealing body MR as with the configuration example shown in FIGS. 40A and 40B even in the configuration example shown in FIG. 42, it is possible to avoid a short circuit failure between the lead LD and the support portion SU1 even where the sagging SD in the dicing step occurs.

Further, since the thickness of the support portion SU1 is made thin by performing half etching from the back surface side (lower side) of the support portion SU1 in FIG. 42, it is possible to lengthen the distance between the sagging SD generated in the lead LD and the support portion SU1 and further reducing a short circuit failure between the lead LD and the support portion SU1.

Incidentally, the configuration examples shown in FIGS. 41 and 42 have described where the thickness of the support portion SU1 is made thin, but further, the width (width in the horizontal direction of paper) of the support portion SU1 can also be set smaller than that of the lead LD. Since it is possible to reduce not only the thickness of the support portion SU1 but also its width in this case, it is possible to further reduce the possibility of a short circuit failure between the lead LD and the support portion SU1 even where the sagging SD in the dicing step is generated.

Although the invention made above by the present inventors has been described specifically on the basis of the preferred embodiments, the present invention is not limited to the embodiments referred to above. It is needless to say that various changes can be made thereto within the scope not departing from the gist thereof.

The above embodiments include the following modes:
(Appendix 1)
A method for manufacturing a semiconductor device, includes the steps of:
(a) providing a lead frame having first regions each having a chip mounting portion and leads, which are arranged in plural in a matrix form,
(b) mounting a semiconductor chip over an upper surface of the chip mounting portion,
(c) providing a clip frame having second regions arranged in plural in a matrix form, each of which has a conductor plate, a frame unit and a first suspension lead and in each of which the conductor plate is supported on the frame unit by the first suspension lead,
(d) superimposing the clip frame over the lead frame so as to place the conductor plate over a first pad of the semiconductor chip to thereby mount the conductor plate over the lead from atop the first pad of the semiconductor chip,
(e) after the step (d), collectively sealing the first regions existing in the lead frame so as to cover the semiconductor chip to thereby form a sealing body, and
(f) after the step (e), cutting boundary regions of the first regions existing in the lead frame and cutting the first suspension leads existing in the clip frame, and
in which each of the first suspension leads is formed with a first bent portion,
(Appendix 2)
In a method for manufacturing a semiconductor device according to the appendix 1, the first bent portion does not overlap with the semiconductor chip in a planar view when the clip frame is superimposed over the lead frame in the step (d),
(Appendix 3)
In a method for manufacturing a semiconductor device according to the appendix 1, the first suspension lead existing in the clip frame provided in the step (c) is formed with a plurality of the first bent portions,
(Appendix 4)
In a method for manufacturing a semiconductor device according to the appendix 1, a part of the first suspension lead existing in the clip frame provided in the step (c) is half-etched,
(Appendix 5)
In a method for manufacturing a semiconductor device according to the appendix 4, the surface side of the part of the first suspension lead is half-etched,
(Appendix 6)
In a method for manufacturing a semiconductor device according to the appendix 4, the back surface side of the part of the first suspension lead is half-etched,
(Appendix 7)
In a method for manufacturing a semiconductor device according to the appendix 4, the part of the first suspension lead is a portion closer to the side coupling to the frame unit than the other part of the first suspension lead,
(Appendix 8)
In a method for manufacturing a semiconductor device according to the appendix 1, the sealing body formed in the step (e) includes:
an upper surface,
a lower surface on the side opposite to the upper surface,
a first side surface located between the upper surface and the lower surface in a thickness direction thereof,
a second side surface opposite to the first side surface,
a third side surface which crosses the first side surface and the second side surface, and
a fourth side surface which crosses the first side surface and the second side surface and is opposite to the third side surface, and
after the step (f), the end of the first suspension lead is exposed from the first side surface of the sealing body,
(Appendix 9)
In a method for manufacturing a semiconductor device according to the appendix 8, a second suspension lead supporting the conductor plate on the frame unit and having a second bent portion is further disposed in each of the second regions of the clip frame provided in the step (c), and
after the step (f), the end of the second suspension lead is exposed from the second side surface of the sealing body, and (Appendix 10)

In a method for manufacturing a semiconductor device, according to the appendix 8, a second suspension lead supporting the conductor plate on the frame unit and having a second bent portion is further disposed in each of the second regions of the clip frame provided in the step (c), and after the step (f), the end of the second suspension lead is exposed from the third side surface of the sealing body.

What is claimed is:

1. A semiconductor device comprising:
   (a) a first chip mounting portion;
   (b) a first semiconductor chip arranged over the first chip mounting portion;
   (c) a first pad formed in a surface of the first semiconductor chip;
   (d) a first lead which serves as an external coupling terminal;
   (e) a first conductive member which electrically couples the first pad and the first lead to each other; and
   (f) a sealing body which seals a part of the first chip mounting portion, the first semiconductor chip, a part of the first lead, and the first conductive member,
   wherein the first conductive member includes:
   (g1) a first plate-shaped portion; and
   (g2) a first support portion formed integrally with the first plate-shaped portion,
   and (g3) a second support portion formed integrally with the first plate-shaped portion, wherein the sealing body seals the first support portion such that only a side surface of an end of the first support portion is exposed from a side surface of the sealing body,
   wherein the sealing body seals the second support portion such that only a side surface of an end of the second support portion is exposed from a side surface of the sealing body,
   wherein the first support portion is formed with a first bent portion, the first bent portion extending, in a plan view, from a side surface of the plate-shaped portion,
   and wherein the second support portion is formed with a second bent portion, the second bent portion extending, in a plan view, from a side surface of the plate-shaped portion.

2. The semiconductor device according to claim 1, wherein the first bent portion is arranged in a position not to overlap with the first semiconductor chip in a plan view.

3. The semiconductor device according to claim 1, wherein the first bent portion is bent in an in-plane direction parallel to the surface of the first semiconductor chip.

4. The semiconductor device according to claim 1, wherein the first bent portion is bent in an out-plane direction which crosses the surface of the first semiconductor chip.

5. The semiconductor device according to claim 4, wherein a first height of the end of the first support portion from the first chip mounting portion is greater than a second height of the first plate-shaped portion from the first chip mounting portion.

6. The semiconductor device according to claim 1, wherein the first support portion is formed with a plurality of first bent portions.

7. The semiconductor device according to claim 1, wherein the thickness of the first support portion is less than the thickness of the first plate-shaped portion.

8. The semiconductor device according to claim 1, wherein the first support portion is formed with:
   (h1) a first portion having a first thickness; and
   (h2) a second portion thicker than the first portion.

9. The semiconductor device according to claim 8, wherein the first portion is formed closer to the end side of the first support portion than the second portion is.

10. The semiconductor device according to claim 1, further including:
    (i) a second pad formed in the surface of the first semiconductor chip;
    (j) a second lead which serves as an external coupling terminal; and
    (k) a metal wire which couples the second pad with the second lead; and
    wherein the metal wire is formed so as not to contact the first support portion.

11. The semiconductor device according to claim 1, wherein the sealing body includes:
    an upper surface;
    a lower surface on the side opposite to the upper surface;
    a first side surface located between the upper surface and the lower surface in a thickness direction thereof;
    a second side surface opposite to the first side surface;
    a third side surface which crosses the first side surface and the second side surface; and
    a fourth side surface which crosses the first side surface and the second side surface and is opposite to the third side surface, and
    wherein the end of the first support portion is exposed from the first side surface of the sealing body.

12. The semiconductor device according to claim 11, wherein the end of the second support portion is exposed from the first side surface of the sealing body.

13. The semiconductor device according to claim 11, wherein the first conductive member further includes a second support portion formed integrally with the first plate-shaped portion,
    end of the second support portion is exposed from the second side surface of the sealing body.

14. The semiconductor device according to claim 13, further including:
    (l) a second chip mounting portion;
    (m) a second semiconductor chip arranged over the second chip mounting portion;
    (n) a third pad formed in a surface of the second semiconductor chip; and
    (o) a second conductive member which electrically couples the third pad and the first chip mounting portion to each other,
    wherein the sealing body further seals a part of the second chip mounting portion, the second semiconductor chip and the second conductive member,
    wherein the second conductive member includes:
    (p1) a second plate-shaped portion;
    (p2) a third support portion formed integrally with the second plate-shaped portion; and
    (p3) a fourth support portion formed integrally with the second plate-shaped portion,
    wherein an end of the third support portion and an end of the fourth support portion are respectively exposed from the side surfaces of the sealing body, which cross each other,
    wherein the third support portion is formed with a third bent portion, and
    wherein the fourth support portion is formed with a fourth bent portion.

15. The semiconductor device according to claim 11, wherein the end of the second support portion is exposed from the third side surface of the sealing body.

16. The semiconductor device according to claim 11, the end of the second support portion is exposed from the fourth side surface of the sealing body.

17. The semiconductor device according to claim 11, further including a third lead which serves as an external coupling terminal,
wherein the third lead is exposed from the first side surface of the sealing body, and
wherein the first support portion overlaps with the third lead as seen in a plan view.

18. The semiconductor device according to claim 11, further including a third lead which serves as an external coupling terminal,
wherein the third lead is exposed from the first side surface of the sealing body, and
wherein the first support portion does not overlap with the third lead as seen in a plan view.

19. The semiconductor device according to claim 18, wherein the thickness of the end of the first support portion, which is exposed from the first side surface of the sealing body is smaller than the thickness of the third lead exposed from the first side surface of the sealing body.

20. The semiconductor device according to claim 18, wherein the width of the end of the first support portion, which is exposed from the first side surface of the sealing body is smaller than the width of the third lead exposed from the first side surface of the sealing body.

* * * * *